United States Patent
Shinotsuka et al.

(10) Patent No.: US 9,508,956 B2
(45) Date of Patent: Nov. 29, 2016

(54) ORGANIC LIGHT EMITTING DIODE, MANUFACTURING METHOD FOR ORGANIC LIGHT EMITTING DIODE, IMAGE DISPLAY DEVICE, AND ILLUMINATION DEVICE

(71) Applicant: OJI HOLDINGS CORPORATION, Tokyo (JP)

(72) Inventors: Kei Shinotsuka, Tokyo (JP); Takayuki Okamoto, Saitama (JP); Etsuko Kawamukai, Tokyo (JP)

(73) Assignee: OJI HOLDINGS CORPORATION, Tokyo (JP)

( * ) Notice: Subject to any disclaimer, the term of this patent is extended or adjusted under 35 U.S.C. 154(b) by 0 days.

(21) Appl. No.: 14/369,953

(22) PCT Filed: Dec. 26, 2012

(86) PCT No.: PCT/JP2012/083589
§ 371 (c)(1),
(2) Date: Oct. 21, 2014

(87) PCT Pub. No.: WO2013/099915
PCT Pub. Date: Jul. 4, 2013

(65) Prior Publication Data
US 2015/0034925 A1 Feb. 5, 2015

(30) Foreign Application Priority Data

Dec. 28, 2011 (JP) ................................. 2011-289842
Sep. 6, 2012 (JP) ................................. 2012-195962

(51) Int. Cl.
*H01L 51/56* (2006.01)
*H01L 51/52* (2006.01)
*H01L 51/50* (2006.01)

(52) U.S. Cl.
CPC ....... *H01L 51/5271* (2013.01); *H01L 51/5012* (2013.01); *H01L 51/5218* (2013.01);
(Continued)

(58) Field of Classification Search
CPC ........ H01L 51/52; H01L 51/56; H01L 51/50

USPC ................................. 257/40, 59, 72, 98, 99
See application file for complete search history.

(56) References Cited

U.S. PATENT DOCUMENTS 6,661,034 B2 * 12/2003 Kawase .............. H01L 51/0014
257/103
7,267,891 B2  9/2007 Saito

FOREIGN PATENT DOCUMENTS

| CN | 1685772 | 10/2005 |
| CN | 101540373 | 9/2009 |
| EP | 1122800 A2 | 8/2001 |
| EP | 1191823 (A1) | 3/2002 |

(Continued)

OTHER PUBLICATIONS

Jing Feng et al, "Enhancement of electroluminescence through a two-dimensional corrugated metal film by grating-induced surface-plasmon cross coupling", Optics Letters, vol. 30, No. 17, Sep. 1, 2005, pp. 2302-2304.

(Continued)

*Primary Examiner* — Julio J Maldonado
*Assistant Examiner* — Rodolfo D Fortich
(74) *Attorney, Agent, or Firm* — Muncy, Geissler, Olds & Lowe, P.C.

(57) ABSTRACT

An organic light emitting diode, which is a top emission-type, is configured so that at least the following are laminated on the substrate: a reflective layer including a metal material; an anode conductive layer including a transparent conductive material; an organic EL layer having a light emitting layer which contains an organic light emitting material; and a cathode conductive layer in which a semi-transmissive metal layer and a transparent conductive layer including a transparent conductive material are laminated. On the surface of the semi-transmissive metal layer that is in contact with the transparent conducive layer side, a two-dimensional lattice structure is formed in which a plurality of protrusions are arranged periodically and two-dimensionally.

14 Claims, 18 Drawing Sheets

(52) U.S. Cl.
CPC ....... *H01L51/5234* (2013.01); *H01L 51/5275* (2013.01); *H01L 51/56* (2013.01); *H01L 2251/5315* (2013.01); *H01L 2251/5369* (2013.01)

(56) References Cited

FOREIGN PATENT DOCUMENTS

| | | |
|---|---|---|
| EP | 2728967 (A1) | 5/2014 |
| JP | 2006269163 (A) | 10/2006 |
| JP | 2006-313667 A | 11/2006 |
| JP | 2009-158478 A | 7/2009 |
| JP | 2012-280607 A | 2/2012 |
| WO | WO 2004/013921 A2 | 2/2004 |
| WO | WO2011007878 (A1) | 1/2011 |
| WO | WO 2012/060404 A1 | 5/2012 |
| WO | WO 2013/005638 A1 | 1/2013 |

OTHER PUBLICATIONS

Feng Jing et al, "Highly directional emission via coupled surface-plasmon tunneling from electroluminescence in organic light-emitting devices", Applied Physics Letters, vol. 87, No. 24, Dec. 6, 2005, pp. 241109-1 to 241109-3.

Joseph F. Revelli et al, "Waveguide analysis of organic light-emitting diodes fabricated on surfaces with wavelength-scale periodic gratings", Applied Optics, vol. 44, No. 16, Jun. 1, 2005, pp. 3224-3237.

Wang B. et al, "Formation of nanoimprinting mould through use of nanosphere lithography", Journal of Crystal Growth, vol. 288, No. 1, Feb. 2, 2006, pp. 200-204.

S. Wedge et al., "Surface plasmon-polariton mediated emission of light from top-emitting organic light-emitting diode type structures," *Organic Electronics*, Aug. 10, 2006, vol. 8, pp. 136-147.

* cited by examiner

FIG. 1(a)
FIRST CONVENTIONAL ART
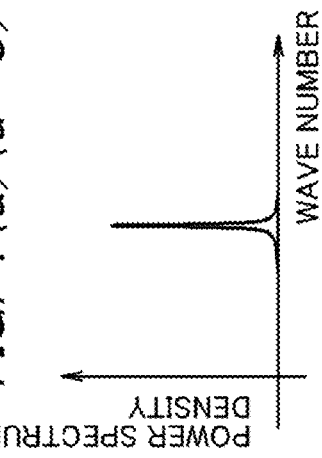
FIG. 1(a)(a-1)
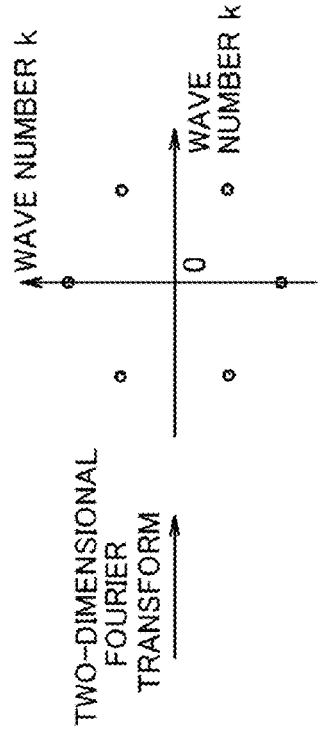
FIG. 1(a)(a-2)
FIG. 1(a)(a-3)
FIG. 1(b)
SECOND CONVENTIONAL ART
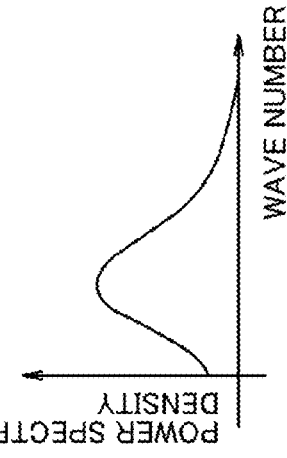
FIG. 1(b)(b-1)
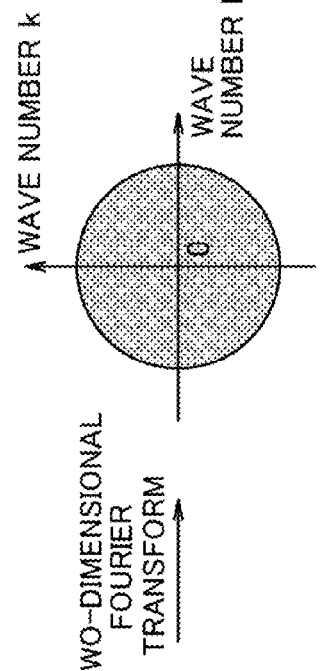
FIG. 1(b)(b-2)
FIG. 1(b)(b-3)

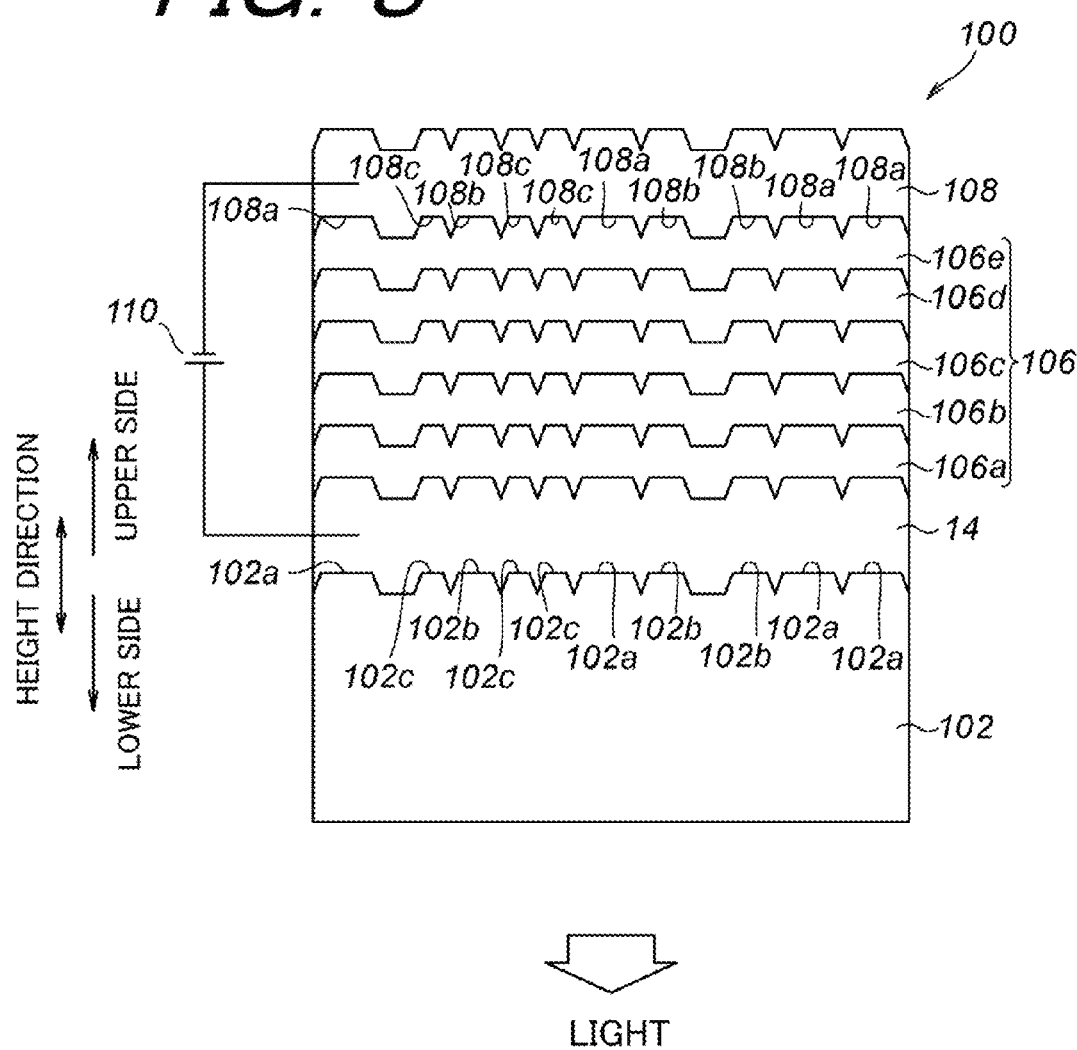

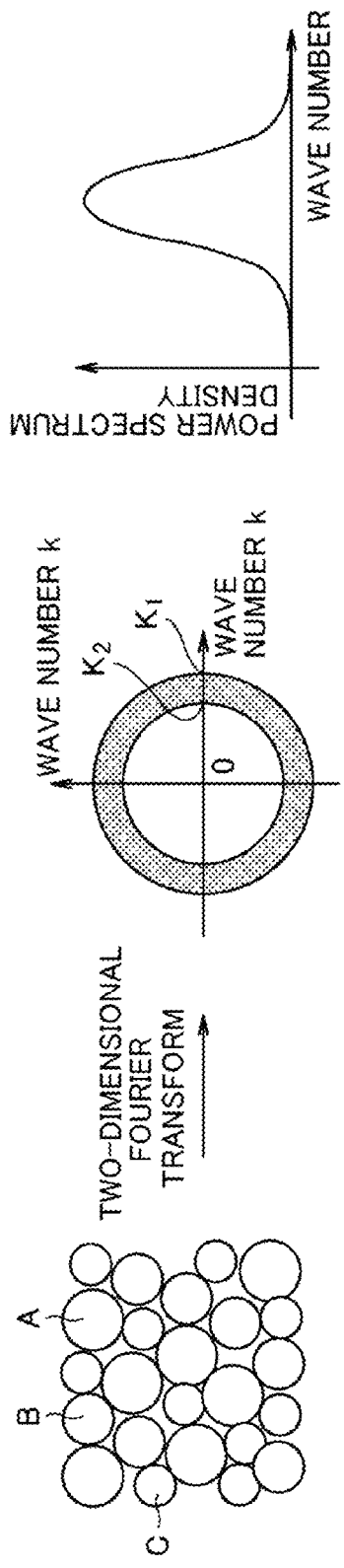

FIG. 13(a)

| EMBODIMENT | EXAMPLE/ COMPARATIVE EXAMPLE | COMBINATION RATIO ($\phi$/nm)=RATIO(%) | ELEMENT CONSTITUTION | SPECTRUM OF FINE STRUCTURE $I_o$ | | SPECTRUM OF LIGHT EMITTING MATERIAL $I_m$ | | OVERLAPPING RATIO A (%) BETWEEN SPECTRUM INTENSITY $I_m$ AND SPECTRUM INTENSITY $I_s$ | CURRENT EFFICIENCY – CURRENT DENSITY | | POWER EFFICIENCY – CURRENT DENSITY | |
|---|---|---|---|---|---|---|---|---|---|---|---|---|
| | | | | $K_{peak}$ ($\mu m^{-1}$) | FULL WIDTH AT HALF MAXIMUM ($\mu m^{-1}$) | $K_{peak}$ ($\mu m^{-1}$) | FULL WIDTH AT HALF MAXIMUM ($\mu m^{-1}$) | | cd/A (@12.5mA/ cm$^2$) | IMPROVED RATE TO COMPARATIVE EXAMPLE (TIMES) | lm/W (@12.5mA/ cm$^2$) | IMPROVED RATE TO COMPARATIVE EXAMPLE (TIMES) |
| 1 | EXAMPLE 1 | 524=100 | CATHODE TOP | 13.83 | 1.04 | 10.13 | 1.391 | 95.0 | 0.76 | 2.38 | 0.37 | 2.85 |
| | COMPARATIVE EXAMPLE 1 | FLAT SUBSTRATE | CATHODE TOP | – | – | – | – | – | 0.32 | 1.00 | 0.13 | 1.00 |
| 2 | EXAMPLE 2 | 410/360/305=25:50:25 | BOTTOM | 17.49 | 3.59 | 10.13 | 1.391 | 80.9 | 0.65 | 1.63 | 0.32 | 1.68 |
| | COMPARATIVE EXAMPLE 2 | 410=100 | BOTTOM | 17.69 | 1.45 | – | – | 45.4 | 0.40 | 1.00 | 0.19 | 1.00 |

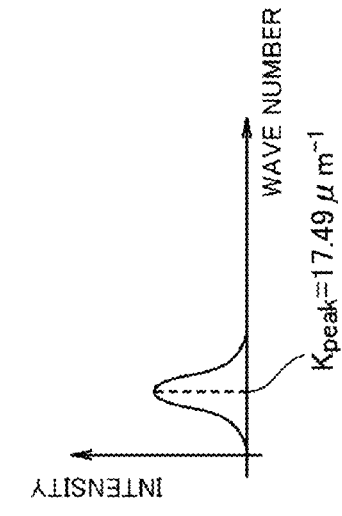

FIG. 13(b)

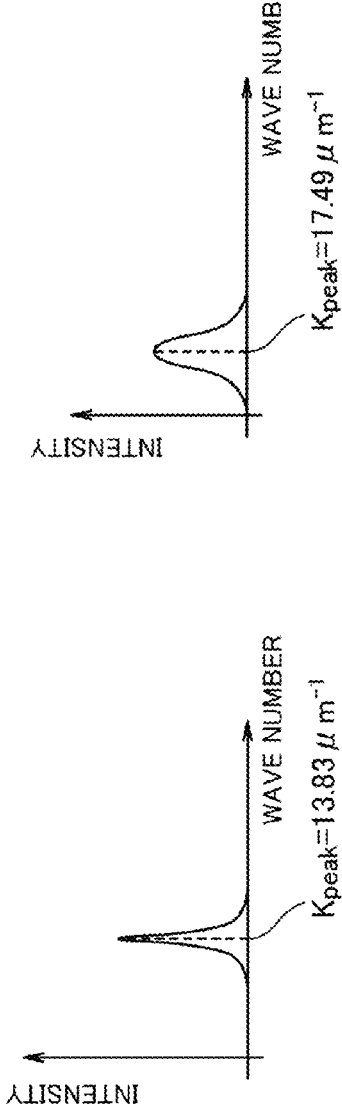

FIG. 13(c)

SURFACE PLASMON SPECTRUM CORRESPONDING TO SPECTRUM OF LIGHT EMITTING MATERIAL

SPECTRUM OF FINE STRUCTURE OF EXAMPLE 1

SPECTRUM OF FINE STRUCTURE OF COMPARATIVE EXAMPLE 1

SPECTRUM OF FINE STRUCTURE OF EXAMPLE 2

SPECTRUM OF FINE STRUCTURE OF COMPARATIVE EXAMPLE 2

Im : SPECTRUM INTENSITY OF SURFACE PLASMON
     CORRESPONDING TO SPECTRUM OF LIGHT EMITTING MATERIAL

Is : SPECTRUM INTENSITY OF FINE STRUCTURE

ORGANIC LIGHT EMITTING DIODE, MANUFACTURING METHOD FOR ORGANIC LIGHT EMITTING DIODE, IMAGE DISPLAY DEVICE, AND ILLUMINATION DEVICE

TECHNICAL FIELD

The present invention relates to an organic light emitting diode substrate, an organic light emitting diode, a manufacturing method for an organic light emitting diode substrate, a manufacturing method for an organic light emitting diode, an image display device and an illumination device. More particularly, the invention relates to an organic light emitting diode substrate which emits light by injection and recombination of electrons and holes and has an uneven structure, an organic light emitting diode, a manufacturing method for an organic light emitting diode substrate, a manufacturing method for an organic light emitting diode, an image display device and an illumination device.

BACKGROUND TECHNOLOGY

An organic light emitting diode is a light emitting element utilizing organic electro-luminescence (hereinafter, referred to as organic EL (Organic Electro-Luminescence)), and generally has a constitution that an organic EL layer including a light emitting layer, which contains an organic light emitting material, is sandwiched between an anode and a cathode.

It is to be noted that such an organic EL layer is constituted of an electron injection layer, an electron transport layer, a hole injection layer, a hole transport layer and the like as needed other than the light emitting layer.

Further, the organic light emitting diode is divided into a bottom emission-type and a top emission-type depending on a difference of a light extraction surface being a surface from which light is extracted to the outside from the light emitting layer.

In a bottom emission-type organic light emitting diode, an anode made of a transparent conductive material such as indium tin oxide (ITO), an organic EL layer including a light emitting layer, and a cathode made of a metal material are formed sequentially on a transparent substrate such as a glass substrate, and light is extracted from a substrate side. Specifically, a substrate surface is a light extraction surface in the bottom emission-type organic light emitting diode.

On the other hand, in a top emission-type organic light emitting diode, a cathode made of a metal material, an organic EL layer including a light emitting layer, and an anode made of a transparent conductive material such as ITO are formed sequentially on a transparent substrate such as a glass substrate, and light is extracted from a side opposite to the substrate side, that is, from an anode side. Specifically, an anode surface is a light extraction surface in the top emission-type organic light emitting diode.

Further, in such a top emission-type organic light emitting diode, a top emission-type organic light emitting diode having a constitution that the cathode is set on the top is known other than the top emission-type organic light emitting diode in which the anode is at the top (namely, anode is provided for a side from which light is extracted) as described above.

Specifically, in this top emission-type organic light emitting diode with the cathode at the top, a reflective layer made of a metal material, an anode made of a transparent conductive material such as ITO, an organic EL layer including a light emitting layer, and a cathode made of a metal material are formed sequentially on a substrate (not limited to a transparent substrate such as glass), and furthermore, a layer is formed on the cathode by a transparent conductive material such as ITO, and light is extracted from a side opposite to the substrate side, that is, from a cathode side. In other words, in the top emission-type organic light emitting diode with the cathode at the top, the cathode surface is a light extraction surface. For this reason, in the top emission-type organic light emitting diode with the cathode at the top, the metal layer of the cathode is formed thin to allow light to be transmissible.

More particularly, the top emission-type organic light emitting diode with the cathode at the top has a constitution that at least a reflective layer made of a metal material, an anode conductive layer made of a transparent conductive material, an organic EL layer including a light emitting layer which contains an organic light emitting material, and a cathode conductive layer in which a light-transmissible metal layer and a transparent conductive layer made of a transparent conductive material are sequentially stacked on the substrate.

Features of such an organic light emitting diode are advantages that less view angle dependency, less power consumption, it can be fabricated extremely thin, and, on the other hand, a problem that light extraction efficiency being efficiency of extracting light from the light emitting layer to the outside is low.

The light extraction efficiency means ratio of light quantity radiated from a light extraction surface (the substrate surface in the bottom emission-type, the anode surface in the top emission-type with the anode at the top, the cathode surface in the top emission-type with the cathode at the top) to the outside of the organic light emitting diode, that is, into a free space.

In the organic light emitting diode, light from the light emitting layer emits in all directions, and much of the light takes a waveguide mode that light repeats total reflection on the interface of a plurality of layers having different refraction indices, and the light is converted into heat as its wave is guided in the layers, or radiated from a side surface which is not adjacent to other layers in each layer, by which light extraction efficiency was reduced.

Further, since a distance between the light emitting layer and the cathode formed by metal is close, a part of near field light from the light emitting layer was converted into surface plasmon on the surface of the cathode and lost, by which light extraction efficiency was reduced.

Since light extraction efficiency in the organic light emitting diode affects brightness of a display or illumination device using the organic light emitting diode, method for improving efficiency fare being considered.

Conventionally, regarding the bottom emission-type monochromatic organic light emitting diode, there has been known a method for implementing a fine uneven structure made of a lattice having a single period (corresponding wavelength is a narrow bandwidth) into an element. The single lattice converts surface plasmon, which occurs on the cathode surface (light emitting layer side) in the bottom emission-type monochromatic organic light emitting diode element, into propagation light and extracts the light, thereby improving light extraction efficiency of the bottom emission-type monochromatic organic light emitting diode.

For example, Patent Application No. 2010-246653 shows a relationship between a pitch of a periodic fine uneven structure and an extraction wavelength, in which the pitch of the periodic fine uneven structure corresponding to the maximum wavelength of a light emitting material constituting the organic light emitting diode could be known. Further, also in the case of the anode top emission-type element, which has a structure that the bottom side and the top side of a layer constitution of the bottom emission-type element are inverted, a relationship between the pitch of the periodic fine uneven structure and the extraction wavelength, which is shown in International Publication No. 2012/060404 Pamphlet shown as Patent Document 5, is established.

However, the relationship between the pitch of the periodic fine uneven structure and the extraction wavelength has not been known regarding the cathode top emission-type element. Because the cathode top emission-type element has a feature that a semi-transmissive electrode made of an ultrathin metal material is used as a cathode, the relationship between the pitch of the periodic fine uneven structure and the extraction wavelength shown in conventional Patent Document 5 could not be directly applied.

Actually, since the cathode top emission-type element is used regarding an active matrix type display using the organic light emitting diode, the fact that the most suitable fine uneven structure for increasing light extraction efficiency had been unknown was significantly inconvenient.

Further, regarding light extraction of the organic light emitting diode, an important problem other than the one described above is known. Specifically, in the case of implementing the fine uneven structure made of a lattice having a single periodic structure into an element in order to improve the light extraction efficiency of a monochromatic organic light emitting diode, regardless of a type of the layer constitution of the organic light emitting diode, there was a problem that effect of extraction efficiency improvement had not obtained unless matching between the pitch of the fine uneven structure and the extraction wavelength had been accurate.

This problem applies to all of the bottom emission-type element, the anode top emission-type element, and the cathode top emission-type element.

Then, a device for eliminating the need of matching between the fine uneven structure and the extraction wavelength was considered by using a fine uneven structure for a white organic light emitting diode (corresponding wavelength is broadband) (described later) in the monochromatic organic light emitting diode element. However, there was a problem that the light extraction efficiency of the fine uneven structure for the white organic light emitting diode had been worse than the light extraction efficiency of the fine uneven structure for the monochromatic organic light emitting diode in the case where a light emission wavelength was limited to a certain narrow bandwidth.

The present invention has been created in consideration of the above-described problems, and it proposes a novel fine uneven structure for single color which combines the advantage of the fine uneven structure for single color (single period) and the advantage of the fine uneven structure for white color.

It is to be noted that Patent Documents 1 to 5 disclose methods using surface plasmon resonance as a technique for improving light extraction efficiency.

Specifically, in Patent Documents 1 to 5, a one-dimensional or two-dimensional periodic fine uneven structure is provided on the surface of a metal layer (cathode), by which the periodic fine uneven structure functions as a diffraction grating, and surface plasmon of the metal layer (cathode) surface is radiated. Thus, energy lost as surface plasmon is extracted as light, and light extraction efficiency improves.

Patent Document 4 out of the above-described Patent Documents discloses a method in which an organic light emitting diode substrate having a periodic lattice structure being a uneven structure, which is fabricated by a dry etching method that uses a two-dimensional crystalline body made of a particle single layer film as an etching mask, is fabricated, and an anode conductive layer, an organic EL layer, and a cathode conductive layer are sequentially stacked on the organic light emitting diode substrate.

In other words, as the periodic lattice structure is formed on the monochromatic organic light emitting diode substrate surface, a shape of the periodic lattice structure formed on the organic light emitting diode substrate surface is sequentially transferred onto each electrode layer and organic EL layer when stacking the layers, so that a periodic lattice structure having a shape in which the periodic lattice structure of the organic light emitting diode substrate surface is copied is formed on the surface of the light emitting layer side of the cathode conductive layer, by which light extraction efficiency can be improved.

Herein, in an organic light emitting diode provided with the organic light emitting diode substrate in which the periodic lattice structure as described above is formed, there is known that intensity, angle and a wavelength range of light emitted from the organic light emitting diode can be changed by changing parameters such as the pitch and height of an uneven structure of the periodic lattice structure.

Conventionally, the periodic lattice structure has been fabricated to bring a period of the uneven structure to a constant level aiming at efficiently extracting light having a specific single wavelength being a desired wavelength to obtain strong light.

This is because the more constant a period of unevenness being the fine uneven structure which is the periodic lattice structure, that is, spacing of unevenness, the higher the light extraction efficiency to a certain wavelength became.

For example, FIG. 1(a) shown as a first conventional art regarding the periodic fine uneven structure shows an example of the case where an organic light emitting diode substrate having a periodic lattice structure in which the period of an uneven structure is constant is fabricated by a dry etching method using a two-dimensional crystalline body made of a particle single layer film whose particle diameter is a constant particle diameter D as an etching mask, as shown in (a-1) of FIG. 1(a), and (a-2) of FIG. 1(a) shows power spectrum of height distribution in the organic light emitting diode substrate surface having such a periodic lattice structure in which the period of the uneven structure is constant.

Specifically, in the case where the periodic lattice structure of the organic light emitting diode substrate surface is formed to bring the period of the uneven structure to a constant level, a delta functional dot sequence arrayed at positions of the apexes of a regular hexagon is obtained as the power spectrum which is obtained by performing two-dimensional Fourier transform to the height distribution in the uneven structure.

Then, (a-3) of FIG. 1(a) shows a profile of the power spectrum of the height distribution in the periodic lattice structure where the period of the uneven structure becomes constant.

Herein, the power spectrum of the height distribution is obtained by: transforming the height distribution of the uneven structure into wave-vector space by performing two-dimensional Fourier transform; finding power spectrum intensities (squared absolute values of amplitude); and plotting them.

Further, the profile of the power spectrum is obtained by: integrating the power spectrum intensities on a circumference where wave numbers become constant in the power spectrum; and plotting them with wave numbers taken on the axis of abscissa.

Coordinates of each point in the power spectrum space corresponds to a wave vector $K=(K_x,K_y)$. An absolute value $K=|K|=(K_x^2+K_y^2)^{1/2}$ of the wave vector is called a wave number. Further, the wave number is equivalent to a product obtained by multiplying a space frequency by $2\pi$.

Such a profile of the power spectrum of the height distribution has high intensity at a specific wave number and includes a sharp peak as shown in (a-3) of FIG. 1(a), and indicates that surface plasmon having the specific wave number is diffracted to be converted into light. Consequently, the profile shows that light extraction efficiency of light having the same frequency as the surface plasmon is high.

However on the other hand, the fine uneven structure having high light extraction efficiency has a narrow allowable range of a deviation of period, so there was a problem of risk that the extraction wavelength is deviated from a target light emission wavelength when the fine uneven structure only slightly changed.

Therefore, in the case of aiming at obtaining broadband light such as the case where the light extraction efficiency of white light needs to be increased, it has been pointed out obtaining desired light was difficult on the organic light emitting diode substrate having a two-dimensional lattice structure whose period of the uneven structure was constant.

It is to be noted that the case of aiming at obtaining broadband light is the case of fabricating a white organic light emitting diode where a wavelength of light to be extracted spans the entire visible light region (380 nm to 780 nm), the case of extracting light in a broader band, which is light that spans the entire visible light to near infrared region (380 nm to 2500 nm) for example.

As a technique for solving such a problem, there is proposed a technique of making the pitch, height or the like of an uneven structure formed on the organic light emitting diode substrate surface irregular.

Further, FIG. 1(b) shown as a second conventional art regarding the periodic fine uneven structure shows an example of the case where an organic light emitting diode substrate having an uneven structure with an irregular pitch is fabricated by a dry etching method in which a two-dimensional crystalline body made of a particle single layer film which is formed by mixing particles of a plurality of particle diameters (two types or more for example) is used as an etching mask as shown in (b-1) of FIG. 1(b), and (b-2) of FIG. 1(b) shows the power spectrum of the height distribution in the organic light emitting diode substrate surface having such an uneven structure with the irregular pitch.

Specifically, in the case where the uneven structure of the organic light emitting diode substrate surface is formed to make the pitch irregular, the power spectrum of the height distribution showing distribution in a circular region is obtained.

The profile of the power spectrum of the height distribution in the uneven structure with the irregular pitch, which was obtained by the organic light emitting diode having the uneven structure with the irregular pitch includes a certain degree of intensity in a broadband wave number region as shown in (b-3) of FIG. 1(b), and its absolute value was not high compared with the uneven structure whose period is constant.

However, an attempt of obtaining power spectrum intensity by simply increasing the height of the uneven structure is not preferable because it causes a new problem that surface plasmon tends to be localized and a short circuit in an element easily occurs.

In other words, according to the organic light emitting diode having the uneven structure with the irregular pitch, although an organic light emitting diode having extraction efficiency of electromagnetic wave in an arbitrary broadband wavelength region from the visible light to near infrared region can be realized and there is no possibility that the extraction wavelength is deviated from a target light emission wavelength when the fine uneven structure only slightly changed, it caused a new problem that the intensity of light to be extracted becomes weak.

PRIOR ART DOCUMENTS

Patent Document

Patent Document 1: Japanese Unexamined Patent Application Publication No. 2002-270891
Patent Document 2: Japanese Unexamined Patent Application Publication No. 2004-31350
Patent Document 3: Published Japanese translation of PCT application No. 2005-535121
Patent Document 4: Japanese Unexamined Patent Application Publication No. 2009-158478
Patent Document 5: International Publication No. 2012/060404 Pamphlet

SUMMARY OF THE INVENTION

Problems to be Solved by the Invention

The present invention has been created in consideration of the above-described various problems that the prior art has, and it is an object of the invention (1) to show a relationship between the pitch of a periodic fine uneven structure and an extraction wavelength in the spectrum of a light emitting material regarding a cathode top emission-type organic light emitting diode element, and to provide an organic light emitting diode substrate, an organic light emitting diode, a manufacturing method for an organic light emitting diode substrate, a manufacturing method for an organic light emitting diode, an image display device and an illumination device, which are excellent in light extraction efficiency and capable of extracting light in a narrow bandwidth by surface plasmon extraction, and (2) to provide an organic light emitting diode substrate, an organic light emitting diode, a manufacturing method for an organic light emitting diode substrate, a manufacturing method for an organic light emitting diode, an image display device and an illumination device, which are excellent in light extraction efficiency and capable of extracting light in a narrow bandwidth, which has a certain degree of broadness and an arbitrary central wavelength in a region from visible light to near infrared, in which light extraction efficiency of a monochromatic organic light emitting diode element made of one type of light emitting material is high, and there is no risk that the extraction wavelength is deviated from a target light emission wavelength by a slight change of a fine uneven structure.

Means for Solving the Problems

To achieve the above-described object, the organic light emitting diode according to the present invention is a top emission-type organic light emitting diode, in which at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and a two-dimensional lattice structure, in which a plurality of convex portions are arrayed periodically and two-dimensionally, is formed on a surface of the semi-transmissive metal layer which is in contact with the transparent conductive layer side. Assuming that a real part of a propagation constant of surface plasmon on the surface, which is expressed by a complex number, is k, a center-to-center distance P between adjacent convex portions in the convex portions formed on the surface has a value in the range of Mathematical Formula (1), $P_0$ in the Mathematical Formula (1) satisfies Mathematical Formula (2) below when a triangular lattice structure is formed as the two-dimensional lattice structure, and satisfies Mathematical Formula (3) below when a rectangular lattice structure is formed as the two-dimensional lattice structure:

[Mathematical Formula 1]

$$0.8P_0 \leq P \leq 1.2P_0 \qquad (1)$$

[Mathematical Formula 2]

$$P_0 = \frac{4\pi}{\sqrt{3}k} \qquad (2)$$

[Mathematical Formula 3]

$$P_0 = \frac{2\pi}{k} \qquad (3)$$

Further, the organic light emitting diode according to the present invention is a top emission-type organic light emitting diode, in which at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and a two-dimensional lattice structure, in which a plurality of concave portions are arrayed periodically and two-dimensionally, is formed on a surface of the semi-transmissive metal layer which is in contact with the transparent conductive layer side. Assuming that a real part of a propagation constant of surface plasmon on the surface, which is expressed by a complex number, is k, a center-to-center distance P between adjacent concave portions in the concave portions formed on the surface has a value in the range of Mathematical Formula (1), $P_0$ in the Mathematical Formula (1) satisfies Mathematical Formula (2) below when a triangular lattice structure is formed as the two-dimensional lattice structure, and satisfies Mathematical Formula (3) below when a rectangular lattice structure is formed as the two-dimensional lattice structure:

[Mathematical Formula 1]

$$0.8P_0 \leq P \leq 1.2P_0 \qquad (1)$$

[Mathematical Formula 2]

$$P_0 = \frac{4\pi}{\sqrt{3}k} \qquad (2)$$

[Mathematical Formula 3]

$$P_0 = \frac{2\pi}{k} \qquad (3)$$

Further, the organic light emitting diode according to the present invention is a top emission-type organic light emitting diode, in which at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and a two-dimensional lattice structure, in which a plurality of convex portions are arrayed periodically and two-dimensionally, is formed on a surface of the semi-transmissive metal layer which is in contact with the organic electro-luminescence layer side. Assuming that a real part of a propagation constant of surface plasmon on the surface, which is expressed by a complex number, is k, a center-to-center distance P between adjacent convex portions in the convex portions formed on the surface has a value in the range of Mathematical Formula (1), $P_0$ in the Mathematical Formula (1) satisfies Mathematical Formula (2) below when a triangular lattice structure is formed as the two-dimensional lattice structure, and satisfies Mathematical Formula (3) below when a rectangular lattice structure is formed as the two-dimensional lattice structure:

[Mathematical Formula 1]

$$0.8P_0 \leq P \leq 1.2P_0 \qquad (1)$$

[Mathematical Formula 2]

$$P_0 = \frac{4\pi}{\sqrt{3}k} \qquad (2)$$

[Mathematical Formula 3]

$$P_0 = \frac{2\pi}{k} \qquad (3)$$

Further, the organic light emitting diode according to the present invention is a top emission-type organic light emitting diode, in which at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and a two-dimensional lattice structure, in which a plurality of concave portions are arrayed periodically and two-dimensionally, is formed on a surface of the semi-transmissive metal layer which is in contact with the organic electro-luminescence layer side. Assuming that a real part of a propagation constant of surface plasmon on the surface, which is expressed by a complex number, is k, a center-to-center distance P between adjacent concave portions in the concave portions formed on the surface has a value in the range of Mathematical Formula (1), $P_0$ in the Mathematical Formula (1) satisfies Mathematical Formula (2) below when a triangular lattice structure is formed as the two-dimensional lattice structure, and satisfies Mathematical Formula (3) below when a rectangular lattice structure is formed as the two-dimensional lattice structure:

[Mathematical Formula 1]

$$0.8 P_0 \leq P \leq 1.2 P_0 \quad (1)$$

[Mathematical Formula 2]

$$P_0 = \frac{4\pi}{\sqrt{3}k} \quad (2)$$

[Mathematical Formula 3]

$$P_0 = \frac{2\pi}{k} \quad (3)$$

Further, the organic light emitting diode according to the present invention is a bottom emission-type organic light emitting diode, in which at least an anode conductive layer made of a transparent conductive material, an organic electro-luminescence layer including a light emitting layer containing an organic light emitting material, and a cathode conductive layer made of a metal material are sequentially stacked on a substrate, and a random fine uneven structure by a plurality of uneven portions is formed on a surface of the cathode conductive layer which is in contact with the organic electro-luminescence layer. When, out of wavelengths which give a half value of a peak $\lambda_{peak}$ of emission spectrum in light obtained by the organic light emitting material, a shorter wavelength is $\lambda_1$ and a longer wavelength is $\lambda_2$, and real parts of the propagation constant of surface plasmon corresponding to wavelengths $2\lambda_1-\lambda_{peak}$ and $2\lambda_2-\lambda_{peak}$ on an interface between a cathode conductive layer and an organic electro-luminescence layer are $k_1$ and $k_2$ respectively, power spectrum of the height distribution of the fine uneven structure on the interface has a finite value between a wave number $K_1$ and a wave number $K_2$, and an integrated value of the spectrum intensity within a range of the wave numbers has a value of intensity at 50% or higher of spectrum intensity over all wave numbers.

Further, the organic light emitting diode according to the present invention is a top emission-type organic light emitting diode, in which at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and a random fine uneven structure by a plurality of uneven portions is formed on a surface of the semi-transmissive metal layer which is in contact with the organic electro-luminescence layer. When, out of wavelengths which give a half value of a peak $\lambda_{peak}$ of emission spectrum in light obtained by the organic light emitting material, a shorter wavelength is $\lambda_1$ and a longer wavelength is $\lambda_2$, and real parts of the propagation constant of surface plasmon corresponding to wavelengths $2\lambda_1-\lambda_{peak}$ and $2\lambda_2-\lambda_{peak}$ on an interface between a cathode conductive layer and an organic electro-luminescence layer are $k_1$ and $k_2$ respectively, power spectrum of the height distribution of the fine uneven structure on the interface has a finite value between a wave number $K_1$ and a wave number $K_2$, and an integrated value of the spectrum intensity within a range of the wave numbers has a value of intensity at 50% or higher of spectrum intensity over all wave numbers.

Further, the organic light emitting diode according to the present invention is a top emission-type organic light emitting diode, in which at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and a random fine uneven structure by a plurality of uneven portions is formed on a surface of the semi-transmissive metal layer which is in contact with the transparent conductive layer. When, out of wavelengths which give a half value of a peak $\lambda_{peak}$ of emission spectrum in light obtained by the organic light emitting material, a shorter wavelength is $\lambda_1$ and a longer wavelength is $\lambda_2$, and real parts of the propagation constant of surface plasmon corresponding to wavelengths $2\lambda_1-\lambda_{peak}$ and $2\lambda_2-\lambda_{peak}$ on an interface between a cathode conductive layer and an organic electro-luminescence layer are $k_1$ and $k_2$ respectively, power spectrum of the height distribution of the fine uneven structure on the interface has a finite value between a wave number $K_1$ and a wave number $K_2$, and an integrated value of the spectrum intensity within a range of the wave numbers has a value of intensity at 50% or higher of spectrum intensity over all wave numbers.

Further, the organic light emitting diode according to the present invention is a top emission-type organic light emitting diode, in which at least a cathode conductive layer made of a metal material, an organic electro-luminescence layer including a light emitting layer containing an organic light emitting material, and an anode conductive layer made of a transparent conductive material are sequentially stacked on a substrate, and a random fine uneven structure by a plurality of uneven portions is formed on a surface of the cathode conductive layer which is in contact with the organic electro-luminescence layer. When, out of wavelengths which give a half value of a peak $\lambda_{peak}$ of emission spectrum in light obtained by the organic light emitting material, a shorter wavelength is $\lambda_1$ and a longer wavelength is $\lambda_2$, and real parts of the propagation constant of surface plasmon corresponding to wavelengths $2\lambda_1-\lambda_{peak}$ and $2\lambda_2-\lambda_{peak}$ on an interface between a cathode conductive layer and an organic electro-luminescence layer are $k_1$ and $k_2$ respectively, power spectrum of the height distribution of the fine uneven structure on the interface has a finite value between a wave number $K_1$ and a wave number $K_2$, and the integrated value of the spectrum intensity within a range of the wave numbers has a value of intensity at 50% or higher of spectrum intensity over all wave numbers.

Further, the organic light emitting diode according to the present invention is the above-described organic light emitting diode in which a metal material which forms the metal layer is Ag or Al or alloy with the content of Ag at 70% by mass or higher, or alloy with the content of Al at 70% by mass or higher.

Further, the organic light emitting diode according to the present invention is the above-described organic light emitting diode in which a depth of the concave portion and a height of the convex portion is from 15 to 180 nm.

Further, the manufacturing method of an organic light emitting diode according to the present invention is a manufacturing method of the above-described organic light emitting diode, where a two-dimensional lattice structure in which a plurality of convex portions or concave portions are arrayed periodically and two-dimensionally is fabricated on the surface of the substrate, and the reflective layer, the anode conductive layer, the organic electro-luminescence layer and the cathode conductive layer are sequentially stacked on the surface of the substrate where the two-dimensional lattice structure, in which a plurality of convex portions or concave portions are arrayed periodically and two-dimensionally, is formed.

Further, the manufacturing method of an organic light emitting diode according to the present invention is the above-described manufacturing method of an organic light emitting diode, where a two-dimensional lattice structure in which a plurality of convex portions or concave portions are arrayed periodically and two-dimensionally is formed on the surface of the substrate by a dry etching method using a particle single layer film, in which predetermined particles are two-dimensionally close-packed, as an etching mask.

Further, the manufacturing method of an organic light emitting diode according to the present invention is the above-described manufacturing method of an organic light emitting diode, where a template on which a structure, in which a plurality of convex portions or concave portions are arrayed periodically and two-dimensionally is formed, is fabricated by a dry etching method using a particle single layer film, in which predetermined particles are two-dimensionally close-packed, as an etching mask, and the two-dimensional lattice structure in which a plurality of convex portions or concave portions are arrayed periodically and two-dimensionally, which is formed on the template, is transferred, and the two-dimensional lattice structure in which a plurality of convex portions or concave portions are arrayed periodically and two-dimensionally is formed on the surface of the substrate.

Further, the manufacturing method of an organic light emitting diode according to the present invention is the above-described manufacturing method of the organic light emitting diode of a top emission-type in which a two-dimensional lattice structure, in which a plurality of convex portions are arrayed periodically and two-dimensionally, is formed on a surface of the semi-transmissive metal layer which is in contact with the transparent conductive layer side, where a particle diameter D satisfies Mathematical Formula (4) below in the predetermined particles:
[Mathematical Formula 4]

$$D = P \quad (4)$$

Further, in the organic light emitting diode according to the present invention, a metal material which forms the metal layer is Ag, Al or alloy with the content of Ag at 10% by mass or higher, or alloy with the content of Al at 10% by mass or higher.

Further, in the organic light emitting diode according to the present invention, a depth of the concave portion and a height of the convex portion is from 15 to 180 nm.

Further, in the manufacturing method of an organic light emitting diode according to the present invention, a two-dimensional lattice structure in which a plurality of convex portions or concave portions are arrayed periodically and two-dimensionally is fabricated on the surface of the substrate, and at least an anode conductive layer made of a transparent conductive material, an organic electro-luminescence layer including a light emitting layer containing an organic light emitting material, and a cathode conductive layer made of a metal material are sequentially stacked on the surface of the substrate where the two-dimensional lattice structure, in which a plurality of convex portions or concave portions are arrayed periodically and two-dimensionally, is formed such that the convex portions or concave portions are copied.

Further, the manufacturing method of an organic light emitting diode according to the present invention is the above-described manufacturing method of the organic light emitting diode of a top emission-type in which a two-dimensional lattice structure, in which a plurality of convex portions are arrayed periodically and two-dimensionally, is formed on a surface of the semi-transmissive metal layer which is in contact with the transparent conductive layer side, where a two-dimensional lattice structure in which a plurality of convex portions or concave portions are arrayed periodically and two-dimensionally is fabricated on the surface of the substrate, and at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on the surface of the substrate where the two-dimensional lattice structure, in which a plurality of convex portions or concave portions are arrayed periodically and two-dimensionally, is formed such that the convex portions or concave portions are copied.

Further, the manufacturing method of an organic light emitting diode according to the present invention is the above-described manufacturing method of the organic light emitting diode of a top emission-type in which a two-dimensional lattice structure, in which a plurality of convex portions are arrayed periodically and two-dimensionally, is formed on a surface of the semi-transmissive metal layer which is in contact with the transparent conductive layer side, where a two-dimensional lattice structure in which a plurality of convex portions or concave portions are arrayed periodically and two-dimensionally is fabricated on the surface of the substrate, and at least a cathode conductive layer made of a metal material, an organic electro-luminescence layer including a light emitting layer containing an organic light emitting material, and an anode conductive layer made of a transparent conductive material are sequentially stacked on the surface of the substrate where the two-dimensional lattice structure, in which a plurality of convex portions or concave portions are arrayed periodically and two-dimensionally, is formed such that the convex portions or concave portions are copied.

Further, in the manufacturing method of an organic light emitting diode according to the present invention, a two-dimensional lattice structure in which a plurality of convex portions or concave portions are arrayed periodically and two-dimensionally is fabricated on the surface of the substrate is formed by a dry etching method using a particle single layer film, which is formed by using a mixture of a plurality of particles having different average particle diameters, as an etching mask.

Further, in the manufacturing method of an organic light emitting diode according to the present invention, a master on which a structure, in which a plurality of convex portions or concave portions are arrayed periodically and two-dimensionally, is formed is fabricated by a dry etching method using a particle single layer film, in which predetermined particles are two-dimensionally close-packed, as an etching mask, a transfer body which is fabricated by any method of an electroforming, a nanoimprint method, an injection molding method and a UV embossing method from the master is used as a template, the two-dimensional lattice structure in which a plurality of convex portions or concave portions are arrayed periodically and two-dimensionally, which is formed on the template, is transferred from the template by any method of the electroforming, the nanoimprint method, the injection molding method and the UV embossing method, and the two-dimensional lattice structure in which a plurality of convex portions or concave portions are arrayed periodically and two-dimensionally is formed on the surface of the substrate.

Further, the image display device according to the present invention is equipped with the above-described organic light emitting diode.

Further, the illumination device according to the present invention is equipped with the above-described organic light emitting diode.

Effect of the Invention

Since the present invention is constituted as described above, it exerts an excellent effect that high light extraction efficiency can be obtained, light in a narrow bandwidth having a certain degree of broadness in a region from visible light to near infrared can be extracted, and there is no risk that the extraction wavelength is deviated from the target light emission wavelength by a slight change of the fine uneven structure.

BRIEF DESCRIPTION OF DRAWINGS

FIG. 1(a) is an explanatory view showing a first conventional art regarding a periodic fine uneven structure, (a-1) of FIG. 1(a) shows a particle single layer film whose constant particle diameter is a particle diameter D, further, (a-2) of FIG. 1(a) shows a power spectrum of height distribution in an organic light emitting diode substrate surface having a two-dimensional lattice structure in which the period of an uneven structure is constant, and (a-3) of FIG. 1(a) shows a profile of the power spectrum of the height distribution of the two-dimensional lattice structure in which the period of the uneven structure becomes constant. Further, FIG. 1(b) is an explanatory view showing a second conventional art regarding the periodic fine uneven structure, (b-1) of FIG. 1(b) shows a particle single layer film which is formed by mixing particles of a plurality of particle diameters (two types or more for example), and (b-2) of FIG. 1(b) shows the power spectrum of the height distribution in an organic light emitting diode substrate surface having an uneven structure with an irregular pitch, and (b-3) of FIG. 1(b) shows a profile of the power spectrum of the height distribution in the uneven structure whose pitch is irregular.

FIG. 8 is a schematic constitution cross-sectional explanatory view showing an example of the structure of the bottom emission-type organic light emitting diode according to the second embodiment of the present invention.

FIG. 9 is an explanatory view showing the characteristics of the organic light emitting diode according to the second embodiment of the present invention, FIG. 9(a-1) shows the particle single layer film according to the second embodiment of the present invention, and FIG. 9(a-2) shows the power spectrum of the height distribution in an organic light emitting diode substrate surface having the uneven structure according to the second embodiment of the present invention, and FIG. 9(a-3) shows a profile of the power spectrum of the height distribution on the organic light emitting diode substrate surface according to the second embodiment of the present invention.

FIG. 13(a) is a table showing a specific example regarding light extraction efficiency and light emission efficiency of an organic light emitting diode 10 of the first embodiment and an organic light emitting diode 100 of the second embodiment, FIGS. 13(b) and (c) are conceptual explanatory views explaining $K_{peak}$ in the spectrum of the fine uneven structure.

MODES FOR IMPLEMENTING THE INVENTION

(1) First Embodiment

Hereinafter, referring to the accompanying drawings, the organic light emitting diode by the first embodiment of the present invention will be explained in detail.

Now in the explanation below, as long as the present invention is used, a structure and a method of a target organic light emitting diode are not necessarily limited.

(1-1) Constitution of the Organic Light Emitting Diode by the First Embodiment

Figure 2:
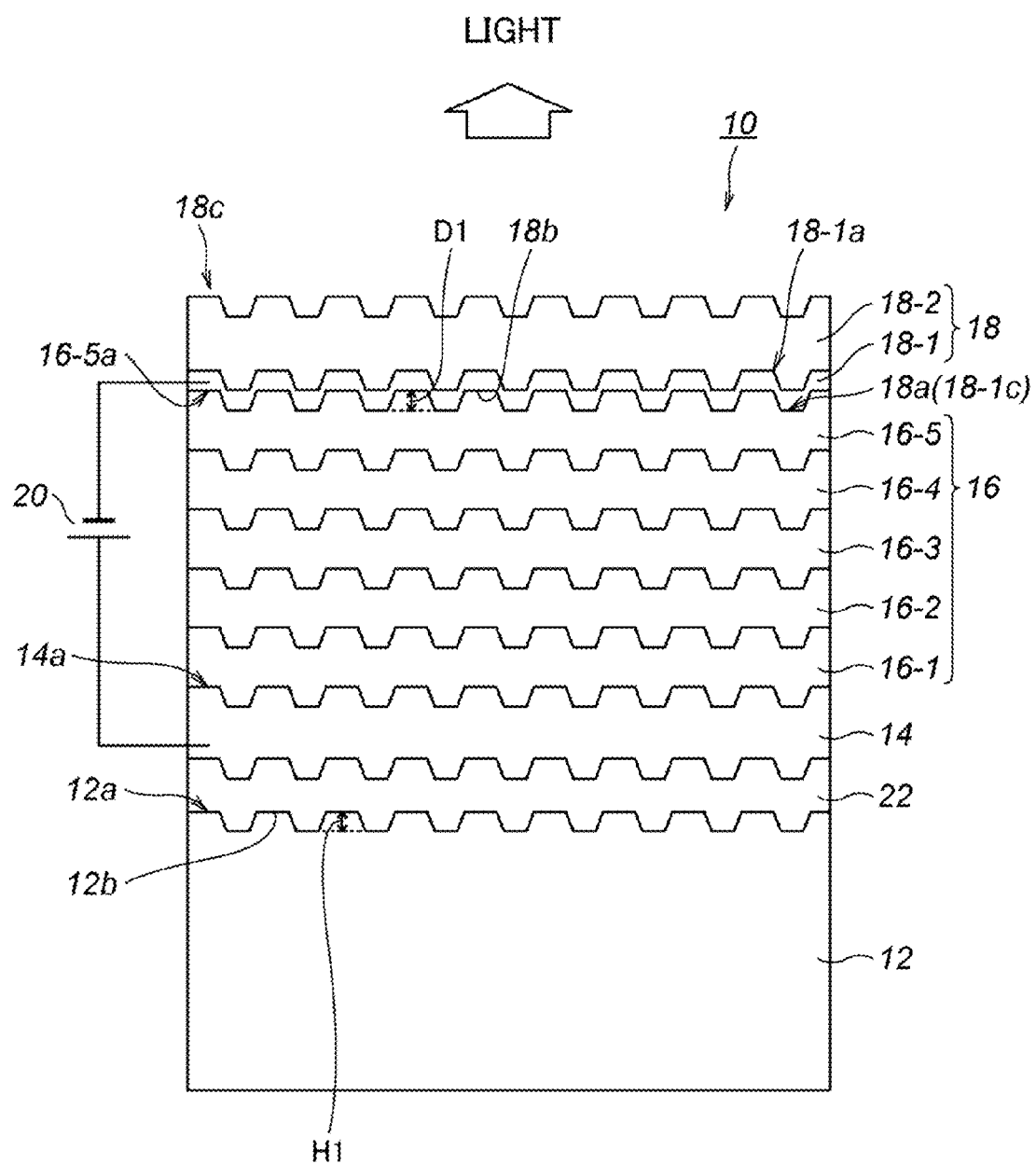
FIG. 2 is a schematic constitution explanatory view showing the organic light emitting diode according to the first embodiment of the present invention.

Herein, FIG. 2 shows a schematic constitution explanatory view showing the organic light emitting diode by the first embodiment of the present invention.

The organic light emitting diode 10 shown in FIG. 2 is a monochromatic organic light emitting diode of a type generally referred to as a top emission-type with a cathode at the top, and a reflective layer 22, an anode conductive layer 14, an organic EL layer 16, and a cathode conductive layer 18 are sequentially stacked on a substrate 12.

Then, the diode is designed that voltage can be applied to the anode conductive layer 14 and the cathode conductive layer 18 by a power source 20.

In the organic light emitting diode 10, as voltage is applied to the anode conductive layer 14 and the cathode conductive layer 18, holes are injected from the anode conductive layer 14 to the organic EL layer 16, and electrons are injected from the cathode conductive layer 18 to the organic EL layer 16, and light generated on the organic EL layer is extracted from the cathode conductive layer 18 side.

Such a reflective layer 22 of the organic light emitting diode 10 is a layer which is provided so as to reflect light from the organic EL layer 16 to prevent the light from being extracted from the substrate 12. Therefore, the reflective layer 22 is constituted of a metal material which reflects visible light, and is constituted by using Ag or Al for example. Further, it is preferable that a thickness of such a reflective layer 22 be 100 to 200 nm for example.

It is to be noted that a thickness of each layer including the reflective layer 22 which constitutes the organic light emitting diode 10 can be measured by a spectroscopic ellipsometer, a contact-type step meter, an atomic force microscope (AFM) or the like.

Further, the anode conductive layer 14 is constituted of a transparent conductive material which transmits visible light. Such a transparent conductive material is not particularly limited, and a material publicly known as a transparent conductive material can be used. Specifically, indium-tin oxide (ITO), indium-zinc oxide (IZO), zinc oxide (ZnO), zinc-tin oxide (ZTO) and the like are included as a transparent conductive material used for the anode conductive layer 14. Further, it is preferable that a thickness of such an anode conductive layer 14 be 50 to 200 nm for example.

Further, the organic EL layer 16 is constituted of: a hole injection layer 16-1 to which holes are injected from the power source 20; a hole transport layer 16-2 which transports holes injected in the hole injection layer 16-1 to a light emitting layer 16-3 (described later) and blocks electrons from the light emitting layer 16-3; the light emitting layer 16-3 which contains an organic light emitting material and on which holes transported from the hole transport layer 16-2 and electrons transported from an electron transport layer 16-4 (described later) are combined to emit light; the electron transport layer 16-4 which transports electrons injected in an electron injection layer 16-5 (described later) to the light emitting layer 16-3 and blocks holes from the light emitting layer 16-3; and the electron injection layer 16-5 to which electrons are injected from the power source 20.

Then, in the organic EL layer 16, the hole injection layer 16-1, the hole transport layer 16-2, the light emitting layer 16-3, the electron transport layer 16-4, and the electron injection layer 16-5 are stacked on the anode conductive layer 14 in this order.

Now in these layers, there are cases where one layer has one role or combines two or more roles. For example, one layer can combine the electron transport layer 16-4 and the light emitting layer 16-3.

In other words, it is only necessarily that the organic EL layer 16 be a layer which includes at least the light emitting layer 16-3 containing an organic light emitting material, and may be constituted only of the light emitting layer 16-3, but other layers different from the light emitting layer 16-3 are generally included. Such other layers different from the light emitting layer 16-3 may be constituted of an organic material or may be constituted of an inorganic material as long as the function of the light emitting layer 16-3 is not impaired.

In this embodiment, the organic EL layer 16 is constituted of five layers which are the hole injection layer 16-1, the hole transport layer 16-2, the light emitting layer 16-3, the electron transport layer 16-4, and the electron injection layer 16-5. The most important layer out of these layers is the light emitting layer 16-3, and the hole injection layer 16-1 and the electron injection layer 16-5 can be omitted for example. Further, the electron transport layer 16-4 can serve as the light emitting layer 16-3.

Materials constituting each layer of the organic EL layer 16 are not particularly limited, and publicly known materials can be used.

Specifically, an organic light emitting material is used as a material constituting the light emitting layer 16-3, and such an organic light emitting material includes a pigment compound such as Tris[1-phenylisoquinoline-C2,N]iridium(lll) (Ir(piq)3), 1, 4-bis[4-(N,N-diphenylaminostyrylbenzene)] (DPAVB), Bis[2-(2-benzoxazolyl)phenolate]Zinc(II) (Zn-PBO).

Further, a material created by doping a fluorescent pigment compound or a phosphorescence emission material with other substance (host material) may also be used. In this case, a material constituting the hole transport layer 16-2, a material constituting the electron transport layer 16-4, or an exclusive host material should be used as a host material.

An organic material is generally used as a material constituting the hole injection layer 16-1, the hole transport layer 16-2 and the electron transport layer 16-4.

A compound such as 4,4',4"-tris(N,N-2naphthylphenylamino)triphenylamine (2-TNATA) for example is included as a material constituting the hole injection layer 16-1.

Further, as a material constituting the hole transport layer 16-2, an aromatic amine compound such as N,N'-diphenyl-N,N'-bis(1-naphthyl)-(1-1'-biphenyl)-4,4'-diamine (NPD), copper phthalocyanine (CuPc), N,N'-Diphenyl-N—N'-di(m-tolyl)benzidine (TPD), or the like is included, for example.

Moreover, as a material constituting the electron transport layer 16-4, an oxadiazole-based compound such as 2,5-Bis(1-naphthyl)-1,3,4-oxadiazole (BND), 2-(4-tert-Butylphenyl)-5-(4-biphenylyl)-1,3,4-oxadiazole (PBD), and a metal complex-based compound such as Tris(8-quinolinolate)aluminum (Alq) are included for example.

Furthermore, as a material constituting the electron injection layer 16-5, lithium fluoride (LiF) or the like is included for example.

When such an electron injection layer 16-5 is provided between the electron transport layer 16-4 and the cathode conductive layer 18, a difference of a work function can be minimized, and electrons become easily movable from the cathode conductive layer 18 to the electron transport layer 16-4.

Now when magnesium alloy such as Mg/Ag=10/90 is used as the cathode conductive layer 18, it becomes possible to obtain electron injection effect without providing the electron injection layer 16-5.

A thickness from 30 to 500 nm for example is preferable as the entire thickness of such an organic EL layer 16.

Further, the cathode conductive layer 18 is constituted of a metal layer 18-1 connected with the cathode of the power source 20 and a transparent conductive layer 18-2, and the metal layer 18-1 and the transparent conductive layer 18-2 are sequentially stacked on the organic EL layer 16.

The metal layer 18-1 is made of Ag, alloy with the content of Ag at 70% or higher, Al, or alloy with the content of Al at 70% or higher, and magnesium alloy such as Mg/Ag=10/90 as described above for example is included as the alloy.

A thickness of 10 to 30 nm for example is preferable as the thickness of the metal layer 18-1, and the layer is capable of transmitting light from the organic EL layer 16.

The transparent conductive layer 18-2 is constituted of a transparent conductive material which transmits visible light similar to the anode conductive layer 14, such a transparent conductive material is not particularly limited, and a material publicly known as a transparent conductive material can be used. Specifically, indium-tin oxide (ITO), indium-zinc oxide (IZO), zinc oxide (ZnO), zinc-tin oxide (ZTO) and the like are included as a transparent conductive material used for the transparent conductive layer 18-2.

Herein, the organic light emitting diode 10 is a top emission-type in which light is extracted from the cathode conductive layer 18 side. For this reason, the metal layer 18-1 is formed of a thin layer to make it possible to transmit light from the organic EL layer 16.

At this point, when the cathode conductive layer 18 is made of the metal layer 18-1 only, volume resistance becomes larger because the metal layer 18-1 is a thin layer.

For this reason, in the organic light emitting diode 10, conductivity is improved by providing the transparent conductive layer 18-2 as an auxiliary electrode layer together with the metal layer 18-1 as the cathode conductive layer 18.

A thickness from 50 to 200 nm for example is preferable as the thickness of such a transparent conductive layer 18-2.

Further, a transparent body which transmits visible light or an opaque body which does not transmit visible light is used for the substrate 12, either an inorganic material or an organic material may be used as a material constituting the substrate 12, or may be combination of these materials.

Specifically, as a material constituting the substrate 12, quartz glass, non-alkali glass, alkali glass such as soda-lime glass, various types of glass such as super white glass, transparent inorganic mineral such as mica, and the like are included as an inorganic material of the transparent body, and metal such as aluminum, nickel, and stainless steel, various types of ceramics and the like are included as an inorganic material of the opaque body. As an organic material, a resin film such as cycloolefin-based film and polyester-based film, a fiber-reinforced plastic material which is formed by mixing microfiber such as cellulose nanofiber into the resin film, and the like are included. Both the transparent body and the opaque body are usable regarding an organic material.

Further, a structure in which the plurality of convex portions 12b are arrayed periodically and two-dimensionally (hereinafter, "structure in which arrayed periodically and two-dimensionally" should be appropriately referred to as a "two-dimensional lattice structure") is provided on a surface 12a on a side of the substrate 12 where the anode conductive layer 14 is stacked.

By sequentially stacking the reflective layer 22, the anode conductive layer 14, the organic EL layer 16, and the cathode conductive layer 18 on the substrate 12 on which the two-dimensional lattice structure is formed, a two-dimensional lattice structure by a plurality of convex portions similar to the surface 12a of the substrate 12 is formed on the surface of each layer (namely, a surface on the opposite side of a side where the substrate 12 is positioned).

Further, an inverted structure of the structure formed on the surface 12a of the substrate 12, in other words, a structure in which a plurality of concave portions are periodically arrayed, that is, the two-dimensional lattice structure by a plurality of concave portions is formed on the rear surface (namely, a surface on a side where the substrate 12 is positioned) of each layer which constitutes the organic light emitting diode 10.

Specifically, when attention is paid to the metal layer 18-1, a two-dimensional lattice structure equivalent to the plurality of convex portions 12b formed on the surface 12a of the substrate 12 is formed on a surface 18-1a of the metal layer 18-1 (namely, a surface on a side where the transparent conductive layer 18-2 is positioned) and a plurality of convex portions are formed. On the other hand, an inverted structure of the structure formed on the surface 12a of the substrate 12, in other words, a structure in which the plurality of concave portions 18b are arrayed periodically and two-dimensionally, that is, a two-dimensional lattice structure by the plurality of concave portions 18b is formed on a rear surface 18-1c of the metal layer 18-1 (namely, a surface on a side where the organic EL layer 16 is positioned and a rear surface 18a of the cathode conductive layer 18).

By providing such a two-dimensional lattice structures, surface plasmon excited on the metal layer 18-1 in the cathode conductive layer 18 is extracted as propagation light.

When light is emitted from light emitting molecules on the light emitting layer 16-3, near field light is generated in the immediate vicinity. The near field light is converted into propagation-type surface plasmon on the surface 18-1a and the rear surface 18-1c of the metal layer 18-1 because a distance between the light emitting layer 16-3 and the metal layer 18-1 is extremely close.

In such propagation-type surface plasmon on a metal surface, compressional wave of free electrons generated by incident electromagnetic wave (near field light, etc.) is accompanied by a surface electromagnetic field. In the case of surface plasmon which exists on a flat metal surface, a dispersion curve of the surface plasmon and a dispersion straight line of light (space propagating light) do not cross with each other, energy of surface plasmon cannot be extracted as light. On the contrary, when a lattice structure is formed on the metal surface, the dispersion curve of surface plasmon diffracted by the lattice structure crosses with the dispersion curve of space propagating light, and surface plasmon can be extracted as radiant light.

As described, by providing the two-dimensional lattice structures, energy of light lost as surface plasmon is extracted. The energy extracted in this manner is radiated as radiant light from the metal layer 18-1 in the cathode conductive layer 18.

At this point, the light radiated from the metal layer 18-1 has high directivity, and its major part travels to a surface 18c of the cathode conductive layer 18 being a light extraction surface (namely, a surface of the transparent conductive layer 18-2 on the opposite side of a side where the metal layer 18-1 is positioned) when design is appropriately done. Therefore, in the organic light emitting diode 10, high-intensity light is emitted from a light extraction surface, and light extraction efficiency improves.

In such a two-dimensional lattice structure, when attention is paid to the cathode conductive layer 18 for example, by allowing the concave portions 18b formed on the rear surface 18a (namely, the rear surface 18-1c of the metal layer 18-1) to be two-dimensionally arrayed, extraction efficiency is made higher than the one-dimensional case (namely, array direction is in one direction, and is a structure in which a plurality of grooves are arranged in one direction in a row for example).

A preferable specific example of such two-dimensional lattice structures includes a structure whose array directions are in 2 directions and its crossing angle is at 90° (rectangular lattice), a structure whose array directions are in 3 directions and its crossing angle is at 60° (triangular lattice (also called as hexagonal lattice)) and the like, and the triangular lattice structure is particularly desirable. This is because the more the array directions become, the larger the conditions for obtaining diffracted light become, and surface plasmon can be diffracted highly efficiently.

In order to form the triangular lattice structure in such two-dimensional lattice structures, a particle single layer film which employs a hexagonal close-packing arrangement in which particles are two-dimensional is formed, and dry etching is performed by using the particle single layer film as an etching mask, by which the structure can be easily acquired. Now, a method for forming the triangular lattice structure by such a particle single layer film will be described later.

Herein, a depth D1 of the concave portions 18b formed on the rear surface 18a should be 15 nm≤D1≤180 nm, 30 nm≤D1≤100 nm is preferable, and improvement effect of light extraction efficiency becomes insufficient when D1<15 nm or D1>180 nm.

The range of the depth D1 of the above-described concave portions 18b is based on the reason below.

Specifically, if the depth D1 of the concave portions 18b is less than 15 nm (namely, when D1<15 nm), diffracted wave of surface plasmon sufficient as the two-dimensional lattice structure cannot be created, effect of extracting surface plasmon as radiant light reduces.

Further, if the depth D1 of the concave portions 18b exceeds 180 nm (namely, when D1>180 nm), surface plasmon begins to take localized-type quality and less propagation type quality, so that radiant light extraction efficiency reduces. Moreover in this case, in sequentially stacking the reflective layer 22, the anode conductive layer 14, the organic EL layer 16, and the cathode conductive layer 18 of the organic light emitting diode 10, possibility of causing short circuit between the anode conductive layer 14 and the cathode conductive layer 18 becomes higher because unevenness is steep, which is not preferable.

Since the depth D1 of the concave portions 18b is made equal to a height H1 of the convex portions 12b formed on the surface 12a of the substrate 12, it can be quantitated by measuring the height of the convex portions 12b indirectly by the AFM.

For example, an AFM image is acquired for one region of 5 μm×5 μm randomly selected in the two-dimensional lattice structure first. Then, a line is drawn in a diagonal line direction of the acquired AFM image, and the maximum heights of the convex portions 12b which crossed the line are individually calculated. After that, an average value of the calculated heights of the convex portions 12b is calculated. Such processing is similarly executed to randomly selected 25 regions in total of 5 μm×5 μm, an average value of the convex portions 12b in each region is calculated, a value obtained by further averaging obtained average values for 25 regions should be the height of the convex portions 12b.

A shape of the convex portions 12b is not particularly limited, and includes a columnar shape, a cone shape, a truncated cone shape, a sinewave shape, a dome shape, a derived shape based on these shapes and the like for example.

Next, a manufacturing method of the organic light emitting diode 10 will be explained. Firstly, although the manufacturing method of the organic light emitting diode 10 is not particularly limited, the reflective layer 22, the anode conductive layer 14, the organic EL layer 16 (the hole injection layer 16-1, the hole transport layer 16-2, the light emitting layer 16-3, the electron transport layer 16-4, the electron injection layer 16-5), and the cathode conductive layer 18 (the metal layer 18-1, the transparent conductive layer 18-2) are sequentially stacked on the surface 12a of the substrate 12, in which the plurality of convex portions 12b are formed on the surface 12a in a two-dimensional lattice structure, preferably.

Figure 3A:
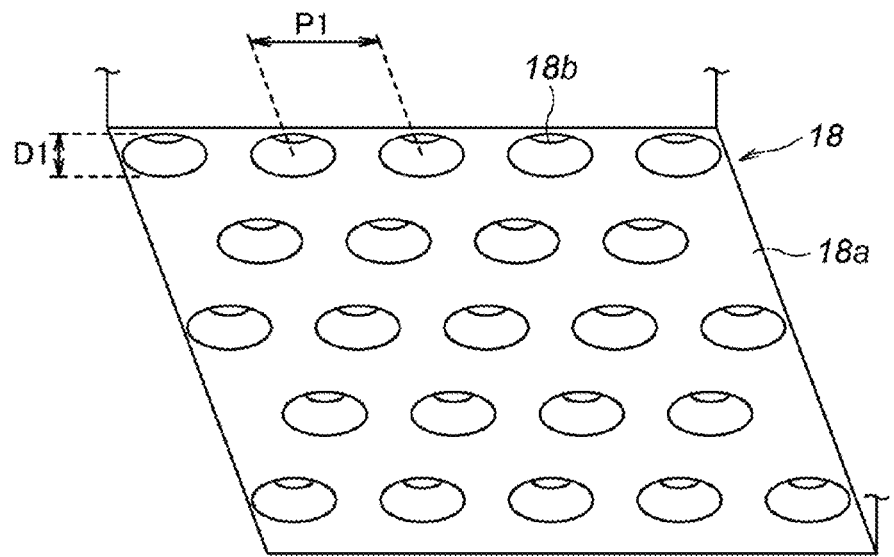
FIG. 3 (a) is a schematic constitution perspective explanatory view showing a fine uneven structure formed on a rear surface of a cathode conductive layer in the organic light emitting diode of FIG. 2, and FIG. 3 (b) is a schematic constitution perspective explanatory view showing a fine uneven structure formed on the surface of a substrate of the organic light emitting diode of FIG. 2.
Figure 3B:
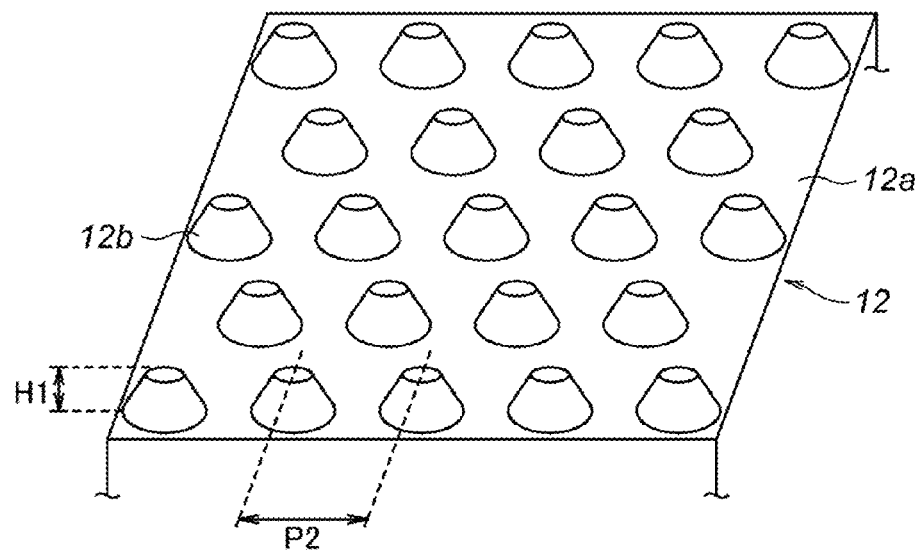

In this case, the two-dimensional lattice structure by the plurality of concave portions 18b formed on the rear surface 18a of the cathode conductive layer 18 (namely, the rear surface 18-1c of the metal layer 18-1) corresponds to the two-dimensional lattice structure by the plurality of convex portions 12b formed on the surface 12a of the substrate 12 (refer to FIGS. 3 (a)(b)).

Specifically, a center-to-center distance P1 of adjacent concave portions 18b in the plurality of concave portions 18b formed on the rear surface 18a of the cathode conductive layer (hereinafter, "center-to-center distance P1 between adjacent concave portions 18b" should be referred to as "center-to-center distance P1 of the concave portions 18b") matches a center-to-center distance P2 between adjacent convex portions 12b in the plurality of convex portions 12b formed on the surface 12a of the substrate 12 (hereinafter, "center-to-center distance P2 between adjacent convex portions 12b" should be referred to as "center-to-center distance P2 of the convex portion 12b"), and the depth D1 of the concave portions 18b matches the height H1 of the convex portion 12b.

For this reason, by measuring the center-to-center distance P2 of the convex portions 12b formed on the surface 12a of the substrate 12 and the height H1 of the convex portions 12b, the center-to-center distance P1 of the concave portions 18b formed on the rear surface 18a of the cathode conductive layer 18 and the depth D1 of the concave portions 18b can be measured.

It is to be noted that the center-to-center distance P1 of such concave portions 18b can be indirectly measured by measuring the center-to-center distance P2 of the convex portions 12b by a laser diffraction method, and the depth D1 of the concave portions 18b can be indirectly measured by measuring the height H1 of the convex portions 12b by the AFM.

Hereinafter, the manufacturing method of the organic light emitting diode 10 will be further explained in detail.

Firstly, electrons beam lithography, mechanical cutting processing, laser processing, two-beam interference exposure, reduction exposure or the like for example can be used for a fabricating method for the two-dimensional lattice structure by the plurality of convex portions 12b formed on the surface 12a of the substrate 12. Further, if a master is fabricated in advance, transfer/copy of a fine uneven structure by a nanoimprint method is also possible.

Out of such techniques, techniques other than the two-beam interference exposure and the nanoimprint method are not suitable for fabricating the periodic lattice structure in a large area, they are subject to limitation of area in an industrial usage.

Further, although the two-beam interference exposure is capable of fabricating a certain degree of small area, in the case of a large area whose one side is several cm or more, it is extremely difficult to fabricate a uniform and precise periodic lattice structure affected by various external disturbance factor to the entire optical setup such as vibration, wind, heat shrinkage, expansion, air fluctuation, and voltage fluctuation.

Then, as a fabricating method for the two-dimensional lattice structure by the plurality of convex portions 12b formed on the surface 12a of the substrate 12 in the organic light emitting diode 10, a dry etching method using a particle single layer film as an etching mask (hereinafter, "method for performing dry etching by using a particle single layer film as an etching mask" should be referred to as "etching method using a particle single layer film") is preferable.

This method is a method utilizing the fact that a two-dimensional close-packing lattice in which control of a particle gap is highly accurately performed is obtained by fabricating a single layer film of particles, which have a primary particle diameter of light emission wavelength or less, on the surface 12a of the substrate 12 by using the principle of Langmuir-Blodgett method (hereinafter, appropriately referred to as "LB method"), and such a method is disclosed in the above-described Patent Document 4 for example.

Since particles are two-dimensionally closely packed in the particle single layer film, by performing dry etching to the surface of a substrate original plate (namely, the substrate 12 before forming the two-dimensional lattice structure) by using the film as an etching mask, a highly accurate two-dimensional lattice structure of a triangular lattice (hexagonal lattice) shape can be formed.

Since the two-dimensional lattice structure of the rear surface 18a of the cathode conductive layer 18 which is formed by using a substrate having such a two-dimensional lattice structure is also similarly highly accurately, diffracted wave of surface plasmon can be obtained highly efficiently by using such a method even in the case of a large area, and a high-intensity organic light emitting diode 10 in which light extraction efficiency is improved can be obtained.

In the etching method using the particle single layer film, by performing a coating process in which the surface of the substrate original plate is coated by the particle single layer film and a process in which dry etching is performed to the substrate original plate by using the particle single layer film as an etching mask (dry etching process), the two-dimensional lattice structure by the plurality of convex portions 12b are formed on the substrate 12.

Hereinafter, the above-described coating process and dry etching process will be explained in detail.

(1-2) Coating Process

A coating process in which the surface of the substrate original plate is coated by the particle single layer film is implemented by performing a particle single layer film forming process in which liquid for developing particles on a liquid surface of a trough (hereinafter, "liquid for developing particles on the liquid surface" is appropriately referred to as "lower layer solution") is input into the trough, dispersion in which particles are dispersed in organic solvent is dripped on the liquid surface of the lower layer solution, the organic solvent is volatilized from the dripped dispersion, and a particle single layer film made of particles is formed on the liquid surface of the lower layer solution, and a transfer process in which the particle single layer film is transferred onto the substrate 12.

Now, in the explanation below, a case where hydrophilic liquid is used as the lower layer solution and hydrophobic organic solvent and particles in the dispersion are used will be explained. It is to be noted that hydrophobic liquid may be used as the lower layer solution, and in such a case, hydrophilic particles are used.

(1-2-1) Particle Single Layer Film Forming Process

In this process, firstly, dispersion is prepared by adding particles whose surface is hydrophobic to highly volatile and highly hydrophobic organic solvent (chloroform, methanol, ethanol, methyl ethyl ketone, methyl isobutyl ketone, hexane, etc., for example). Further, a trough is prepared, and water as the lower layer solution (hereinafter, water as the lower layer solution is appropriately referred to as "lower layer water") is input to the trough.

Then, as the prepared dispersion is dripped onto the liquid surface of the lower layer water pooled in the trough, particles in the dispersion develop on the liquid surface of the lower layer water by a dispersion medium. After that, organic solvent being the dispersion medium is volatilized, by which a particle single layer film in which particles are two-dimensionally close-packed is formed.

It is to be noted that a particle diameter of particles used in forming the particle single layer film is set taking the center-to-center distance P2 of the convex portions 12b which are to be formed in consideration. Specifically, the center-to-center distance P2 of the convex portions 12b formed on the surface 12a of the substrate 12 is decided by a particle diameter of particles to be used, and the center-to-center distance P1 of the concave portions 18b is decided based on the decision of the center-to-center distance P2 of the convex portions 12b.

Herein, a deciding method for a particle diameter of particles which form the particle single layer film will be explained referring to FIG. 4.

The particle diameter of particles which form the particle single layer film is calculated from a different lattice pitch by a surface plasmon mode which needs to be extracted (namely, the center-to-center distance P1 of the concave portions 18b, which corresponds to the center-to-center distance P2 of the convex portions 12a).

Firstly, a conventionally publicly known top emission-type organic light emitting diode having no unevenness is considered. In this element, various thin film layers are stacked on a substrate. To avoid influence of surface plasmon on a reflection metal layer interface, the reflection metal layer and layers closer to a substrate side are ignored in calculation, and calculation should be performed to a layer constitution including air above an anode conductive layer.

Figure 4:
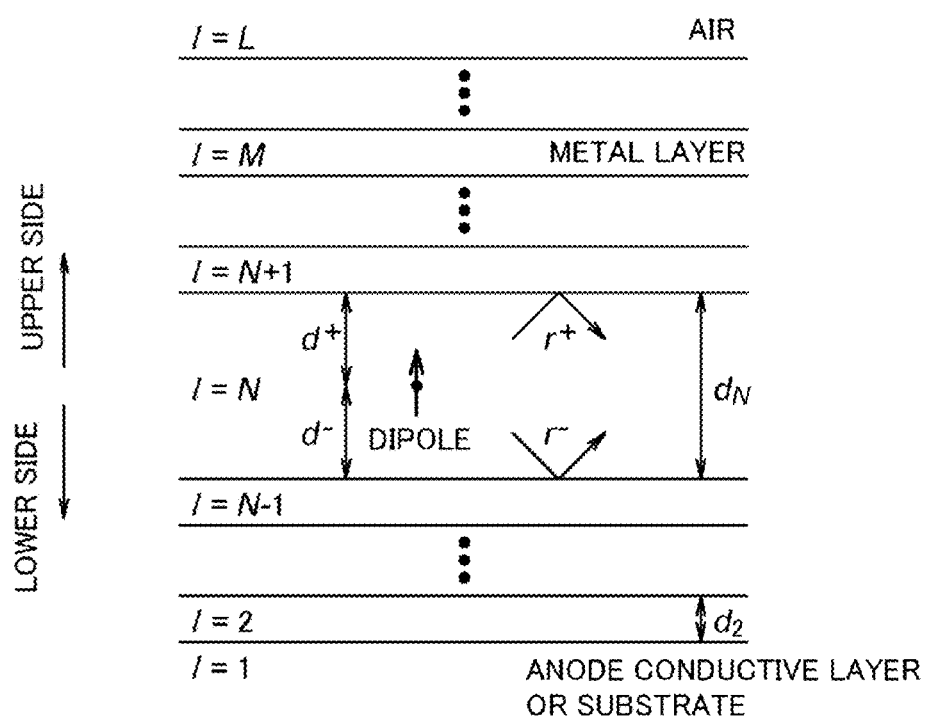
FIG. 4 is an explanatory view showing a dipole in a layer constitution of the organic light emitting diode.

As shown in FIG. 4, assuming that from the anode conductive layer to air consist of L layers, a first layer is the anode conductive layer, and an L-th layer is air. It is assumed that the thickness of an l-th layer is $d_l$, and its dielectric constant is given by $\in_l$. $d_l$ and $d_L$ being the thickness of the first layer and the thickness of the L-th layer respectively are infinite.

Herein, an M-th layer is a metal layer carrying surface plasmon, and a propagation constant of surface plasmon propagating interfaces on both sides of the layer is found first.

There are two surface plasmon modes propagating the interfaces of the metal layer. One is a mode in which energy concentrates mainly on an interface between an (M−1)th layer and an M-th layer, and the other one is a mode in which energy concentrates mainly on an interface between the M-th layer and an (M+1)th layer. Hereinafter, the former should be referred to as an $M_-$ mode, and the latter should be referred to as an $M_+$ mode. Propagation constants of these two modes are obtained by solving a proper equation of a system.

Generally, the proper equation cannot be solved, but only has to be solved numerically by using a non-linear optimization technique. This the calculation becomes more difficult as the total number of parameters increases. The propagation constant of surface plasmon is a complex number, and the above-described proper equation accurately gives the complex propagation constant. However, what is required in order to determine a lattice pitch P is only a real part of the propagation constant, and a simplified method is applicable in this case.

Propagation modes (surface plasmon mode and waveguide mode) that a layer structure has are characterized by a propagation constant. The propagation constant relates to a component parallel with an interface of wave numbers of the propagation modes (hereinafter, referred to as in-plane wave number).

Energy of a vibrational dipole placed in the layer structure dissipates into each of these modes. Therefore, what mode the layer structure has is found out by checking in-plane wave number dependency of dissipation energy from the dipole.

FIG. 4 shows an explanatory view showing the layer structure of an organic light emitting diode and a dipole in the layer structure. In FIG. 4, the dipole is placed in an l=N layer. $d^-$ and $d^+$ respectively shows a distance from the dipole to the substrate side interface and a distance to the metal side interface.

A specific calculation procedure is as follows.

Firstly, one dipole is placed perpendicularly to on an (M−1)/M interface at a distance approximately 20 nm closer to a substrate side from the interface. It is necessary that a layer on which the dipole is placed does not have absorption at a desired extraction angular frequency ω. It is assumed that a moment of the dipole is µ and the dipole vibrates at the extraction angular frequency ω. Assuming that the dipole is in the N-th layer, a distance from the dipole to an (N−1)/N interface be $d^-$, and a thickness of an N layer be $d_N$, a distance to an N/(N+1) interface is $d^+=d_N-d^-$.

An in-plane wave number ($k_{//}$) dependency of energy dissipation of the dipole is given by Mathematical Formula (5) below.

[Mathematical Formula 5]

$$W_-(k_{//}) = \frac{\omega\mu^2}{8\pi\varepsilon_N}\text{Re}\left[\frac{k_{//}^3}{k_z} \cdot \frac{[1+r^+\exp(2ik_zd^+)][1+r^-\exp(2ik_zd^-)]}{1-r^+r^-\exp(2ik_zd^+d^-)}\right] \quad (5)$$

Herein, $r^-$ denotes a reflection coefficient (amplitude reflectance) to a magnetic field of p polarization having the in-plane wave number $k_{//}$ on the (N−1)/N interface seen from the N layer side, $r^+$ denotes a reflection coefficient to the magnetic field of p polarization having the in-plane wave number $k_{//}$ on the N/(N+1) interface seen from the N layer side (refer to FIG. 4). Needless to say, these reflection coefficients include influence of the substrate or all layers to air. Further, $k_{//}^2+k_z^2=\in_N(\omega/c)^2$ holds. Herein, c denotes the velocity of light in vacuum.

A maximum of $W_-(k_{//})$ corresponds to each propagation mode, and an in-plane wave number giving the maximum is a real part of the propagation constant in the mode.

Next, the dipole is placed at a distance approximately 20 nm closer to an air side from the M/(M+1) interface, and the same calculation is performed. Energy dissipation $W_+(k_{//})$ obtained by the calculation has a maximum at the same position as $W_-(k_{//})$. However, their maximum values are different.

Two modes from a largest wave number out of the maximums correspond to the surface plasmon mode. The maximum values of energy dissipation in the in-plane wave numbers giving the two maximums are different between $W_-$ and $W_+$.

Assuming that an in-plane wave number showing a larger maximum value in $W_-$ be $k_-$ and an in-plane wave number showing a larger maximum value in $W_+$ be $k_+$, $k_-$ is a propagation constant of $M_-$ mode and $k_+$ is a propagation constant of $M_+$ mode.

The lattice pitch P (namely, the center-to-center distance P1 of the concave portions 18b, which corresponds to the center-to-center distance P2 of the convex portions 12a) is given by a different mathematical formula depending on a surface plasmon mode which needs to be extracted.

Specifically, a lattice pitch $P_0$ is given by Mathematical Formula (6) below in the case of forming a triangular lattice structure as a two-dimensional lattice structure.

[Mathematical Formula 6]

$$P_{0\pm} = \frac{4\pi}{\sqrt{3}\,k_\pm} \quad (6)$$

Further, the lattice pitch $P_0$ is given by Mathematical Formula (7) below in the case of forming a rectangular lattice structure as a two-dimensional lattice structure.

[Mathematical Formula 7]

$$P_{0\pm} = \frac{2\pi}{k_\pm} \quad (7)$$

It is to be noted that the lattice pitch P given by the above-described Mathematical Formula (6) and Mathematical Formula (7) and the particle diameter of particles (namely, a diameter) D become equal.

Specifically, a surface plasmon mode to be extracted becomes different between the case of forming the triangular lattice structure as a two-dimensional lattice structure and the case of taking the rectangular lattice structure. In the case where the triangular lattice structure was fabricated by the lattice pitch $P_0$ which satisfies the above-described Mathematical Formula (6) and the case where the rectangular lattice structure was fabricated by the lattice pitch $P_0$ which satisfies the above-described Mathematical Formula (7), the energy of surface plasmon can be extracted as light.

However, any light emitting material has a width in a value in its emission spectrum as full width at half maximum, the lattice pitch P should have a fluctuation allowable value of a range given in Mathematical Formula (1) below so as to correspond to such a width.

[Mathematical Formula 1]

$$0.8P_0 \leq P \leq 1.2P_0 \quad (1)$$

From Mathematical Formula (6), Mathematical Formula (7) and Mathematical Formula (1) given in this manner, the particle diameter of particles for forming the particle single layer film is calculated in an etching method using a particle single layer film. It is to be noted that such an etching method using a particle single layer film can be fabricated only in the case of forming the triangular lattice structure as a two-dimensional lattice structure.

Figure 5:
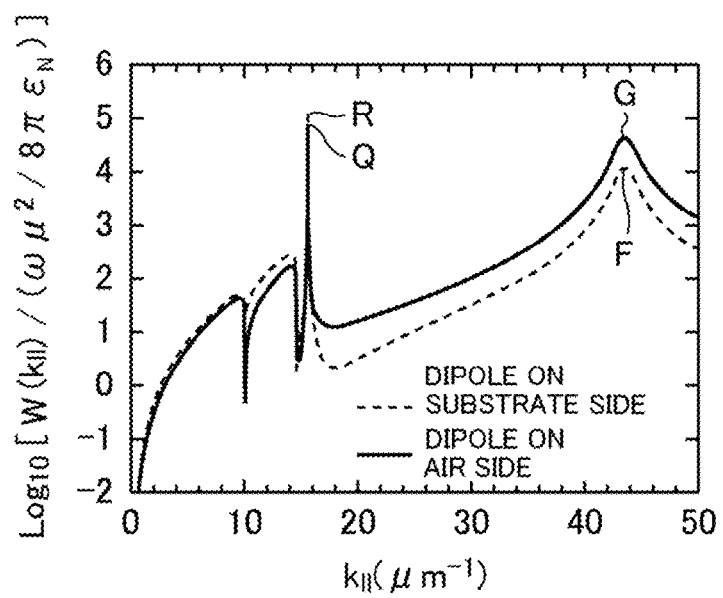
FIG. 5 is a graph showing energy dissipation when the dipole is placed at a distance 20 nm closer to a substrate side from a rear surface of a metal layer of the organic light emitting diode and energy dissipation when the dipole is placed at a distance 20 nm closer to an air side from the rear surface of the metal layer of the organic light emitting diode.

Specifically, when the organic light emitting diode 10 is made in IZO (corresponds to the anode conductive layer 14)/2-TNATA [film thickness 30 nm] (corresponds to the hole injection layer 16-1)/NPD [film thickness 70 nm] (corresponds to the hole transport layer 16-2)/PH-1 doped with Ir(piq)$_3$ at concentration of 5% [film thickness 30 nm] (corresponds to the light emitting layer 16-3)/Alq$_3$ [film thickness 30 nm] (corresponds to the electron transport layer 16-4)/Ag [film thickness 10 nm] (corresponds to the metal layer 18-1)/IZO [film thickness 110 nm] (corresponds to the transparent conductive layer 18-2)/Air from the reflective layer 22 side formed on the substrate 12, it indicates the energy dissipation as shown in FIG. 5.

In FIG. 5, a dashed line shows energy dissipation when the dipole is placed at a distance 20 nm closer to the substrate side from the rear surface 18-1c of the metal layer 18-1 (namely, the rear surface 18a of the cathode conductive layer 18). On the other hand, a solid line shows energy dissipation when the dipole is placed at a distance 20 nm closer to the air side from the surface 18-1a of the metal layer 18-1.

In the case where the dipole is placed either on the substrate side or the air side, peaks are recognized severally at the positions of the in-plane wave number of $k_{//}$=15.6 μm$^{-1}$ and $k_{//}$=43.6 μm$^{-1}$. These peaks correspond to the surface plasmon modes.

In the height of the peaks of $k_{//}$=15.6 μm$^{-1}$, a peak R ($\text{Log}_{10}$ $[W(k_{//})/(\omega\mu^2/8\pi\in_N)]$=5.0507) in the case where the dipole is placed on the substrate side is higher compared to a peak Q ($\text{Log}_{10}$ $[W(k_{//})/(\omega\mu^2/8\pi\in_N)]$=4.8804) in the case where the dipole is placed on the air side. In the peaks of $k_{//}$=43.6 μm$^{-1}$, their heights become opposite, in which a peak F ($\text{Log}_{10}$ $[W(k_{//})/(\omega\mu^2/8\pi\in_N)]$=4.0663) in the case where the dipole is placed on the substrate side is lower compared to a peak G ($\text{Log}_{10}$ $[W(k_{11})/(\omega\mu^2/8\pi\in_N)]$=4.6284) in the case where the dipole is placed on the air side.

This indicates that the former ($k_{//}$=15.6 μm$^{-1}$) is a surface plasmon mode in which energy concentrates on the rear surface 18-1c of the metal layer 18-1 (the rear surface 18a of the cathode conductive layer 18), and the latter ($k_{//}$=43.6 μm$^{-1}$) is a surface plasmon mode in which energy concentrates on the surface 18-1a of the metal layer 18-1 (namely, a surface of a side where the transparent conductive layer 18-2 is positioned).

Specifically, $k_-$=15.6 μm$^{-1}$ holds, $k_+$=43.6 μm$^{-1}$ holds, and the particle diameter of particles is calculated from the above-described Mathematical Formula (6), Mathematical Formula (7) and Mathematical Formula (1) by using the propagation constants.

It is preferable that such particles have a coefficient of variation in a particle diameter (namely, a value obtained by dividing a standard deviation by an average value) at 15% or less, 10% or less is more preferable, and 5% or less is further preferable.

When particle having a small coefficient of variation in the particle diameter and small variation in the particle diameter are used, a defect area where particles do not exist becomes hard to occur in the particle single layer film to be formed, and a particle single layer film of small array misalignment can be formed.

When such an array misalignment of the particle single layer film is small, misalignment of array in the two-dimensional lattice structure which is finally formed on the rear surface 18a of the cathode conductive layer 18 (the rear surface 18-1c of the metal layer 18-1) also becomes smaller. Then, the smaller the misalignment of the two-dimensional lattice structure becomes, the more efficiently surface plasmon resonance is converted into light on the metal layer 18-1 in the cathode conductive layer 18, which is preferable.

Next, particle materials which constitute the particle single layer film will be explained. As particle materials which constitute the particle single layer film, metal such as Al, Au, Ti, Pt, Ag, Cu, Cr, Fe, Ni and Si, metal oxide such as SiO$_2$, Al$_2$O$_3$, TiO$_2$, MgO$_2$ and CaO$_2$, organic polymer such as polystyrene and polymethyl methacrylate, other semiconductor materials, inorganic polymer and the like are included for example. Anyone type of the materials may be used alone, or two types or more may be used in combination.

Based on a lattice pitch which needs to be acquired, the particle diameter of the particles can be calculated from the above-described Mathematical Formula (6) or the like.

Particles whose surface is hydrophobic are preferable in the case of using water (or hydrophilic liquid) as lower layer solution. When the surface of particles is hydrophobic, water is used as lower layer solution and the particle single layer film can be easily formed and the particle single layer film can be easily transferred on the substrate 12 in developing dispersion of particles on the liquid surface of the lower layer solution in the trough and forming the particle single layer film.

Out of the particle materials shown above, a particle material of organic polymer such as polystyrene can be directly used because its surface is hydrophobic, but a particle material of metal or metal oxide can be used by making its surface hydrophobic by hydrophobic agent. As such a hydrophobic agent, surfactant, alkoxysilane and the like are included.

A method for using surfactant as hydrophobic agent is effective for making a wide range of materials hydrophobic, and is suitable for particle materials such as metal and metal oxide.

As such a surfactant, cationic surfactant such as hexadecyltrimethyl ammonium bromide and decyltrimethyl ammonium bromide, or anionic surfactant such as sodium dodecyl sulfate and sodium 4-octylbenzenesulfonate can be used. Moreover, alkanethiol, disulphide compound, tetradecanoic acid, octadecanoic acid or the like can be also used.

Hydrophobic processing using such a surfactant may be performed in liquid such as organic solvent and water by dispersing particles in the liquid, or may be performed to particles in a dry state.

In the case of performing hydrophobic processing in the liquid, particles to be hydrophobized are added and dispersed into volatile organic solvent which consists of at least one type of chloroform, ethanol, methanol, isopropanol, methyl ethyl ketone, ethyl ethyl ketone, toluene, n-hexane, cyclohexane, ethyl acetate, butyl acetate or the like for example, and then surfactant may be mixed and dispersion is further performed. The surface of particles can be hydrophobized more uniformly when surfactant is added after dispersing particles in this manner.

Such dispersion after hydrophobic processing can be directly used as dispersion for dripping onto the liquid surface of the lower layer water.

In the case where particles to be hydrophobized are in the state of water dispersion, a method in which after adding surfactant to the water dispersion and conducting hydrophobic processing of a particle surface in a water phase, organic solvent is added and hydrophobized particles are extracted in an oil phase is also effective. The dispersion obtained in this manner (namely, dispersion in which particles are dispersed in organic solvent) can be directly used as dispersion for dripping onto the liquid surface of the lower layer water.

Now, in order to enhance particle dispersibility of the dispersion, a type of organic solvent and a type of surfactant are appropriately selected and combined. Use of dispersion having high particle dispersibility can prevent particles from aggregating, and a particle single layer film in which each particle is highly accurately two-dimensionally close-packed can be easily obtained.

For example, in the case where chloroform is selected as organic solvent, it is preferable to use decyltrimethyl ammonium bromide as surfactant. Combination of organic solvent and surfactant for enhancing particle dispersibility of such dispersion includes ethanol and sodium dodecyl sulfate, methanol and sodium 4-octylbenzenesulfonate, methyl ethyl ketone and octadecanoic acid, and the like.

Regarding a ratio between particles to be hydrophobized and surfactant, the range of 1/3 to 1/15 times the mass of surfactant to the mass of particles to be hydrophobized is preferable.

Further, in such hydrophobic processing, stirring the dispersion during processing or performing ultrasonic wave irradiation to the dispersion is also effective on the point of improving particle dispersibility.

A method using alkoxysilane as a hydrophobic agent is effective in hydrophobizing a particle material such as Si, Fe and Al or a particle material such as $SiO_2$, $Al_2O_3$ and $TiO_2$. Now, not limited to these particle materials, the method is basically applicable to any particle material as long as particles have a hydroxyl group or the like on a surface. As alkoxysilane, monomethyltrimethoxysilane, monomethyltriethoxysilane, dimethyldiethoxysilanephenyl triethoxysilane, hexyltrimethoxysilane, decyltrimethoxysilane, vinyltrichlorosilane, vinyltrimethoxysilane, vinyltriethoxysilane, 2-(3,4-epoxycyclohexil)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2(aminoethyl)3-aminopropylmethyldimethoxysilane, N-2(aminoethyl)3-aminopropyltrimethoxysilane, N-2(aminoethyl)3-aminopropyltriethoxysilane, N-phenyl-3-aminopropyltrimethoxysilane, 3-ureidopropyltriethoxysilane, 3-chloropropyltrimethoxysilane, 3-mercaptopropylmethyldimethoxysilane, 3-mercaptopropyltrimethoxysilane, 3-isocyanatepropyltriethoxysilane, and the like are included.

In the case of using alkoxysilane as hydrophobic agent, an alkoxysilyl group in alkoxysilane is hydrolyzed into a silanol group, the silanol group is dehydrated and condensed with the hydroxyl group on the particle surface, by which hydrophobization is performed. Therefore, it is desirable that hydrophobization using alkoxysilane be performed in the water.

Thus, in the case of performing hydrophobization in the water, it is preferable to stabilize a dispersed state of particles before hydrophobization by using dispersant such as surfactant in combination for example. It is to be noted that combination of dispersant and alkoxysilane is appropriately selected because hydrophobic effect of alkoxysilane could be reduced depending on a type of dispersant.

As a specific method for hydrophobizing by alkoxysilane, particles are dispersed in the water in advance first, the dispersed particles and alkoxysilane-containing aqueous solution (namely, aqueous solution containing hydrolysate of alkoxysilane) are mixed, and reacted for predetermined time, preferably 6 to 12 hours while appropriately stirring in the range from room temperature to 40° C.

Reaction properly advances by performing reaction in such conditions, dispersion of particles sufficiently hydrophobized can be acquired. At this point, if reaction excessively advances, silanol groups are reacted with each other to make particles combine, particle dispersibility of the dispersion reduces, and a particle single layer film to be obtained is prone to be 2 layers or more in which particles partially aggregate into a cluster state. On the other hand, if reaction is insufficient, hydrophobization of a particle surface also becomes insufficient, a particle single layer film to be obtained is prone to have a widened pitch between particles.

Further, alkoxysilane other than amine-based hydrolyzes under acid or alkaline condition, pH of the dispersion needs to be adjusted to acidity or alkalinity during reaction. Although an adjusting method of pH is not limited, a method for adding acetic acid aqueous solution with the concentration from 0.1 to 2.0% by mass is preferable because stabilizing effect of silanol group is obtained other than hydrolysis promotion.

Regarding a ratio between particles to be hydrophobized and alkoxysilane, the range of 1/10 to 1/100 times the mass of alkoxysilane to the mass of particles to be hydrophobized is preferable.

After reaction for predetermined time, one type or more out of the above-described volatile organic solvent are added to the dispersion, and particles hydrophobized in the water is extracted in an oil phase. On this occasion, a preferable volume of organic solvent to be added to the dispersion before adding organic solvent is the range of 0.3 to 3 times.

The dispersion obtained in this manner (namely, dispersion in which particles are dispersed in organic solvent) can be directly used as dispersion for dripping onto the liquid surface of the lower layer water.

Now in such hydrophobic processing, in order to enhance particle dispersibility of dispersion during processing, it is preferable to execute stirring, ultrasonic wave irradiation or the like, increasing of particle dispersibility of dispersion can prevent particles from aggregating in a cluster state, and a particle single layer film in which each particle is highly accurately two-dimensionally close-packed is easily acquired.

It is preferable to make the concentration of particles of dispersion to 1 to 10% by mass, and it is preferable to make a drip rate of dispersion to the lower layer water to 0.001 to 0.01 ml/second.

When the concentration and the drip amount of particles in the dispersion are in the range as described above, tendency such that particles partially aggregate into 2 layers or more, a defect area where particles do not exist occurs, and pitch between particles widens is suppressed, and a particle single layer film in which each particle is highly accurately two-dimensionally close-packed is easily acquired.

It is preferable to execute the particle single layer film forming process under the condition of ultrasonic wave irradiation. When the particle single layer film forming process is performed while irradiating ultrasonic wave from the lower layer water toward a liquid surface, close-packing of particles is promoted, and a particle single layer film in which each particle is highly accurately two-dimensionally close-packed can be acquired.

On this occasion, 1 to 1200 W of an output of ultrasonic wave, is preferable, and 50 to 600 W is more preferable. Further, although frequency of ultrasonic wave is not particularly limited, 28 kHz to 5 MHz is preferable, and 700 kHz to 2 MHz is more preferable.

Generally, if frequency is too high, energy absorption of water molecule begins, and a phenomenon of rising steam or water droplets from a water surface occurs, which is not preferable. Further, if frequency is too low generally, a cavitation radius in the lower layer water becomes larger, and bubbles are generated in the water and float toward the water surface. If such bubbles are accumulated under the particle single layer film formed on the liquid surface of the lower layer water, flatness of the liquid surface of the lower layer water is lost, and an appropriate particle single layer film cannot be formed.

Further, ordinary wave is generated on the liquid surface of the lower layer water by ultrasonic wave irradiation. At any frequency, when an output is too large or a wave height of the liquid surface becomes too high due to a tuning condition of a ultrasonic transducer and an oscillator, there is a possibility that the particle single layer film is broken on the liquid surface.

Under such circumstances, when the frequency of ultrasonic wave is appropriately set, close-packing of particles can be promoted effectively without breaking a single particle film being formed. However, in particles having a small particle diameter of 100 nm or less for example, acoustical natural frequency of particles becomes extremely high, so that it becomes difficult to give ultrasonic vibration as expressed in a calculation result.

In this case, when calculation is performed on the assumption that natural vibration corresponding to a mass of particle dimer, trimer, . . . and to about icosamer is given, a necessary frequency can be reduced to a realistic range. A packing ratio improvement effect of particles is expressed even in the case where ultrasonic vibration corresponding to a natural frequency of an aggregate of particles is given.

Irradiation time of ultrasonic wave is acceptable when it is long enough for completing rearrangement of particles, and required time varies depending on a particle diameter, a frequency of ultrasonic wave, temperature of the lower layer water, or the like. However, in general fabricating conditions, it is preferable to perform irradiation for 10 seconds to 60 minutes, and it is more preferable to perform for 3 to 30 minutes.

Advantages obtained by ultrasonic wave irradiation are, other than close-packing of particles (namely, hexagonal close-packing of a random array), an effect of breaking a soft aggregate of particles which easily occurs in preparing dispersion, and a certain degree of restoration effect to a point defect, a line defect, crystal transition or the like which was once generated.

The above-described particle single layer film on the liquid surface of the lower layer water is formed by self-organization of particles. Its principle is that when particles gather, surface tension works due to a dispersion medium which exists between particles, and consequently a two-dimensionally close-packed structure is automatically formed rather than particles randomly exist. Such close-packing by surface tension can be differently expressed as arrangement in lateral directions by capillary force.

Particularly, for example, when three particles having a spherical shape and a highly uniform particle diameter such as colloidal silica gather to contact in a floating state on the liquid surface of the lower layer water, surface tension works so as to make the total sum length of a waterline of a particle group minimum, and the three particles become stabilized in an equilateral triangle-based arrangement.

If the waterline comes at the apex of the particle group, that is, in the case particles submerge under the liquid surface, such self-organization does not occur, and the particle single layer film is not formed. Therefore, in the case where either one of particles and the lower layer water is hydrophobic, it is important to make the other one hydrophilic to prevent the particle group from submerging under the liquid surface of the lower layer water.

It is preferable to use water as the lower layer solution as explained above, and when water is used, relatively large surface free energy works, and close-packed arrangement of particles generated once becomes stably sustained on the liquid surface.

(1-2-2) Transfer Process

In a transfer process, the particle single layer film which was formed on the liquid surface of the lower layer water by the particle single layer film forming process is transferred onto the substrate original plate being an etching object in a single layer state.

A specific method for transferring the particle single layer film onto the substrate original plate is not particularly limited, and a method in which, a hydrophobic substrate original plate is allowed to go down from above and come into contact with the particle single layer film while the plate is kept in a substantially parallel state with the particle single layer film, the particle single layer film is transferred to the substrate original plate by affinity of the particle single layer film and the substrate original plate both of which are hydrophobic, and the particle single layer film is transferred onto the substrate original plate, can be used for example.

More specifically, before forming the particle single layer film, the substrate original plate is arranged previously in the lower layer water of the trough in a substantially horizontal direction, and the particle single layer film is transferred onto the substrate original plate by allowing the liquid surface to go down gradually after the particle single layer film is formed on the liquid surface of the lower layer water.

According to such a method, the particle single layer film can be transferred onto the substrate original plate without using a special apparatus. It is preferable to adopt a so-called LB trough method on the point that even a particle single layer film of a larger area can be easily transferred onto the substrate original plate while its two-dimensional close-packed state is maintained.

In the LB trough method, the substrate original plate is immersed in the lower layer water in the trough in a substantially perpendicular direction to the liquid surface of the lower layer water, the above-described particle single layer film forming process is performed in this state, and the particle single layer film is formed on the liquid surface.

Then, by pulling up the substrate original plate above after the particle single layer film forming process, the particle single layer film formed on the liquid surface of the lower layer water can be transferred onto the substrate original plate.

At this point, the particle single layer film is already formed in the state of a single layer on the liquid surface of the lower layer water by the particle single layer film forming process, so that there is no risk that the particle single layer film is collapsed into multilayers the like even if a temperature condition of the transfer process (namely, temperature of the lower layer water), pull up rate of the substrate original plate, or the like is fluctuated a little.

The temperature of the lower layer water being the temperature condition of the transfer process usually depends on environmental temperature which fluctuates with season or climate, which is about 10 to 30° C.

Further, when an LB trough device including: a surface pressure sensor which uses a Wilhelmy plate or the like, which measures surface pressure of the particle single layer film, as a principle; and a movable barrier which compresses the particle single layer film in a direction along the liquid surface of the lower layer water, is used as a trough on this occasion, the particle single layer film having a larger area can be transferred onto the substrate original plate more stably.

According to such an LB trough device, the particle single layer film can be compressed into a preferable diffusion pressure (density) while the surface pressure of the particle single layer film is measured by the surface pressure sensor, and the film can be moved toward the substrate original plate at constant speed. For this reason, transfer of the particle single layer film from the liquid surface of the lower layer water onto the substrate original plate smoothly advances, and a problem such that only the particle single layer film can be transferred to a small area on the substrate original plate becomes hard to occur.

A preferable diffusion pressure is 5 to 80 mNm$^{-1}$, and more preferably is 10 to 40 mNm$^{-1}$. With such a diffusion pressure, a particle single layer film in which each particle is two-dimensionally close-packed at higher density is easily acquired. Further, 0.5 to 20 mm/minute is preferable as a speed of pulling up the substrate original plate.

By such a transfer process, after the substrate original plate surface is coated by the particle single layer film, fixing processing for fixing the particle single layer film onto the substrate original plate may be further performed as needed.

By fixing the particle single layer film onto the substrate original plate by the fixing processing, possibility that particles move on the substrate original plate in the subsequent dry etching is suppressed, and it becomes possible to perform etching to the substrate original plate surface more stably and highly accurately. Now, as dry etching advances, the particle diameter of each particle becomes gradually smaller, and possibility that particles move on the substrate original plate becomes larger, so that such a fixing process is effective.

As such a fixing processing method, there is a method of using binder or a sintering method. In the method of using binder, binder solution is supplied on the particle single layer film side of the substrate original plate on which the particle single layer film is formed, and the solution is permeated between the particle single layer film and the substrate original plate.

As a usage amount of binder, 0.001 to 0.002 times the mass of the particle single layer film is preferable. In such a range, a problem that binder is clogged between particles due to too much binder and adverse effect is caused in etching accuracy to the particle single layer film does not occur, and particles can be fixed sufficiently.

In the case where too much binder solution is supplied, a spin coater may be used or the substrate may be tilted after binder solution permeated to remove an excessive amount of binder solution.

As a type of binder solution material, it is possible to use alkoxysilane shown earlier as hydrophobic agent or general organic binder, inorganic binder or the like, and after binder solution permeated, heating processing is performed appropriately corresponding to a binder type. For example, in the case where alkoxysilane is used as binder, it is preferable to heat at 40 to 80° C. for 3 to 60 minutes.

Further, in the case of using the sintering method as a fixing processing method, the substrate original plate on which the particle single layer film is formed is heated, and each particle constituting the particle single layer film may be fused to the substrate. Heating temperature may be determined corresponding to a material of particles and a material of the substrate. Since particles having a particle diameter of 1 μm or less start interface reaction at lower temperature than original melting point of the substance, sintering is completed on a relatively low temperature side.

A fused area of particles becomes larger when heating temperature in sintering is too high, which could consequently cause adverse effect in accuracy such that a shape as the particle single layer film changes.

Further, because there is a possibility that the substrate or each particle is oxidized when heating is performed in the air, it is preferable to perform heating under an inert gas atmosphere. In the case of performing sintering under an atmosphere containing oxygen, it becomes necessary to set a condition in which an oxide layer is taken in consideration in a dry etching process (described later).

In the particle single layer film formed onto the substrate original plate in this manner, it is preferable that a misalignment S (%) of particle array defined by Mathematical Formula (8) below be 10% or less.

[Mathematical Formula 8]

$$S(\%)=|B-A|\times 100/A \tag{8}$$

A: Average particle diameter of particles
B: Average pitch between particles in the particle single layer film In Mathematical Formula (8), "average particle diameter of particles" of A means an average primary particle diameter of particles constituting the particle single layer film, and it can be obtained by a conventional method from a peak which is obtained by fitting particle size distribution calculated by a particle dynamic light scattering method to Gaussian curve. Further, "average pitch between particles in the particle single layer film" of B means an average value of a distance between the apexes of adjacent two particles in the particle single layer film. Now, when particles are in a spherical shape, the distance between the apexes of adjacent particle equals a center-to-center distance of adjacent particles.

An average pitch between particles in the particle single layer film is obtained by the AFM in the same manner as the center-to-center distance P2 of the convex portions 12a.

In the particle single layer film in which the misalignment S of particle array is 10% or less, each particle is two-dimensionally close-packed, a gap between particles is controlled, and accuracy of the array is high.

(1-3) Dry Etching Process

By performing dry etching to the substrate surface which was coated by the particle single layer film as described above, the substrate 12 having a structure in which the plurality of convex portions 12b are arrayed periodically and two-dimensionally can be acquired.

Specifically, as dry etching is started, etching gas passes through the gap of each particle constituting the particle single layer film to reach the surface of the substrate original plate first, the substrate surface is etched by etching gas and concave portions are formed in the area where etching gas reached, and convex portions appear in an area where each particle is positioned.

After that, as dry etching is further continues, particles on each convex portion are also gradually etched by etching gas and becomes smaller, and the concave portions of the substrate original plate surface also become deeper. Then, each particle finally disappears by etching gas, and at the same time, a structure in which a plurality of convex portions are arrayed periodically and two-dimensionally is formed on the surface of the substrate original plate. The plurality of convex portions 12b are formed on the surface 12a of the substrate 12 in this manner, and the two-dimensional lattice structure is formed on the substrate 12 by the plurality of convex portions 12.

Further, by adjusting conditions of dry etching (bias power, gas flow rate, type and amount of deposition gas, etc.), a height and a shape of convex portions to be formed can be adjusted.

As etching gas used in dry etching, Ar, $SF_6$, $F_2$, $CF_4$, $C_4F_8$, $C_5F_8$, $C_2F_6$, $C_3F_6$, $C_4F_6$, $CHF_3$, $CH_2F_2$, $CH_3F$, $C_3F_8$, $Cl_2$, $CCl_4$, $SiCl_4$, $BCl_2$, $BCl_3$, $BC_2$, $Br_2$, $Br_3$, HBr, $CBrF_3$, HCl, $CH_4$, $NH_3$, $O_2$, $H_2$, $N_2$, CO, $CO_2$ and the like are included for example, but it is not limited to them within a range where the effect of the present invention is not inhibited. One type or more of them can be used corresponding to particles constituting the particle single layer film, a material of the substrate or the like.

As a usable etching apparatus, specifications such as a method of generating plasma, an electrode structure, a chamber structure, frequency of a high frequency power source are not particularly limited as long as the apparatus is a reactive ion etching apparatus, an ion beam etching apparatus or the like which is capable of anisotropic etching and generating a bias electric field of about 10 W at the minimum.

It is preferable to set various types of conditions (a particle material which constitutes the particle single layer film, a material of the substrate, a type of etching gas, bias power, antenna power, flow rate and pressure of gas, etching time, etc.) so as to bring an etching selective ratio in the dry etching process (namely, etching rate of substrate/etching rate of particle single layer film) to 1.0 or less.

For example, in the case where colloidal silica particles are selected as particles constituting the particle single layer film being an etching mask, a quartz substrate is selected as a substrate, and the particle single layer film is formed by colloidal silica particles on the quartz substrate, etching of a relatively low pitch and amplitude ratio can be performed by using gas such as Ar and $CF_4$ for etching gas.

Further, when bias power of electric field is set to from several tens to several hundred W, positively charged particles in etching gas in a plasma state are accelerated and made incident substantially perpendicularly to the substrate at high speed. Therefore, in the case of using gas having reactivity to the substrate, reaction rate of physical/chemical etching in a perpendicular direction can be increased.

Depending on a combination between a material of the substrate and a type of etching gas, isotropic etching by radicals generated by plasma also occurs in parallel in dry etching. Etching by radicals is chemical etching, and it performs isotropical etching in any direction of an etching object.

Further, since radicals do not have charge, etching rate cannot be controlled by a setting of bias power, and etching rate is controlled by in-chamber concentration of etching gas. A certain degree of gas pressure must be maintained in order to perform anisotropic etching by charged particles, so that influence of radicals cannot be brought to zero as long as reactive gas is used. However, a technique of slowing down reaction rate of radicals by cooling down the substrate is widely used, and there are many apparatus including such a mechanism, it is preferable to use the technique.

Moreover, in the dry etching process, by adjusting mainly the bias power and using so-called deposition gas in combination according to a situation, a two-dimensional lattice structure having a relatively low ratio between the center-to-center distance of convex portions on the substrate surface and the height of the convex portions (center-to-center distance/height) can be formed.

Regarding the structure formed on the substrate surface, when the center-to-center distance C of the convex portions is obtained similar to the method of obtaining an average pitch B between particles in the particle single layer film, the center-to-center distance C is substantially the same value as the average pitch B of the used particle single layer film. Further, a misalignment S'(%) of array defined by Mathematical Formula (9) below is obtained regarding the structure, its value is substantially the same value as the misalignment S of array in the used particle single layer film.

[Mathematical Formula 9]

$$S'(\%)=|C-A|\times 100/A \qquad (9)$$

A: Average particle diameter of particles constituting the used particle single layer film
C: Center-to-center distance of convex portions formed on the substrate surface Now, the substrate having a structure in which a plurality of convex portions are arrayed periodically and two-dimensionally on the surface, which is formed in the manner described above, is used as a template, and the substrate 12 may be fabricated by transferring the structure of the template surface onto the substrate original plate.

Transfer of the structure of the template surface can be executed by a publicly known method which is a method such as a nanoimprint method, a hot press method, an injection molding method, and a UV embossing method disclosed in the above-described Patent Document 4 for example.

As the number of transfers increases, the shape of fine unevenness becomes blunt, so that 5 times or less is preferable as a practical derivative number of transfers from an original master.

The reflective layer 22 and the anode conductive layer 14 are sequentially stacked on the surface 12a of the substrate 12 on which the two-dimensional lattice structure by the plurality of convex portions 12b is formed in the manner described above, and the hole injection layer 16-1, the hole transport layer 16-2, the light emitting layer 16-3, the electron transport layer 16-4 and the electron injection layer 16-5 are sequentially stacked on a surface 14a of the anode conductive layer 14 to form the organic EL layer 16, the metal layer 18-1 and the transparent conductive layer 18-2 are sequentially stacked on a surface 16-5a of the electron injection layer 16-5 to form the cathode conductive layer 18, and thus the organic light emitting diode 10 can be acquired.

A stacking method of each of these layers is not particularly limited, and a publicly known technique used in manufacture of a general organic light emitting diode can be used. For example, the anode conductive layer 14 and the transparent conductive layer 18-2 can be severally formed by a sputtering method, a vacuum deposition method or the like. Further, the reflective layer 22, the hole injection layer 16-1, the hole transport layer 16-2, the light emitting layer 16-3, the electron transport layer 16-4, the electron injection layer 16-5 and the metal layer 18-1 can be severally formed by a vacuum deposition method.

Since the thickness of each of these layers is extremely thin, by sequentially stacking each layer in the manner described above, the two-dimensional lattice structure by the plurality of convex portions 12b on the surface 12a of the substrate 12 is reflected to the transparent conductive layer 18-2, and the two-dimensional lattice structure by a plurality of convex portions or concave portions corresponding to the two-dimensional lattice structure by the plurality of convex portions 12b formed on the surface 12a of the substrate 12 is formed on the reflective layer 22 and the metal layer 18-1.

Next, the case of fabricating the organic light emitting diode 10 based on the above-described manufacturing method will be explained giving a specific example.

An organic light emitting diode 10 to be fabricated should be a substrate/Ag [film thickness 50 nm]/IZO [film thickness 20 nm]/2-TNATA [film thickness 30 nm]/NPD [film thickness 70 nm]/Ir(piq)$_3$@PH-1 (5%) [film thickness 30 nm]/Alq$_3$ [film thickness 30 nm]/MgAg [film thickness 10 nm]/IZO [film thickness 110 nm].

Specifically, the organic light emitting diode 10 is constituted of: the substrate 12 formed of quartz glass; the reflective layer 22 formed of Ag having the thickness of 50 nm; the anode conductive layer 14 formed of IZO having the thickness of 20 nm; the hole injection layer 16-1 formed of 2-TNATA having the thickness of thickness 30 nm; the hole transport layer 16-2 formed of NPD having the thickness of 70 nm; the light emitting layer 16-3 formed of PH-1 to which Ir(piq)$_3$ is doped by 5% having the thickness of 30 nm; the electron transport layer 16-4 formed of Alq$_3$ (tris (8-hydroxyquinolinato)aluminum) having the thickness of 30 nm; the metal layer 18-1 formed of MgAg (magnesium alloy with the content of Ag at 70% or higher) having the thickness of 10 nm; and the transparent conductive layer 18-2 formed of IZO having the thickness of 110 nm.

To fabricate the organic light emitting diode 10, the particle diameter of particles which form the particle single layer film, which are required in fabricating the two-dimensional lattice structure by the plurality of convex portions 12b on the surface 12a of the substrate 12, is calculated first.

Specifically, in the organic light emitting diode 10, intensity of energy dissipation when a thickness of the metal layer 18-1 out of the cathode conductive layer 18 is set to 10 nm is obtained by the above-described Mathematical Formula (2).

Herein, the particle diameter of particles which form the particle single layer film when extracting the energy of surface plasmon generated on the rear surface 18-1c of the metal layer 18-1 (namely, the rear surface 18a of the cathode conductive layer 18) as propagation light should be calculated.

In the above-described Mathematical Formula (2), because a second mode (peak) from the largest wave number is an energy dissipation intensity of surface plasmon generated on the rear surface 18-1c of the metal layer 18-1 (the rear surface 18a of the cathode conductive layer 18), in-plane wave number $k_{//}$ which gives the peak is obtained.

Now, in this calculation, an objective is not to obtain the peak intensity but to obtain $k_{//}$, $\omega\mu^2/8\pi\in_N$ is excluded from calculation as a term that makes no contribution, and calculation below in the above-described Mathematical Formula (5) is performed.

[Mathematical Formula 10]

$$\text{Re}\left\{\frac{k_{//}^3}{k_z}\frac{[1 + r^+\exp(2ik_2d^+)][1 + r^-\exp(2ik_zd^-)]}{1 - r^+r^-\exp(2ik_zd^+d^-)}\right\} \quad (10)$$

Further, similarly in this calculation, an objective is not to obtain the peak intensity but to obtain the value of $k_{//}$, a position of the dipole should be 20 nm from the rear surface 18-1c of the metal layer 18-1 (the rear surface 18a of the cathode conductive layer 18).

Numerical values substituted in the above-described Mathematical Formula (10) are d$^+$=20 nm and d$^-$=10 nm, r$^+$ and r$^-$ are calculated by a mathematical for obtaining reflection coefficient of a normal multilayer thin film, and $k_z=(\in_N(\omega/c)^2-k_{//}^2)^{0.5}$ holds. Now, as a mathematical formula for obtaining the reflection coefficient of the above-described normal multilayer thin film, refer to non-patent document "Plasmonics-Fundamentals and Applications" written by Takayuki Okamoto and Kotaro Kajikawa, Kodansha Scientific Ltd. (published on Oct. 1, 2010), P16-22.

Figure 6:
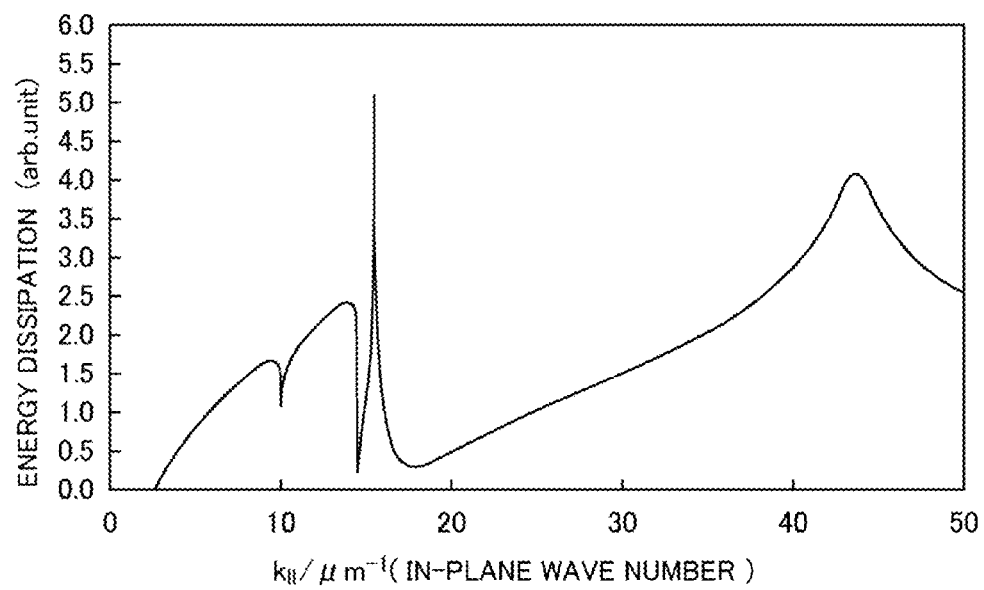
FIG. 6 is a graph showing energy dissipation of the dipole.

Then, as the above-described Mathematical Formula (10) is calculated as a function using $k_{//}$ as a variable, a result as shown in FIG. 6 is obtained.

In FIG. 6, $k_{11}$ of a second mode (peak) from the largest in-plane wave number is 15.6 μm$^{-1}$. As the value is substituted in the above-described Mathematical Formula (6), the particle diameter D of particles for fabricating a fine uneven structure corresponding to the wave number (namely, the two-dimensional lattice structure) is calculated as 454 nm.

Now, in the specific example, to explain an etching method using a particle single layer film, the particle diameter of particles which form the particle single layer film is calculated by using Mathematical Formula (6). In the case of fabricating the organic light emitting diode 10 by a method other than the etching method using a particle single layer film, the lattice pitch P is calculated by using the above-described Mathematical Formula (6) or Mathematical Formula (7), and the diode may be fabricated by adjusting various types of conditions so as to realize the calculated lattice pitch P.

Based on the value of the particle diameter D of particles calculated by the above-described Mathematical Formula (6), 5.0% by mass water dispersion (dispersion) of colloidal silica having average particle diameter at 451.2 nm and coefficient of variation in the particle diameter at 4.0% was fabricated. It is to be noted that the average particle diameter and the coefficient of variation in the particle diameter were calculated from a peak obtained by fitting particle size distribution, which is obtained by a particle dynamic light scattering method by Zetasizer Nano-ZS manufactured by Malvern Instruments Ltd., with Gaussian curve.

Next, to hydrophobize a surface of colloidal silica in the fabricated dispersion, aqueous solution containing hydrolysate of phenyltriethoxysilane at the concentration of 1.0% by mass was added to the dispersion, and it was reacted at about 40° C. for 3 hours. On this occasion, the dispersion and the aqueous solution were mixed such that the mass of phenyltriethoxysilane became 0.015 times the mass of colloidal silica particles.

Then, methyl isobutyl ketone having a volume 5 times that of dispersion after completing reaction was added to the dispersion and stirred, and hydrophobized colloidal silica was extracted in an oil phase.

Hydrophobic colloidal silica dispersion at the concentration of 1.05% by mass obtained in this manner was dripped at drip rate 0.01 ml/second onto the surface of liquid (water was used as lower layer solution, water temperature was set to 26.5° C.) pooled in the trough (LB trough device) equipped with the surface pressure sensor which measures surface pressure of the particle single layer film and the movable barrier which compresses the particle single layer film in a direction along the liquid surface. It is to be noted that a transparent quartz substrate (30 mm×30 mm×1.0 mm, mirror finished on both surfaces) to be used as the substrate 12 of the organic light emitting diode 10 is previously immersed in the lower layer water pooled in the trough in a substantially vertical direction.

From the point where hydrophobic colloidal silica dispersion was started to drip onto the liquid surface of the lower layer water, the liquid surface was irradiated with ultrasonic wave from the lower layer water for 10 minutes on the conditions of output 100 W and frequency 1500 kHz, by which hydrophobized colloidal silica particles were promoted to be two-dimensionally close-packed, and methyl isobutyl ketone being organic solvent in the dispersion was volatilized to form the particle single layer film on the liquid surface of the lower layer water.

After that, the formed particle single layer film was compressed by the movable barrier until diffusion pressure became 22 to 30 mNm$^{-1}$, the substrate 12 was pulled up at the rate of 3 mm/minute, and the particle single layer film was transferred onto one surface of the substrate 12. It is to be noted that one surface of the substrate 12 is a surface on which the two-dimensional lattice structure is about to be formed.

Next, as fixing processing of the particle single layer film, which was transferred onto one surface of the substrate 12, to the one surface, hydrolyzed solution of monomethyltrimethoxysilane having 0.15% by mass was permeated as binder on one surface of the substrate 12 onto which the particle single layer film was transferred. After that, an excessive amount of the hydrolyzed solution was processed by a spin coater (3000 rpm) for 1 minute and removed. Then, the substrate 12, from which an excessive amount of the hydrolyzed solution was removed, was heated at 100° C. for 10 minutes to allow binder to be reacted, and the substrate 12 on which the particle single layer film made of colloidal silica particles was formed was acquired.

After the substrate 12 on which the particle single layer film was formed was acquired in this manner, dry etching treatment was then conducted to the substrate 12 by $CHF_3$ gas.

Conditions of the dry etching treatment were antenna power at 1500 W, bias power at 50 to 300 W (13.56 MHz), and gas flow rate at 50 to 200 sccm.

Figure 7A:
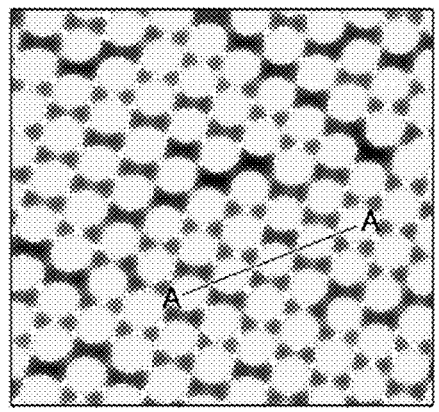
FIG. 7(a) shows an explanatory view where the surface of the substrate after dry etching treatment is observed by an AFM, further.
Figure 7B:
FIG. 7(b) shows a cross-sectional view from line A-A of FIG. 7(a).

As one surface of the substrate 12 after the dry etching treatment was conducted was observed by the AFM, a cross-sectional shape was in a truncated cone shape (refer to FIG. 7(b)), and a fine uneven structure in which convex portions were arrayed in a triangular lattice shape was formed in a plan arrangement (refer to FIG. 7(a)).

As the center-to-center distance p' (lattice constant) of convex portions in the fine uneven structure formed on one surface of the substrate 12 in this manner was measured by the AFM, an average value in three tests was 455.4 nm.

Further, an average value of convex portions in the fine uneven structure in 25 regions of 5 μm×5 μm randomly selected from an AFM image was calculated, and an average height h of convex portions in the fine uneven structure obtained by further averaging average values of each of the 25 regions was 30.9 nm. Moreover, as a result of calculation by using the above-described Mathematical Formula (11), the misalignment S of array was 4.9%. Furthermore, a ratio between the average height h and the average value of the center-to-center distance p' (average height h/center-to-center distance p') was 0.078.

After that, on one surface of the substrate 12 on which the fine uneven structure was formed, Ag was deposited at the thickness of 50 nm as the reflective layer 22 by a vapor deposition method. Further, on the reflective layer 22, IZO was deposited at the thickness of 20 nm as the anode conductive layer 14 by a sputtering method. Moreover, 2-TNATA was deposited at the thickness of 30 nm as the hole injection layer 16-1 by the vapor deposition method.

Next, on the hole injection layer 16-1, 4,4'-bis[N-1-napthyl]-N-phenyl-amino]-biphenyl (α-NPD) was deposited at the thickness of 70 nm as the hole transport layer 16-2 by the vapor deposition method, and then, on the hole transport layer 16-2, Ir(piq)$_3$ doped with a host material PH1 (manufactured by SFC Co., Ltd.) at the concentration of 5% was deposited at the thickness of 30 nm as the light emitting layer 16-3 by the vapor deposition method.

Moreover, on the light emitting layer 16-3, Alq$_3$ was deposited at the thickness of 30 nm as the electron transport layer 16-4 by the vapor deposition method, and furthermore, on the electron transport layer 16-4, magnesium/silver alloy with Mg/Ag=10/90 (mass ratio) was deposited at the thickness of 10 nm as the metal layer 18-1 by the vapor deposition method. Further, on the metal layer 18-1, IZO was deposited at the thickness of 110 nm as the transparent conductive layer 18-2 by the sputtering method, and thus the organic light emitting diode 10 was fabricated.

Now by using a mask in performing deposition and sputtering, a light emission area was fabricated in 2×2 mm.

As explained above, the organic light emitting diode 10 according to the present invention is constituted in that the two-dimensional lattice structure by the plurality of convex portions 12b is formed on the surface 12a of the substrate 12, and the reflective layer 22, the anode conductive layer 14, the organic EL layer 16, and the cathode conductive layer 18 constituted of the metal layer 18-1 formed in a thin layer to make visible light transmissible therethrough and the transparent conductive layer 18-2 for improving conductivity are sequentially stacked on the substrate 12, and the diode was made in a top emission-type in which light generated in the organic EL layer 16 is extracted from the cathode conductive layer 18 side.

Further, in the case of fabricating the organic light emitting diode 10 by the etching method using a particle single layer film, the particle diameter of particles for forming the particle single layer film was calculated by the above-described Mathematical Formula (4).

Thus, in the organic light emitting diode 10 according to the present invention, the two-dimensional lattice structure by the plurality of convex portions 12b can be formed on the surface 12a of the substrate 12 corresponding to a surface plasmon mode.

Therefore, in the organic light emitting diode 10 according to the present invention, light extraction efficiency to a surface plasmon mode can be optimized, and light extraction efficiency can be improved comparing to an organic light emitting diode by a conventional technique.

Then, by fabricating an image display device by utilizing such an organic light emitting diode 10, a long-life and low-power image display device can be fabricated.

Moreover, by fabricating an illumination device by utilizing such an organic light emitting diode 10, a long-life and low-power illumination device can be fabricated.

(2) Second Embodiment

Hereinafter, referring to the accompanying drawings, an example of a second embodiment of the organic light emitting diode according to the present invention will be explained in detail.

Now in this embodiment as well, as long as the present invention is used, a structure and a method of a target organic light emitting diode are not necessarily limited in the explanation below.

(2-1) Constitution of the Organic Light Emitting Diode by the Second Embodiment

Firstly, FIG. 8 shows a schematic constitution cross-sectional explanatory view showing the second embodiment of the organic light emitting diode according to the present invention.

Now, in the explanation regarding the organic light emitting diode 100 according to the present invention shown in FIG. 8, for convenience of explanation, a surface on an upper side in a height direction of each layer constituting the monochromatic organic light emitting diode 100 is appropriately referred to as a top surface, and a surface on a lower side in a height direction of each layer is appropriately referred to as a bottom surface.

Herein, the organic light emitting diode of the second embodiment according to the present invention has: a substrate fabricating process of fabricating an organic light emitting diode substrate provided with an uneven structure on the surface of which a plurality of concave portions or convex portions are two-dimensionally arrayed by a dry etching method using the particle single layer film as an etching mask; and a stacking process of stacking at least an anode conductive layer, an electro-luminescence layer (EL layer) which includes a light emitting layer containing an organic light emitting material, and a cathode conductive layer including a metal layer on the uneven structure such that the uneven structure is copied on the surface of the cathode conductive layer.

Then, the substrate fabricating process is characterized in that the particle single layer film is fabricated by using a mixture of a plurality of particles having different particle diameters, and an organic light emitting diode substrate having an uneven structure satisfying the requirements below is fabricated by using such a particle single layer film.

Specifically, the fine uneven structure is fabricated such that, when, out of wavelengths which give a half value of a peak $\lambda_{peak}$ in emission spectrum of light obtained by an organic light emitting material, which is finally obtained, a shorter wavelength is $\lambda_1$ and a longer wavelength is $\lambda_2$, and real parts of the propagation constant of surface plasmon corresponding to wavelengths $2\lambda_1-\lambda_{peak}$ and $2\lambda_2-\lambda_{peak}$ in an interface between the cathode conductive layer and the organic electro-luminescence layer are $k_1$ and $k_2$ respectively, the power spectrum of the height distribution of the interface has a finite value between a wave number $K_1=k_1$ and a wave number $K_2=k_2$, and an integrated value of spectrum intensities within the wave number range has an intensity value of 50% or higher of the spectrum intensity over all wave numbers.

Thus, regarding light generated from the organic light emitting diode, extraction efficiency of light in a narrow bandwidth having a certain degree of broadness centered on arbitrary wavelength can be stably obtained in a visible light to near infrared region (380 nm to 2500 nm).

Now, the "certain degree of broadness" means when, out of wavelengths which give a half value of the peak $\lambda_{peak}$ in emission spectrum of light obtained by an organic light emitting material, when a shorter wavelength is $\lambda_1$ and a longer wavelength is $\lambda_2$ for example, is light in a narrow bandwidth having broadness approximately between wavelengths $\lambda_{min}=2\lambda_1-\lambda_{peak}$ and $\lambda_{max}=2\lambda_2-\lambda_{peak}$ in the interface between the cathode conductive layer and the organic electro-luminescence layer.

The organic light emitting diode according to the present invention will be explained in detail below. When organic light emitting material molecules included in the light emitting layer in the EL layer emit light, near field light is generated in close vicinity. Then, since a distance between the light emitting layer and the metal layer being the cathode conductive layer is extremely close, the near field light is converted into propagation-type surface plasmon on the surface of the metal layer.

Herein, in the propagation-type surface plasmon on the metal layer surface, compressional wave of free electrons in the vicinity of the surface is associated with a surface electromagnetic field.

In the case of surface plasmon which exists on a flat metal layer surface, a dispersion curve of the surface plasmon and a dispersion straight line of light (space propagating light) do not cross with each other, so that surface plasmon cannot be extracted as light.

On the other hand, when a nanometer-order two-dimensional fine uneven structure is on the metal layer surface, the dispersion curve of space propagating light diffracted by the fine uneven structure crosses the dispersion curve of surface plasmon, and the energy of surface plasmon can be extracted as radiant light.

Therefore, the two-dimensional uneven structure is provided on the surface on an organic EL layer side of the metal layer, by which the energy of light lost as surface plasmon is extracted, and the extracted energy is radiated from the metal layer surface as radiant light.

At this point, in the case where the fine uneven structure has periodicity, light radiated from the metal layer has high directivity, and its major part is directed to a light extraction surface (a surface on organic light emitting diode substrate side of organic light emitting diode or a surface of its opposite side). Therefore, high-intensity light is emitted from the light extraction surface, and light extraction efficiency improves.

In a conventional organic light emitting diode, the above-described two-dimensional uneven structure was a lattice structure having high periodicity.

For example, in Patent Document 4 above, a particle single layer film having a small misalignment of array is formed by using particles of a single particle diameter, and an organic light emitting diode substrate having a periodic lattice structure is fabricated by the dry etching method which uses the single layer film as an etching mask, by which the periodic lattice structure is formed on the surface on the organic EL layer side of the metal layer.

On the other hand, in the second embodiment of the present invention, since the particle single layer film is formed by using a mixture of plural types of particles having different particle diameters (by three types of particles having different particle diameters for example), the two-dimensional uneven structure finally formed on the surface on the organic EL layer side of the metal layer has lower periodicity than the one in Patent Document 4 above, and distribution of gaps of concave portions or convex portions has a certain degree of width.

By allowing the distribution of gaps of concave portions or convex portions to have a certain degree of width as in the second embodiment of the present invention, matching between the fine uneven structure and the extraction wavelength always has a periodic structure of unevenness corresponding to the extraction wavelength even if the fine uneven structure is slightly changed, which contributes to stable performance of light extraction of electromagnetic wave in a narrow bandwidth having a certain degree of broadness.

More specifically, regarding the organic light emitting diode according to the second embodiment of the present invention, when the dry etching method is performed by using a particle single layer film formed of three types of particles being particles A, particles B and particles C having different particle diameters, and an uneven structure is formed on an organic light emitting diode substrate as shown in the example of FIG. 9($a$-1) as an example, the power spectrum of the height distribution of the organic light emitting diode substrate surface having such an uneven structure is as shown in FIG. 9($a$-2). Specifically, in the power spectrum, instead of a dot sequence of a delta function state arrayed on an annulus as shown in (a-2) of FIG. 1($a$), which is shown as a conventional art, an image showing distribution in an annular region with a width shown in FIG. 9($a$-2) is obtained.

Further, according to the organic light emitting diode by the present invention having such a random two-dimensional uneven structure, light in a narrow bandwidth having a certain degree of broadness and of large intensity as shown in the profile of the power spectrum of height distribution FIG. 9($a$-3) can be obtained.

The organic light emitting diode 100 according to the present invention having the characteristics explained above will be explained referring to the accompanying drawings below.

The organic light emitting diode 100 according to the present invention shown in FIG. 8 is an organic light emitting diode having a layer constitution of a type generally referred to as a bottom emission-type.

More particularly, the organic light emitting diode 100 is formed by stacking the anode conductive layer 104 made of transparent conductor on the surface on an upper side of a transparent substrate 102 being the organic light emitting diode substrate, in which the transparent substrate 102 is used as a bottom portion, stacking an EL layer 106 formed by a plurality of light emitting layers or the like on the top surface of the anode conductive layer 104, and stacking a cathode conductive layer (metal layer) 108 made of metal on the surface of the EL layer 106.

Further, in the organic light emitting diode 100 according to the present invention, three types of convex portions being convex portions 102$a$, convex portions 102$b$ and convex portions 102$c$ each having a different diameter are arranged in plural numbers on an interface with the anode conductive layer 104 being the surface of the transparent substrate 102 to form an uneven structure.

The convex portions 102$a$, the convex portions 102$b$ and the convex portions 102$c$ which form such an uneven structure are two-dimensionally randomly arrayed, and consequently, the power spectrum of the uneven structure has a certain degree of width. Specifically, the annular width of such a power spectrum becomes thicker comparing to the dot sequence of a delta function state shown in (a-2) of FIG. 1($a$) which is shown as a conventional art.

Further, the EL layer 106 is made of a single organic light emitting material, and is constituted by sequentially stacking a hole injection layer 106-1, a hole transport layer 106-2, a light emitting layer 106-3 constituted of an organic light emitting material, an electron transport layer 106-4 and an electron injection layer 106-5, as each layer, on the surface of the anode conductive layer 104.

Regarding each layer constituting such an EL layer 106, there are cases where one layer plays one role and a case where one layer combines two or more roles.

For example, the case where one layer combines two or more roles includes a case where one layer combines both roles of the electron transport layer and the light emitting layer.

Then, the anode conductive layer 104 stacked on the transparent substrate 102, the hole injection layer 106-1, the hole transport layer 106-2, the light emitting layer 106-3, the electron transport layer 106-4 and the electron injection layer 106-5, which are each layer constituting the EL layer 106, and the cathode conductive layer 108 stacked on the top surface are sequentially stacked on the transparent substrate 102, so that the uneven structure that the transparent substrate 102 has is severally reflected on each layer, and an uneven structure similar to the uneven structure formed on the transparent substrate 102 is formed on the top surface of each layer.

On the other hand, on the bottom surface of each layer of the anode conductive layer 104, the hole injection layer 106-1, the hole transport layer 106-2, the light emitting layer 106-3, the electron transport layer 106-4 and the electron injection layer 106-5, which are each layer of the EL layer 106, and the cathode conductive layer 108, the two-dimensional uneven structure having an inverted shape of the uneven structure explained above is formed.

Further, in the organic light emitting diode 100, a power source 110 is connected to the anode conductive layer 104 and the cathode conductive layer 108 such that a voltage can be applied.

As a voltage is applied from such a power source 110 to the anode conductive layer 104 and the cathode conductive layer 108, holes and electrons are injected from each layer of the anode conductive layer 104 and the cathode conductive layer 108 to the EL layer 106.

Then, the injected holes and electrons are combined and excitons are created in the light emitting layer 106-3, and such excitons emit light when they are recombined.

The organic light emitting diode 100 according to the present invention is realized in the above-described constitution, and characteristics of materials, shapes and the like for fabricating each layer which constitutes such an organic light emitting diode 100 will be explained below in detail.

(2-2) Constitution of Each Layer (2-2-1) Transparent Substrate

Firstly, a material for fabricating the transparent substrate 102 may be a material which transmits light of a target wavelength to be extract by the organic light emitting diode 100, and the transparent substrate can be fabricated by using materials including an inorganic material, an organic material, and a material in which such materials are combined or the like.

For example, it is possible to use the inorganic material and the organic material exemplified as a transparent material in the first embodiment.

A selection standard of a material to be used for such a transparent substrate depends on a use application of the organic light emitting diode, and a material having high visible light transmittance is generally used as a material for the transparent substrate 102.

Specifically, because a material which does not give spectrum deviation in a visible light region (wavelength 380 nm to 780 nm) is desired, the visible light transmittance of 70% or higher is preferable, and 80% or higher is more preferable, and 90% or higher is further preferable.

It is to be noted that the substrate material is not necessarily be transparent in the case of a top emission element.

Figure 10A:
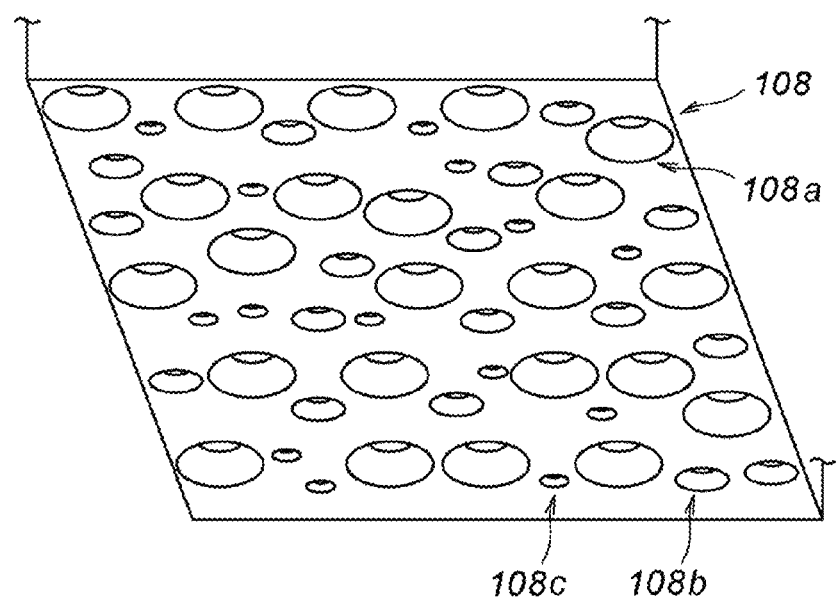
FIG. 10(a) is a schematic constitution perspective explanatory view showing a fine uneven structure formed on the rear surface of a cathode conductive layer in the organic light emitting diode according to the present invention.
Figure 10B:
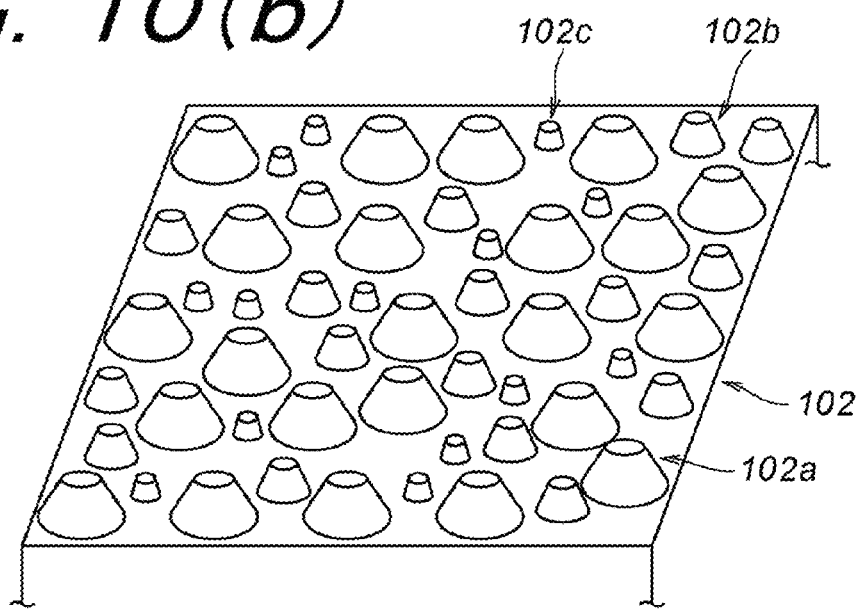
FIG. 10(b) is a schematic constitution perspective explanatory view showing a fine uneven structure formed on the surface of a substrate in the organic light emitting diode according to the present invention.

Next, a shape of the transparent substrate 102 will be explained. The convex portions 102a, the convex portions 102b and the convex portions 102c whose diameters are different from each other are arranged in plural numbers on the surface of the transparent substrate 102 to provide a two-dimensionally randomly arrayed uneven structure (refer to FIG. 10(b)).

The anode conductive layer 104 and the EL layer 106 (the hole injection layer 106-1, the hole transport layer 106-2, the light emitting layer 106-3, the electron transport layer 106-4 and the electron injection layer 106-5) are sequentially stacked on a surface having the uneven structure of such a transparent substrate 102. Since each layer is stacked facing the uneven structure, an uneven structure similar to the surface of the transparent substrate 102 is formed on the top surface of each layer.

Therefore, as the cathode conductive layer 108 is stacked finally on the EL layer 106, an uneven structure same as the uneven structure of the surface of the transparent substrate 102 is formed on the top surface of the cathode conductive layer 108 in the same manner as the other layers. Further, a two-dimensional uneven structure with a shape in which the uneven structure of the surface of the transparent substrate 102 is inverted, which is a two-dimensional uneven structure in which a plurality of concave portions 108a, concave portions 108b and concave portions 108c are two-dimensionally randomly arrayed (hereinafter, appropriately referred to as "inverted uneven structure") is formed on the bottom surface of the cathode conductive layer 108 (refer to FIG. 10(a)).

Each diameter and depth of the concave portions 108a, the concave portions 108b and the concave portions 108c in the above-described inverted uneven structure match each diameter and height of the convex portions 102a, the convex portions 102b and the convex portions 102c in the uneven structure of the surface of the transparent substrate 102.

Further, an array pattern of the concave portions 108a, the concave portions 108b and the concave portions 108c in the inverted uneven structure matches the array pattern of the convex portions 102a, the convex portions 102b and the convex portions 102c in the uneven structure of the surface of the transparent substrate 102.

Herein, the above-described "two-dimensionally randomly arrayed" means a state where a plurality of the convex portions 102a, the convex portions 102b and the convex portions 102c or a plurality of the concave portions 108a, the concave portions 108b and the concave portions 108c are arranged on the same plane, and gaps between their centers and array directions are not constant but irregularly arrayed.

By allowing such convex portions or concave portions to be randomly two-dimensionally arrayed to some extent, extraction of light in a narrow bandwidth having a certain degree of broadness corresponding to a profile of the power spectrum of the height distribution is stably performed.

Herein, an ideal two-dimensional lattice is a structure in which convex portions or concave portions are arrayed at a constant gap at least in two directions, which is considered to be a shape such as a triangular lattice shape (hexagonal lattice shape) and a rectangular lattice shape for example, and the uneven structure in the present invention is equivalent to a structure in which the array of such a triangular lattice or a rectangular lattice became non-uniform to some extent (randomization).

Now, "to some extent" above does not mean having a numerically defined range but means having a state.

Then, "random to some extent" and "non-uniform to some extent" do not mean that the power spectrum of the height distribution of the uneven structure has a delta functional peak at a specific wave number, but means disorder of a fine uneven structure such that spectrum is widely distributed in a wave number region including wave numbers $K_1$ and $K_2$ for example. They mean disorder of a fine uneven structure such that the power spectrum of the height distribution of an uneven surface give a sufficiently finite value between the wave number $K_1$ and the wave number $K_2$.

Moreover, in a highly accurately arrayed periodic structure, in the case of extracting light of a particular wavelength, light extraction efficiency improves when the extraction wavelength is completely matched with a period of the fine uneven structure, but light extraction efficiency becomes defective if the period of the fine uneven structure is slightly misaligned.

Herein, a specific deciding method of the particle diameter of particles which form the particle single layer film will be explained referring to FIG. 4.

Firstly, a method for obtaining a wave number (propagation constant) of surface plasmon corresponding to light of a wavelength λ will be shown.

The method for obtaining the wave number of surface plasmon is the same as the method to the layer constitution of an organic light emitting diode in the case of no unevenness, and concept for the organic light emitting diode is the same for both the bottom emission-type and the top emission-type.

As shown in FIG. 4 above, in the case where layers from the substrate to air consists of stacking a plurality of layers from the first layer to the L-th layer, the first layer is constituted of the substrate, and the L-th layer is constituted of air.

Herein, regarding the l-th layer which is one layer constituting the layers of the organic light emitting diode, it is assumed that its thickness is $d_l$, and its dielectric constant is given by $\epsilon_l$.

The thickness $d_L$ of the L-th layer is infinite. Further, it is perfectly safe to make the thickness $d_l$ of the first layer infinite.

Next, assuming that the M-th layer with l=M is a metal layer that carries surface plasmon, a propagation constant of surface plasmon propagating the interfaces on both sides of the M-th layer is obtained first.

Herein, there are two surface plasmon modes of propagating the interfaces of the metal layer.

One is a mode in which energy is concentrated mainly on an interface between the (M−1)th layer and the M-th layer which is a layer directly under the M-th layer, and the other one is a mode in which energy is concentrated mainly on an interface between the M-th layer and the (M+1)th layer which is a layer directly above the M-th layer. Hereinafter, the former should be referred to as an $M_-$ mode, the latter should be referred to as an $M_+$ mode appropriately. Propagation constants of surface plasmon in the two modes are obtained by solving a proper equation of a system.

Generally, the proper equation cannot be analytically solved, can only be numerically solved by using a non-linear optimization technique. This calculation becomes more difficult as the total number of parameters increases.

The propagation constant of surface plasmon is a complex number, and the above-described proper equation accurately gives the complex propagation constant. However, since what is required here is only a real part of the propagation constant of surface plasmon, a method of obtaining a constant by a simplified calculation is applicable in this case.

Firstly, propagation modes (surface plasmon mode and waveguide mode) that a layer structure has are characterized by a propagation constant. The propagation constant relates to a component parallel with an interface out of wave numbers of the propagation mode (hereinafter, referred to as in-plane wave number).

As a vibrational dipole is arranged in the layer structure, its energy dissipates to each mode that the layer structure has. Since each mode has a different propagation constant, that is, an in-plane wave number, which propagation mode the layer structure has is found out if in-plane wave number dependency of dissipation energy from the dipole is checked.

Herein, a specific calculation procedure for the in-plane wave number dependency of the dissipation energy of the dipole is as follows.

Firstly, one dipole should be placed perpendicularly to the (M−1)/M interface at a distance about 20 nm closer to the substrate side from the interface. Now, a layer on which the dipole is placed should not have absorption at a desired extraction angular frequency ω or should have small absorption. The layer on which the dipole is placed should be an N-th layer. FIG. 4 shows a layer structure of the organic light emitting diode, and an explanatory view showing a dipole placed in the layer structure is shown in the N-th layer with l=N. In FIG. 4, the dipole is placed in the N-th layer.

Herein, arrows $d_-$ and $d_+$ show distances from the dipole to a lower side interface of the N-th layer and an upper side interface of the N-th layer respectively.

Further, moment of the dipole should be μ, and the dipole should be vibrating at the extraction angular frequency ω. In the case of using the above-described various types of values, in-plane wave number ($k_{//}$) dependency of the energy dissipation of the dipole is given by Mathematical Formula (5) below.

[Mathematical Formula 5]

$$W_-(k_{//}) = \frac{\omega\mu^2}{8\pi\varepsilon_N}\operatorname{Re}\left[\frac{k_{//}^3}{k_z} \cdot \frac{[1+r^+\exp(2ik_zd^+)][1+r^-\exp(2ik_zd^-)]}{1-r^+r^-\exp(2ik_zd^+d^-)}\right] \quad (5)$$

Herein, $r_-$ denotes a reflection coefficient (amplitude reflectance) of p polarization having an in-plane wave number $k_{//}$ on the (N−1)/N interface seen from the N layer side, and $r_+$ denotes a reflection coefficient (amplitude reflectance) of p polarization having an in-plane wave number $k_{//}$ on the N/(N+1) interface seen from the N layer side (refer to FIG. 4). Needless to say, these reflection coefficients include influence of all layers to the substrate or air. Further, $k_Z$ denotes a normal line component of a wave vector of lightwave in the N-th layer, which is given by $k_{//}^2 + k_Z^2 = \epsilon_N(\omega/c)^2$. Further, c denotes the velocity of light in vacuum.

A maximum of the in-plane wave number dependency $W_-(k_{//})$ of the energy dissipation corresponds to each propagation mode, an in-plane wave number giving the maximum is a real part of the propagation constant in the mode.

Next, the dipole is place at a position about 20 nm closer to the air side from the M/(M+1) interface, and the same calculation is performed. The in-plane wave number dependency $W_+(k_{//})$ of the energy dissipation obtained by the calculation has a maximum at the same position as $W_-(k_{//})$. However, their maximum values are different.

Two modes from a largest wave number out of the maximums correspond to the surface plasmon mode.

the maximum values of energy dissipation in the in-plane wave numbers giving the two maximums are different between $W_-$ and $W_+$. Assuming that an in-plane wave number showing a larger maximum value in $W_-$ be $k_-$, and an in-plane wave number showing a larger maximum value in $W_+$ be $k_+$, $k_-$ is a propagation constant in $M_-$ mode, and $k_+$ is a propagation constant in $M_+$ mode.

Figure 11:
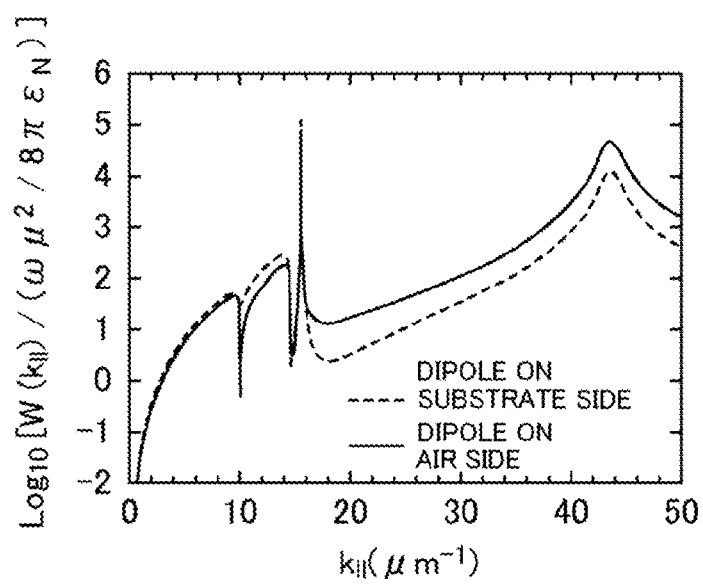
FIG. 11 is a graph showing energy dissipation when the dipole is placed at a distance 20 nm closer to a substrate side from the rear surface of the metal layer of the organic light emitting diode and energy dissipation when the dipole is placed at a distance 20 nm closer to an air side from the rear surface of the metal layer of the organic light emitting diode.

Now, FIG. 11 shows an energy dissipation diagram showing calculation results of energy dissipation when the dipole is placed at a distance 20 nm closer to the substrate side from the rear surface of the metal layer of the organic light emitting diode and energy dissipation when the dipole is placed at a distance 20 nm closer to the air side from the rear surface of the metal layer of the organic light emitting diode.

Herein, the energy dissipation diagram is a graph showing to which in-plane wave number the energy of the dipole placed in an element dissipates, which indicates in-plane wave number of a surface plasmon mode, a waveguide mode or the like.

Next, based on the calculation method of the propagation constant of surface plasmon, an uneven structure of the bottom emission-type organic light emitting diode which has unevenness on the cathode conductive layer surface will be considered.

Out of wavelengths which give a half value of the peak $\lambda_{peak}$ in the emission spectrum of light obtained by the organic light emitting material of the element, a shorter wavelength is $\lambda_1$, a longer wavelength is $\lambda_2$, and a real part of the propagation constant of surface plasmon corresponding to wavelengths $\lambda_{min}=2\lambda_1-\lambda_{peak}$ and $\lambda_{max}=2\lambda_2-\lambda_{peak}$ on the interface between the cathode conductive layer and the organic electro-luminescence layer is obtained.

Firstly, a wave number $k_1$ of surface plasmon corresponding to $\lambda_{min}$ is obtained. $W_-$ is calculated by using an angular frequency corresponding to $\lambda_{min}$, a dielectric constant of each layer and Mathematical Formula (5). In the case of the bottom emission-type, surface plasmon on the air side of the cathode conductive layer does not contribute to light extraction, so that the thickness of the cathode conductive layer should be infinite in calculation.

A wave number of the rightmost peak in an energy dissipation diagram obtained by calculating $W_-$ in this manner is $k_1$.

Next, a wave number $k_2$ of surface plasmon corresponding to $\lambda_{max}$ is obtained by the same method. Specifically, $W_+$ is calculated by using an angular frequency corresponding to $\lambda_{max}$, the dielectric constant of each layer and Mathematical Formula (5).

A wave number of the rightmost peak in an energy dissipation diagram obtained by calculating $W_+$ in this manner is $k_2$.

An uneven structure in which the power spectrum of the height distribution of the unevenness surface on the interface, which is determined by the wave numbers $k_1$ and $k_2$ of surface plasmon obtained in this manner, has an finite value between a wave number $K_1=k_1$ and a wave number $K_2=k_2$ is fabricated inside the bottom emission-type organic light emitting diode.

In the present invention, an integrated value of spectrum intensities within the wave number range is adjusted so as to have 50% or higher of the entire spectrum intensity.

Now, in the case where the integrated value of the spectrum intensities is 50% or less of the entire spectrum, an absolute amount of energy to be extracted generally becomes smaller. In the organic light emitting diode according to the present invention, the integrated value of the spectrum intensities is 50% or higher of the entire spectrum intensity, so that a certain degree of effect is obtained without reducing extraction efficiency.

Next, an average height of the uneven structure of the surface of the transparent substrate 102 used in the present invention will be explained. An average height of the uneven structure of the surface of the transparent substrate 102 is 15 nm or more and 180 nm or less. The average height of the uneven structure mentioned here means an average height of the convex portions 102*a*, the convex portions 102*b* and the convex portions 102*c* of the transparent substrate 102.

It is preferable that the average height of the convex portions 102*a*, the convex portions 102*b* and the convex portions 102*c* is 15 nm or more and 180 nm or less, and 20 nm or more and 100 nm or less is more preferable.

Herein, in the case where the average height is less than 15 nm or exceeds 180 nm, improvement effect of light extraction efficiency from the organic light emitting diode 100 becomes insufficient.

Its reason will be explained below. When the average height of convex portions is less than 15 nm, a diffracted wave of surface plasmon which is sufficient as the two-dimensional uneven structure cannot be created because the height of the convex portions is too low, and effect of extracting surface plasmon as radiant light is reduced.

Further, when the average height of convex portions exceeds 180 nm, possibility that the anode conductive layer 104 and the cathode conductive layer 108 cause short circuit becomes higher in stacking the anode conductive layer 104, the EL layer 106 and the cathode conductive layer 108 due to steep unevenness because the height of the convex portions is too high.

Due to such reasons, the present invention requires that the average height of convex portions should be 15 nm or more and 180 nm or less.

Next, a measurement method of the average height of the convex portions of the uneven structure will be explained. It is possible to measure the average height of the convex portions by an atomic force microscope (AFM).

Specifically, an AFM image is acquired first for a randomly selected region having 5 μm×5 μm out of a region of the uneven structure.

Figure 12:
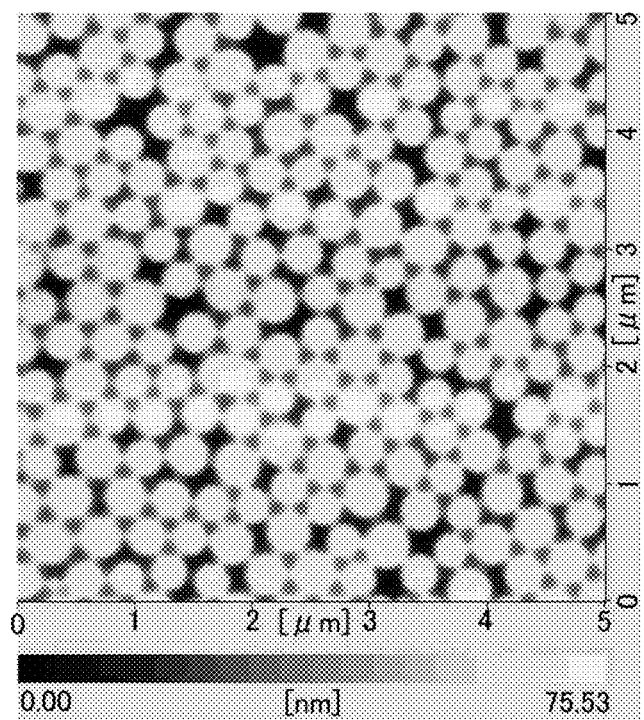
FIG. 12 is an explanatory view showing an AFM image obtained by measuring an uneven structure formed on the organic light emitting diode substrate according to the present invention by an atomic force microscope (AFM).

FIG. 12 shows an explanatory view showing an AFM image which is obtained by measuring the uneven structure formed on the organic light emitting diode substrate according to the present invention by the AFM. In such an AFM image, lightness in the AFM image is different corresponding to levels of the convex portions, in which an area having high convex portion height has higher lightness, and an area having low convex portion height has lower lightness.

Now, explanation of an acquiring method of such an AFM image should be omitted because it is a publicly known technique.

Next, a straight line is drawn in a diagonal line direction on the AFM image of 5 μm×5 μm acquired in this manner, each height of the convex portions 102*a*, the convex portions 102*b* and the convex portions 102*c* which crossed the straight line is measured, and an average value of measurement values of the height of convex portions is obtained.

Herein, height measurement is performed as follows. Specifically, when a substrate surface is observed from a perpendicular direction (stacking direction) to the substrate surface, and attention is paid to a convex portion X0, adjacent other convex portions X1, X2, X3, . . . Xn exist so as to surround the convex portion X0. A saddle point of a saddle between X0 and X1 is x1, and similarly saddle points of a saddle between X0 and other convex portions are x2, x3, . . . xn, and a difference between an average height of these saddle points and a height of the center of the convex portion X0 is obtained as the height.

Such a processing is performed to 25 randomly selected regions in total of 5 μm×5 μm, and an average value of the height of convex portions in each region is obtained. Then, a value obtained by further averaging average values obtained for 25 regions is calculated into an average height.

In the present invention, the average height of convex portions is brought into the range of 15 nm or more and 180 nm or less.

Further, although a fabricating method of convex portions will be described in detail later, it is possible to adjust the average height of the convex portions depending on dry etching conditions in performing dry etching in which the particle single layer film is used as an etching mask.

It is to be noted that a diameter and an average depth of the concave portions 108*a*, the concave portions 108*b* and the concave portions 108*c* which form the inverted uneven structure are the same as a diameter and an average height of the convex portions 102*a*, the convex portions 102*b* and the convex portions 102*c* respectively (refer to FIG. 10(*a*) (*b*)). Therefore, the average depth of the concave portions can be indirectly quantitated based on the average height of the convex portions.

On the other hand, in the case where the light extraction effect of the present invention is not given, which is the case of an uneven structure in which the particle single layer film having the unevenness structure formed by using the particles of the single particle diameter is formed as an etching mask for example, the power spectrum intensity has a value only in a single wave number, and it is not distributed over the entire wave number region having a width between the wave number $K_1$ and the wave number $K_2$, so it becomes difficult to stably obtain in light extraction effect in the case where a slight mismatch occurs between the extraction wavelength and the uneven structure.

(2-2-2) Anode Conductive Layer

Next, the anode conductive layer 102 is constituted of a transparent conductor which transmits target light.

The materials exemplified in the first embodiment for example can be used as such a transparent conductive material.

Further, in the second embodiment, the thickness of the anode conductive layer 102 should be 30 to 500 nm.

It is to be noted that the thickness of each layer constituting the organic light emitting diode 100 can be measured by a spectroscopic ellipsometer, a contact-type step meter, an AFM or the like.

(2-2-3) Organic EL Layer

In the second embodiment, a plurality of layers constitute the EL layer 106. In more detail, the EL layer is constituted by stacking the hole injection layer 106-1, the hole transport layer 106-2, the light emitting layer 106-3, the electron transport layer 106-4 and the electron injection layer 106-5.

A constitution of such an EL layer 106 includes at least a light emitting layer containing an organic light emitting material, and the layer may be constituted only of the light emitting layer. Generally, holes and electrons are efficiently injected to increase light emission efficiency by providing other layers different from the light emitting layer.

Further, the hole injection layer 106-1 and the electron injection layer 106-5 can be omitted depending on a layer constitution, and the electron transport layer 106-4 can be combined with the light emitting layer 106-3.

It is possible to use publicly known materials for materials constituting these layers.

As an organic light emitting material constituting the light emitting layer 106-3 out of the above-described layers, materials publicly known as an organic light emitting material constituting a light emitting layer of organic EL have been used.

As such an organic light emitting material, an organic semiconductor compound which generates fluorescence and/or phosphorescence, a compound formed by doping the organic semiconductor compound with another substance (host material), a compound formed by doping a doping material with the organic semiconductor compound, and the like are included for example.

Herein, as an organic semiconductor compound which generates fluorescence and/or phosphorescence, materials such as a pigment-based material, a metal complex-based material and a polymer-based material are known, and any of these materials may be used.

Then, as a specific example of the pigment-based organic compound, the above-described DPAVB, 2,3,6,7-tetrahydro-1,1,7,7-tetramethyl-1H,5H,11H-10-(2-benzothiazolyl)quinolizino[9,9a,1-gh] (hereinafter, abbreviated as coumarin C545T), 4,4'-bis(2,2-diphenyl-ethen-1yl)biphenyl (hereinafter, abbreviated as DPVBi) being distylarylene derivative, and the like are included for example.

Further, as a specific example of the metal complex-based organic compound, the above-described Alq, ZnPBO, Tris[1-phenylisoquinoline-C2,N]iridium(lll) (hereinafter, abbreviated as Ir(piq)$_3$) and the like are included for example.

Further, as a host material, a hole transport material, an electron transport material and the like (described later) can be utilized for example.

Moreover, as a doping material, materials used aiming at improving light emission efficiency, changing a wavelength of light to be generated, or the like such as 4,4'-bis(9-ethyl-3-carbazovinylene)-1,1'-biphenyl (hereinafter, abbreviated as BcZVBi) being distylarylene derivative are included for example.

Next, organic materials are used as materials constituting the hole injection layer 106-1, the hole transport layer 106-2 and the electron transport layer 106-4.

The above-described 2-TNATA and the like for example are included as a material constituting the hole injection layer 106-1, that is, a hole injection material.

Further, as a material constituting the hole transport layer 106-2, that is, a hole transport material, an aromatic amine compound such as the above-described TPD, CuPc, 4,4'-bis[N-1-napthyl]-N-phenyl-amino]-biphenyl (hereinafter, abbreviated as α-NPD) and the like are included for example.

Further, as a material constituting the electron transport layer 106-4, that is, an electron transport material, a metal complex-based compound such as an oxadiazole-based compound which is the above-described Alq, BND or PBD is included for example.

Further, lithium fluoride (LiF) and the like are included as a material constituting the electron injection layer 106-5.

Now, the electron injection layer 106-5 was used in this embodiment as the EL layer 106, but it is not essential to adopt the electron injection layer 106-5. However, it is possible to minimize a difference of work function when the electron injection layer 106-5 is provided between the electron transport layer 106-4 and the cathode conductive layer 108, which exerts an effect of facilitating transfer of electrons from the cathode conductive layer 108 to the electron transport layer 106-4.

However, by using magnesium alloy such as Mg/Ag=10/90 to 90/10 as the cathode conductive layer 108, the layer becomes a substitute for the electron injection layer, so in such a case, an electron injection effect is obtained even if the electron injection layer 106-5 is not provided.

Now, in the EL layer 106 fabricated by the material, it is preferable to form it keeping the overall thickness generally within 30 to 500 nm.

(2-2-4) Material Used for Cathode Conductive Layer

The cathode conductive layer 108 of the organic light emitting diode 100 according to this embodiment is constituted of a metal material.

As such a metal material, Ag, Au, Al or alloy having any one of them as a main component is included for example.

Herein, "having as a main component" means that percentage of metal such as Ag, Au and Al in the alloy is 70% by mass or higher.

Moreover, in the case of alloy, metal other than the main component of alloy includes Mg or the like.

Specifically, magnesium alloy such as Mg/Ag=10/90 to 90/10 (mass ratio) is included for example.

Now, in the cathode conductive layer 108 fabricated by the material, it is preferable to form it keeping the thickness generally within 50 to 3000 nm.

Explanation has been made above for the materials of each layer constituting the organic light emitting diode 100 according to the present invention, and a fabricating method of each layer constituting such an organic light emitting diode 100 will be explained below in detail.

Now, in this embodiment, a stacking method is adopted as the manufacturing method of the organic light emitting diode 100.

Herein, the stacking method is a technique of stacking layers starting from a layer being the bottom portion of the organic light emitting diode 100 in order by one layer at a time. In this embodiment, the transparent substrate 102 on the surface of which an uneven structure, in which a plurality of three types of convex portions 102a, 102b and 102c whose diameters are different from each other are two-dimensionally randomly arrayed, is provided is fabricated first (in this specification, such a process is appropriately referred to as "substrate fabricating process").

Next, on the uneven structure of the transparent substrate 102, the anode conductive layer 104, the EL layer 106 (the hole injection layer 106-1, the hole transport layer 106-2, the light emitting layer 106-3 (red light emitting layer), the electron transport layer 106-4, the electron injection layer 106-5), and the cathode conductive layer 108 are sequentially stacked (in this specification, such a process is appropriately referred to as "stacking process").

Hereinafter, the substrate fabricating process and the stacking process will be severally explained in detail.

(2-3) Substrate Fabricating Process

Firstly, the transparent substrate 102 is fabricated by a dry etching method for performing dry etching using a particle single layer film, which is formed on a substrate by using a mixture of a plurality of particles having different particle diameters (hereinafter, appropriately referred to as mixed particles), as an etching mask.

Herein, the dry etching method using the particle single layer film as an etching mask is a method for fabricating a transparent substrate having an uneven structure by depositing the particle single layer film on the water surface, transferring the film onto the substrate original plate surface by using the principle of the LB method explained in the first embodiment, and performing dry etching to the substrate original plate surface by using such a single layer film as an etching mask, which is disclosed in detail in the above-described Patent Document 4 for example.

In a conventional method, particles of a single particle diameter are used in order to obtain a two-dimensional close-packed lattice in which particle gaps are highly accurately controlled.

In other words, particles are two-dimensionally closely packed in the particle single layer film formed by using particles of a single particle diameter, so that when dry etching is performed to the substrate original plate surface by using the film as an etching mask, a two-dimensional lattice structure of a triangular lattice shape (hexagonal lattice shape) which is highly accurate as the uneven structure is formed.

The surface of a cathode conductive layer formed by using a substrate having the two-dimensional lattice structure of such a highly accurate triangular lattice shape (hexagonal lattice shape) is similarly a highly accurate two-dimensional lattice structure. So by using this, diffracted wave of surface plasmon can be obtained highly efficiently even in the case of a large area, light extraction efficiency improves, and it becomes possible to obtain a high-intensity organic light emitting diode.

However, the organic light emitting diode constituted on the substrate having the two-dimensional lattice structure manufactured by a conventional method is optimized such that light extraction efficiency improves at a specific single wavelength, there was a case where a light emission wavelength of the light emitting layer and an extraction wavelength misaligned depending on variation in manufacture of a pitch of the uneven structure, and improvement of extraction efficiency was not obtained.

Therefore, in the present invention, mixed particles by plural types (3 types are exemplified here) of particles having different particle diameters were used as particles constituting the particle single layer film.

Herein, as particle diameters to be selected, using diameters which are close to each other to some extent is effective in obtaining the effect of the present invention, but there is no specific rules as an indicator regarding approximation of particle diameters. Consequently, a plurality of particles diameters may be combined such that the power spectrum of the height distribution of the fine uneven structure has a finite value between the wave number $K_1$ and the wave number $K_2$, and the integrated value of the spectrum intensities within the wave number range has intensity 50% or higher of the entire spectrum intensity.

In the uneven structure by the particle single layer film formed in this manner, the plurality of convex portions 102a, convex portions 102b and convex portions 102c having different diameters are two-dimensionally randomly arrayed as explained above.

Then, since the power spectrum of the height distribution in such an uneven structure gives a finite value between the wave numbers $K_1$ and $K_2$, even if a slight variation occurs in manufacture of a pitch of the uneven structure, a lattice excellent in light extraction efficiency is stably provided without a misaligned relationship between the extraction wavelength and the uneven structure.

More particularly, the transparent substrate 102 can be fabricated by performing a process of coating the particle single layer film made of mixed particles on the surface of the substrate original plate being the prototype of the transparent substrate 102 (a transparent substrate before forming an uneven structure) (hereinafter, such a process is appropriately referred to as "coating process") and a dry etching process using the particle single layer film.

Hereinafter, the coating process and the dry etching process will be severally explained in detail.

(2-3-1) Coating Process

The coating process, as explained in the first embodiment, can be executed by performing: a particle single layer film forming process in which lower layer solution for developing mixed particles is poured into a trough, dispersion in which the mixed particles are dispersed into solvent is dripped onto the liquid surface of the lower layer solution, the particle single layer film made of the mixed particles is formed on the liquid surface by volatilizing the solvent; and a transfer process of transferring the particle single layer film onto the substrate.

In other words, in the coating process of coating an etching mask to be coated on the surface of the substrate original plate, only the particle single layer film is fabricated first (particle single layer film forming process), and the particle single layer film fabricated by the particle single layer film forming process is transferred onto the substrate original plate surface (transfer process).

Now, the explanation below showed an example of the case where hydrophilic solution was used as the lower layer solution, and hydrophobic organic solvent and mixed particles were used in the dispersion, but hydrophobic liquid may be used as the lower layer solution, and in such a case, hydrophilic mixed particles are used.

Hereinafter, the particle single layer film forming process and the transfer process will be severally explained in detail.

(2-3-2) Particle Single Layer Film Forming Process

As described above, the particle single layer film forming process of fabricating the particle single layer film to be coated on the substrate original plate surface is performed in the coating process. In this embodiment, as the particle single layer film forming process, a technique of obtaining the particle single layer film by developing solvent containing mixed particles on the surface of predetermined solvent pooled in the trough will be explained.

Firstly, the trough is prepared, and a predetermined liquid being the lower layer solution is poured into the trough. In this embodiment, water should be used as predetermined liquid pooled in the trough.

Next, dispersion is prepared by allowing mixed particles made up of particles having three types of different particle diameters to be dispersed in solvent such as predetermined organic solvent.

Herein, as a material of such three types of particles, three types of particles A, particles B and particles C (particle diameter should be "particle A>particle B>particle C") having a hydrophobic surface and different particle diameters from each other are used.

Then, as predetermined solvent for dispersing the particles A, the particles B and the particles C, highly volatile and highly hydrophobic solvent (chloroform, methanol, ethanol, methyl ethyl ketone, methyl isobutyl ketone, hexane or the like for example) is used.

The three types of particles A, particles B and particles C are added in the solvent and mixed, and dispersion in which the three types of particles A, particles B and particles C are dispersed in the solvent is prepared. It is preferable that particle concentration of such dispersion (total concentration of the particles A, the particles B and the particles C) be 1 to 10% by mass.

Then, the dispersion in which the particles A, the particles B and the particles C are dispersed is dripped onto the lower layer solution surface in the trough, and developed on the liquid surface of the lower layer solution in the trough.

It is preferable that drip rate of such dispersion onto the liquid surface of the lower layer water be 0.001 to 0.01 ml/second.

Now, when concentration of particles in the dispersion or drip rate are performed within the ranges described above, the particle single layer film in which a tendency such that particles partially aggregate into a cluster state to make 2 layers or more or a defect area where particles do not exist is generated is suppressed is easily obtained.

Then, by allowing a predetermined time to pass after the dripping, organic solvent out of the dispersion is volatilized, and the particle single layer film in which the mixed particles A, particles B and particles C are randomly two-dimensionally close-packed is formed on the lower layer liquid surface in the trough.

Herein, in a selection standard of the three types of particles A, particles B and particles C, when an uneven structure in which the convex portions 102a, the convex portions 102b and the convex portions 102c having different diameters from each other are two-dimensionally randomly arrayed was formed after dry etching, the power spectrum of the height distribution in the uneven structure selects particle diameters so as to give a finite value between the wave numbers $K_1$ and $K_2$ as explained above.

Specifically, by selecting the particles B having a particle diameter corresponding to the above emission spectrum peak $\lambda_{peak}$, and appropriately mixing them with the particles A and the particles C, adjustment is made such that the power spectrum of the height distribution in a resultant uneven structure takes a finite value between the wave number $K_1$ and the wave number $K_2$.

Since mixed particles are used in the present invention, variation occurs in the diameters and the distance between centers of a plurality of convex portions in the uneven structure. Such a variation utilizes a widened range of the wave number in which the spectrum intensity has a finite value compared to the case of having no variation.

Then, the range of the wave number in which the spectrum intensity has a finite value can be adjusted by the diameter of a plurality of convex portions in the uneven structure, a variation degree of a distance between centers with adjacent convex portions, particle size distribution of each of the three types of particles A, particles B and particles C, an average particle diameter, a mixture ratio of the three types of particles A, particles B and particles C, or the like.

Based on the conditions above, it is preferable that particle diameters of the three types of particles A, particles B and particles C be within the range of 10 nm or more and 2000 nm or less, and within the range of 50 nm or more and 1700 nm or less is more preferable.

Further, the particle diameter of each particle is a value of a primary particle diameter, and it can be obtained by a publicly known method from a peak which is obtained by fitting particle size distribution obtained by a dynamic light scattering method to Gaussian curve. Alternatively, the particle diameter may be measured by directly observing the particles in an AFM image or an SEM image.

Now, an example using particles of the three types of particle diameters is shown here, but the present invention is not limited to this, and particles having different particle diameters should only be two types or more.

In terms of equalizing the improvement of extraction efficiency effect in a narrow bandwidth, it is preferable that particles having different particle diameters be about two types to five types.

Next, regarding materials of the three types of particles A, particles B and particles C, metal such as Al, Au, Ti, Pt, Ag, Cu, Cr, Fe, Ni and Si, metal oxide such as $SiO_2$, $Al_2O_3$, $TiO_2$, $MgO_2$ and $CaO_2$, organic polymer such as polystyrene and polymethyl methacrylate, other semiconductor materials, inorganic polymer and the like are included for example.

Two types or more of these materials may be used in combination.

By selecting the materials of the three types of particles A, particles B and particles C and dry etching conditions (described later), a height and a shape of the convex portions 102a, the convex portions 102b and the convex portions 102c to be formed can be adjusted, and consequently, a depth and a shape of the concave portion 108a, the concave portion 108b and the concave portion 108c can be adjusted.

Further, as other conditions, because water is used as the lower layer solution in this embodiment, it is preferable that the surface of the three types of particles A, particles B and particles C is constituted of a hydrophobic material.

When the surface of the three types of particles is hydrophobic, in developing dispersion of particles on the liquid surface of the lower layer solution in the trough to form the particle single layer film, water is used as the lower layer solution and the particle single layer film can be easily formed as described above, and additionally, the particle single layer film can be easily moved on the substrate surface.

Particles of organic polymer such as polystyrene out of the materials of the three types of particles exemplified above can be directly used because they have a hydrophobic surface, and particles having hydrophilic surface out of the metal particles and the metal oxide particles can be used by changing the surface into hydrophobic by hydrophobic agent.

Herein, surfactant, alkoxysilane and the like for example are included as a hydrophobic agent.

The surfactant is effective in hydrophobizing a wide range of materials, and is preferable in the case where particles are made of metal, metal oxide or the like.

In the surfactant such a hydrophobic agent, cationic surfactant such as brominated hexadecyltrimethylammonium and brominated decyltrimethylammonium, anionic surfactant such as sodium dodecyl sulfate and sodium 4-octylbenzenesulfonate can be preferably used for example. Further, alkanethiol, disulphide compound, tetradecanoic acid, octadecanoic acid or the like can be also used.

As a method of hydrophobic processing using such surfactant, particles are dispersed in liquid such as organic solvent and water and the processing may be performed in the liquid, or may be performed to particles in a dry state.

In the case of performing the processing in the liquid, particles to be hydrophobized are added and dispersed into volatile organic solvent, which consists of one type or more of chloroform, methanol, ethanol, isopropanol, acetone, methyl ethyl ketone, ethyl ethyl ketone, toluene, n-hexane, cyclohexane, ethyl acetate, butyl acetate or the like for example, and after that, surfactant is mixed and dispersion may be further continued. As particles are dispersed in advance and then surfactant is added in this manner, a surface can be hydrophobized more uniformly. Dispersion after such hydrophobic processing can be also directly used as dispersion for dripping onto the liquid surface of the lower layer water.

In the case where particles to be hydrophobized is in the state of water dispersion, a method in which after adding surfactant to the water dispersion and conducting hydrophobic processing of particle surface in a water phase, organic solvent is added and hydrophobized particles are extracted in an oil phase is also effective. The dispersion obtained in this manner (dispersion in which particles are dispersed in organic solvent) can be directly used as dispersion for dripping onto the liquid surface of the lower layer water.

Now, in order to enhance the particle dispersibility of dispersion, appropriately selecting a type of organic solvent and a type of surfactant and combining them is preferable. By using dispersion having high particle dispersibility, particles can be prevented from aggregating in a cluster state, and a particle single layer film in which each particle is two-dimensionally close-packed is easily obtained. For example, in the case of selecting as organic solvent chloroform, it is preferable to use brominated decyltrimethylammonium as surfactant. In addition, a combination of ethanol and sodium dodecyl sulfate, a combination of methanol and sodium 4-octylbenzenesulfonate, a combination of methyl ethyl ketone and octadecanoic acid, or the like can be preferably exemplified.

Regarding a ratio between particles to be hydrophobized and surfactant, the mass of surfactant in the range of 1 to 20% to the mass of particles to be hydrophobized is preferable.

Further, in performing such hydrophobic processing, stirring the dispersion being hydrophobized or irradiating the dispersion with ultrasonic wave is also effective on the point of improving particle dispersibility.

A method of using alkoxysilane as a hydrophobic agent is effective in hydrophobizing particles such as Si, Fe and Al, or oxide particles such as $SiO_2$, $Al_2O_3$ and $TiO_2$.

However, not limited to these particles, the method is basically applicable to any particles as long as they are particles having the hydroxyl group or the like on a surface.

As alkoxysilane, other than the materials exemplified in the first embodiment, 3-aminopropyltrimethoxysilane, 3-aminopropyltriethoxysilane and the like are included for example.

In the case of using alkoxysilane as a hydrophobic agent, alkoxysilyl group in alkoxysilane is hydrolyzed into a silanol group, the silanol group is dehydrated and condensed into the hydroxyl group on the particle surface, by which hydrophobization is performed. Therefore, it is desirable to perform hydrophobization using alkoxysilane in the water.

In the case of performing hydrophobization in the water in this manner, it is preferable to use dispersant such as surfactant in combination for example to stabilize a dispersed state of mixed particles before hydrophobization. However, a hydrophobic effect of alkoxysilane could be reduced depending on a type of dispersant, a combination of dispersant and alkoxysilane is appropriately selected.

A specific method of hydrophobization by alkoxysilane is the same as the aforementioned method in the first embodiment, but as reaction time, particles should be reacted for predetermined time, preferably 0.5 to 12 hours, while being stirred in the range of room temperature to appropriately 40° C.

Further, since alkoxysilane other than amine series is hydrolyzed under the condition of acidity or alkalinity as explained in the first embodiment, a silanol group stabilizing effect is also obtained other than hydrolysis promotion according to a method for adding acetic acid aqueous solution at the concentration of 0.1 to 2.0% by mass for example, which is preferable.

Regarding a ratio between particles to be hydrophobized and alkoxysilane, the mass of alkoxysilane in the range of 1 to 20 times the mass of particles to be hydrophobized is preferable.

After performing reaction for predetermined time, one type or more out of the above-described volatile organic solvent are added to the dispersion, and particles hydrophobized in the water is extracted in an oil phase. On this occasion, a preferable volume of organic solvent to be added is the range of 0.3 to 3 times the dispersion before adding organic solvent. Dispersion obtained by oil phase extraction (dispersion in which particles are dispersed in organic solvent) can be directly used as dispersion for dripping onto the liquid surface of the lower layer water in the dripping process. Now, in such hydrophobic processing, in order to enhance particle dispersibility of dispersion being hydrophobized, it is preferable to execute stirring, ultrasonic wave irradiation or the like. By enhancing particle dispersibility of dispersion, particles can be prevented from aggregating in a cluster state, and the particle single layer film is easily obtained.

Herein, a method for reducing particle aggregation by ultrasonic wave irradiation will be explained below.

Firstly, as the particle single layer film forming process is performed while irradiating ultrasonic wave from the lower layer water toward a water surface, an effect of reducing an aggregation state of particles is obtained. On this occasion, an output of ultrasonic wave with the same condition as the output explained in the first embodiment can be adopted. Further, irradiation time of ultrasonic wave is acceptable as long as it is long enough for promoting single layering of particles, required time changes depending on a particle diameter, a frequency of ultrasonic wave, water temperature or the like, and the irradiation time explained in the first embodiment can be adopted.

When frequency (herein, indicates frequency of ultrasonic wave) is too high generally, energy absorption of water molecules begins, and a phenomenon of rising steam or water droplets from a water surface occurs, which is not preferable for the LB method used in the present invention. Further, when frequency is too low generally, a cavitation radius in the lower layer water becomes larger, and bubbles are generated in the water and float toward water surface. If such bubbles are accumulated under the particle single layer film, flatness of the water surface is lost, which is inconvenient in implementing the present invention. Further, ordinary wave is generated on the water surface by ultrasonic wave irradiation. If an output becomes too high or a wave height of the water surface becomes too high due to tuning conditions of an ultrasonic transducer and an oscillator, at any frequency, there is a possibility that the particle single layer film could be broken by a water wave.

Consequently, when the frequency of ultrasonic wave is appropriately set, single layering of particles can be effectively promoted without breaking a particle single layer film which is being formed. However, natural frequency becomes extremely high in particles having a small particle diameter of 100 nm or less for example, and it becomes difficult to give ultrasonic vibration according to a calculation result.

In such a case, necessary frequency can be reduced to a realistic range when calculation is performed on the assumption that natural vibration corresponding to a mass of particle dimer, trimer, . . . and to about icosamer is given. Single layering of particles is promoted even in the case where ultrasonic vibration corresponding to a natural frequency of an associated body of particles.

Advantages obtained by ultrasonic wave irradiation includes an effect of breaking a soft aggregate of particles which is easily generated in preparing dispersion, and an effect of restoring a point defect, a line defect, crystal transition or the like which is generated once to some extent, other than the promotion of single layering of particles.

As explained above, it is preferable to fabricate the particle single layer film in which the three types of particles A, particles B and particles C are randomly arranged by the materials mentioned above.

Herein, a forming principle of the particle single layer film will be explained, in which forming of the above-described particle single layer film is done by self-organization of particles.

Its principle is as follows. When particles move from a state where they float on a water surface and can randomly move to a state where the particles gather, surface tension functions due to a dispersion medium that exists between particles, and consequently, particles do not exist in a loose state, but automatically form a dense single layer structure on the water surface. Forming of such a dense structure by surface tension can be referred to as mutual adsorption of particles by capillary force in lateral directions in another way of expression.

For example, when three types of particles gather on the water surface in a floating state and come into contact with each other, surface tension functions so as to bring the total sum length of the waterline of a particle group to the minimum, the three types of particles are stabilized in an arrangement of a triangle basis (particles having different particle diameters do not make an equilateral triangle), by which the particle single layer film is formed.

If the waterline comes at the apex of the particle group, that is, in the case where particles submerge under the liquid surface, such self-organization does not occur, and the particle single layer film is not formed.

Therefore, in the case where either particles or the lower layer water is hydrophobic, it is important to make the other one hydrophilic to avoid submerging of the particle group under the liquid surface.

Therefore, it is preferable to use water as the lower layer solution as in the explanation above, and when water is used, relatively large surface free energy works, and a dense single layer structure of particles which were generated once can be stably kept on the liquid surface easily.

(2-3-3) Transfer Process

Next, a transfer process in which the particle single layer film created by the particle single layer film forming process is transferred onto the substrate original plate surface will be explained.

In the transfer process, transfer of the particle single layer film formed on the liquid surface of the lower layer water by the particle single layer film forming process is performed onto the substrate original plate being an etching object while the state of the single layer state is kept.

A specific method for transferring the particle single layer film onto the substrate original plate is not particularly limited, and there are a transfer method in which while the hydrophobic substrate original plate is kept in a substantially parallel state to the particle single layer film, the plate is allowed to go down from above and come into contact with the particle single layer film, and the particle single layer film is transferred onto the substrate original plate by affinity of the particle single layer film and the substrate original plate both of which are hydrophobic, similar to the transfer process in the first embodiment, and a method for transferring the particle single layer film onto the substrate original plate in which the substrate original plate is arranged in advance in the lower layer water of the trough in a substantially horizontal direction before forming the particle single layer film, and the liquid surface is gradually lowered after the particle single layer film is formed on the liquid surface, for example.

According to these methods, the particle single layer film can be transferred on the substrate without using a special apparatus. It is preferable to adopt the LB trough method explained in the first embodiment considering that the method is capable of easily transferring even a particle single layer film having a larger area on the substrate original plate while maintaining the closely packed state of particles.

Since the LB trough method used in this embodiment is the same technique as the LB trough method explained in the first embodiment, its explanation is omitted.

Now, in the second embodiment as well, a preferable diffusion pressure in compressing the particle single layer film is 5 to 80 mNm$^{-1}$, and is more preferably 10 to 40 mNm$^{-1}$. With such a diffusion pressure, a particle single layer film in which each particle is dense without a gap is easily obtained.

Further, preferable speed of pulling up the substrate original plate is 0.5 to 20 mm/minute.

As described above, according to the above-described transfer process, the substrate original plate surface can be coated by the particle single layer film.

If needed, a fixing process for fixing the particle single layer film onto the substrate original plate may be performed after the transfer process in the same method and the same conditions as the method shown in the first embodiment.

(2-4) Dry Etching Process

A transparent substrate 102 is obtained by performing dry etching to the substrate original plate surface which is coated by the particle single layer film in the manner above.

By performing dry etching to the substrate original plate surface coated by the particle single layer film, specifically, with the start of dry etching, etching gas passes through gaps between each particle constituting the particle single layer film to reach the surface of the substrate original plate, concave portions are formed on the positions, and convex portions begin to appear at positions corresponding to each particle.

Moreover, as dry etching is continuously conducted, particles on each convex portion are gradually etched and become smaller, and at the same time, concave portions engraved on the substrate original plate surface also become deeper, and finally the transparent substrate 102 having an uneven structure is fabricated on the substrate surface.

It is possible to perform such a dry etching process in the same method as the method explained in the first embodiment, and according to the dry etching process, by adjusting dry etching conditions such as bias power, gas flow rate, a type and an amount of deposition gas and the like, an average height and shapes of the convex portions 102a, 102b and 102c to be formed can be adjusted.

Further, although the gases exemplified in the first embodiment are included as etching gas used in dry etching for example, gas which does not affect the effect of the present invention is acceptable, and such gas is not limited to the gases above.

Then, one type or more out of the gases above are selected and used corresponding to particles constituting the particle single layer film, the material of the substrate original plate or the like.

Further, the processing of the dry etching should be performed by using an etching apparatus, and as an etching apparatus usable in this embodiment, a reactive ion etching apparatus, an ion beam etching apparatus or the like which is capable of anisotropic etching, and capable of generating bias electric field of about 20 W at the minimum should be used.

With such an etching apparatus, specifications in the apparatus such as a method of generating plasma, an electrode structure, a chamber structure, and frequency of a high frequency power source should not particularly be limited.

Further, in the present invention, it is preferable to set a material of particles constituting the particle single layer film, a material of the substrate original plate, a type of etching gas, bias power, antenna power, flow rate and pressure of gas, etching time and the like being each condition of etching such that an etching selective ratio in the dry etching process (etching rate of the substrate original plate/etching rate of the particle single layer film) can obtain a depth structure necessary in the fine uneven structure.

Therefore, in the case where colloidal silica particles are selected as particles constituting a particle single layer film etching mask, a quartz substrate is selected as a substrate, and they are combined for example, etching at a relatively low amplitude and pitch ratio can be performed by using gas such as Ar and $CF_4$ for etching gas.

Further, when the bias power of an electric field is set to from several tens to several thousand W (depending on an electrode area of a dry etching apparatus), positively charged particles in etching gas in a plasma state are accelerated, and made incident substantially perpendicularly to the substrate at high speed. Thus, in the case of using gas having reactivity to the substrate, a reaction rate of physical/chemical etching in a perpendicular direction can be increased.

Moreover, in dry etching, there are cases where isotropic etching by radicals generated by plasma occurs concurrently depending on a combination of a material of the substrate and a type of etching gas. Such etching by radicals is chemical etching, and isotropically etching is performed in any direction of an etching object.

Since radicals do not have charge, an etching rate cannot be controlled by setting of bias power, but is controlled by in-chamber concentration of etching gas.

Further, a certain degree of gas pressure must be maintained in order to perform anisotropic etching by charged particles, so that influence of isotropic etching cannot be brought to zero as long as reactive gas is used.

However, a technique of slowing down a reaction rate of radicals by cooling down a base material is widely used, and there are many apparatuses equipped with the mechanism, so it is preferable to use such an apparatus depending on a situation.

Further, in the dry etching process, by adjusting mainly bias power and pressure and by using so-called deposition gas in combination according to a situation, a two-dimensional lattice structure having a relatively low ratio between a bottom surface diameter and a height of a convex portion (bottom surface diameter/height of convex portion) can be formed on the substrate original plate surface.

The method for forming an uneven structure on the substrate original plate surface by the dry etching process was explained above, and a method for forming an uneven structure by using a template is included as another example of a method for forming an uneven structure.

More particularly, a substrate on the surface of which an uneven structure, in which a plurality of the convex portions 102a, 102b and 102c having different diameters from each other are previously two-dimensionally randomly arrayed, is provided is formed, and the transparent substrate 102 is fabricated by using the substrate as a template.

As such an uneven structure on the template surface is transferred to the substrate original plate by an even number of times, the uneven structure, in which a plurality of the convex portions 102a, 102b and 102c having different diameters from each other are two-dimensionally randomly arrayed, is engraved on the substrate original plate surface, and a transparent substrate having the uneven structure is obtained.

Further, as the uneven structure on the template surface is transferred to the substrate original plate by an odd number of times, a transparent substrate having an uneven structure, in which a plurality of the concave portions having different diameters from each other are two-dimensionally randomly arrayed on the substrate original plate surface, is obtained. The uneven structure of the transparent substrate surface is an inverted shape of the uneven structure of the template surface.

However, since the shape of fine unevenness becomes blunt as the number of transfers increases, 1 to 4 times are preferable as a practical number of transfer.

Transfer of such a structure of the template surface is a publicly known technique, and it can be executed by using a method such as a nanoimprint method, a hot press method, an injection molding method, and a UV embossing method for example as disclosed in Patent Document 4.

(2-5) Stacking Process

Next, process of stacking each layer constituting the organic light emitting diode 100 according to this embodiment will be explained below.

The organic light emitting diode 100 according to this embodiment can be acquired by sequentially stacking the anode conductive layer 104, the hole injection layer 106-1, the hole transport layer 106-2, the light emitting layer 106-3, the electron transport layer 106-4 and the electron injection layer 106-5 which are the EL layer 106, and the cathode conductive layer 108 on the surface of the transparent substrate 102 having the uneven structure fabricated as described above.

A stacking method of such each layer is not particularly limited, and a publicly known technique used in manufacture of a general organic light emitting diode can be used.

For example, the anode conductive layer 104 and the cathode conductive layer 108 can be severally formed by a sputtering method, a vacuum deposition method or the like.

Further, each layer of the EL layer 106 is formed by a vacuum deposition method.

Furthermore, since the thickness of the anode conductive layer 104 and the EL layer 106 is extremely thin, the uneven structure of the surface of the transparent substrate 102 is copied onto each layer as described above as each layer is sequentially stacked.

Therefore, the cathode conductive layer 108 stacked on the EL layer 106 has a shape in which the uneven structure is inverted on a rear surface.

By constituting an image display device such that the organic light emitting diode according to the present invention fabricated as described above is used at least in a part of the display device, it becomes possible to make the screen of the display device stably brighter than a conventional image display device.

Further, by constituting an illumination device such that the organic light emitting diode according to the present invention fabricated as described above is used at least in a part of the illumination device, it becomes possible to radiate stably brighter than a conventional illumination device.

As explained above, in the organic light emitting diode manufactured by the manufacturing method of the second embodiment of the present invention, the uneven structure formed on the substrate surface was formed in a random two-dimensional uneven structure by performing dry etching where the particle single layer film using a mixture of a plurality of particles having different particle diameters is used as an etching film, by which light extraction performance of electromagnetic wave in a narrow bandwidth from a visible light to near infrared region stably improves, and high-intensity light emission is obtained.

Therefore, in the organic light emitting diode 100 according to the second embodiment of the present invention, an extraction wavelength can be set to an arbitrary wavelength in the entire region from visible light to near infrared (380 nm to 2500 nm).

Then, by fabricating an image display device by utilizing such an organic light emitting diode 100, a long-life and low-power image display device can be fabricated.

Moreover, by fabricating an illumination device by utilizing such an organic light emitting diode 100, a long-life and low-power illumination device can be fabricated.

(3) Characteristics of the Organic Light Emitting Diode According to the Present Invention Regarding the organic light emitting diode 10 in which an element constitution is the cathode top emission-type and the organic light emitting diode 100 in which an element constitution is the bottom emission-type, which were explained in the above-described two embodiments, light extraction efficiency and light emission efficiency will be explained below by giving a specific example shown in FIG. 13.

Firstly, in the organic light emitting diode 10 being Example 1, the particle single layer film is formed by using only particles having a particle diameter of 524 nm as particles constituting the particle single layer film.

Then, assuming that the organic light emitting diode 10 equipped with the substrate having the uneven structure formed of such a particle single layer film is designed to emit light having a peak of emission spectrum at $\lambda_{peak}$=620 nm and a full width at half maximum of emission spectrum at 85 nm, a profile in the power spectrum of the height distribution of the fine uneven structure (hereinafter, appropriately referred to as "spectrum of the fine uneven structure") has a peak at $K_{peak}$=13.83 $\mu m^{-1}$. In that occasion, the full width at half maximum of the spectrum of the fine uneven structure is 1.04 $\mu m^{-1}$.

Herein, in $K_{peak}$ above as shown further in FIG. 13(*b*), regarding the spectrum of the fine uneven structure, the peak of wave number in the case of showing spectrum while the axis of abscissa takes wave numbers is $K_{peak}$.

Now, the spectrum of the fine uneven structure of such an organic light emitting diode 10 is conceptually shown as in FIG. 14(*b*).

Herein, FIG. 14(*a*) shows surface plasmon spectrum corresponding to the spectrum of a light emitting material having the wave number at 10.13 $\mu m^{-1}$ and the full width at half maximum at 1.391 $\mu m^{-1}$ while the axis of abscissa takes wave numbers. In the organic light emitting diode 10, an element structure is designed so as to emit light having the wave number of 10.13 $\mu m^{-1}$ in the spectrum of the fine uneven structure, so that it has a peak at a position having the same wave number as the spectrum of the light emitting material shown in FIG. 14(*a*).

When such a spectrum of FIG. 14(*a*) and the spectrum of Example 1 shown in FIG. 14(*b*) are compared, because the organic light emitting diode 10 is equipped with the substrate having an uneven shape, it is possible to obtain light of a narrow bandwidth despite that the diode emits light having the same wavelength as the spectrum of FIG. 14(*a*).

Next, an organic light emitting diode in Comparative Example 1 will be explained comparing with Example 1. As shown in FIG. 13(*a*), Comparative Example 1 uses a cathode top emission-type organic light emitting diode which does not use particles for forming the particle single layer film, that is, has a flat substrate which does not have an uneven shape.

As characteristics of such an organic light emitting diode which does not have an uneven shape, in the case of the organic light emitting diode in Comparative Example 1 which emits light having the peak of emission spectrum at $k_{peak}$=10.13 $\mu m^{-1}$ and the full width at half maximum of the peak at 1.391 $\mu m^{-1}$, light emitted from surface plasmon is not observed and thus improvement of light extraction efficiency is not obtained.

Next, light extraction efficiency of the organic light emitting diode 10 is obtained.

Overlapping of surface plasmon spectrum corresponding to emission spectrum in a visible light region (380 nm to 780 nm) and spectrum of the fine uneven structure obtained by the organic light emitting diode 10 will be explained.

In the two spectrums, the larger a ratio of overlapping becomes, the higher the light extraction efficiency corresponding to a light emission wavelength becomes.

In the case of calculating such a ratio of overlapping, the spectrum of a light emitting material is rewritten by using the wave numbers of surface plasmon on the axis of abscissa.

Herein, as shown in FIG. 14(*a*) for example, in order to convert the spectrum of the light emitting material into the wave number of surface plasmon, the techniques used in Example 1 and Example 2 can be utilized.

Next, spectrum intensity $I_m$, in which the wave numbers of surface plasmon of the light emitting material which is obtained above is taken on the axis of abscissa, is overlapped with spectrum intensity $I_s$ of the fine uneven structure of the organic light emitting diode 10.

Herein, FIG. 15(*a*) shows an example that the spectrum intensity $I_m$, in which the wave numbers of surface plasmon of the light emitting material are taken on the axis of abscissa (hereinafter, appropriately referred to as "spectrum intensity $I_m$ of the light emitting material") is shown by a solid line, and the spectrum intensity $I_s$ of the fine uneven structure is shown by a dashed dotted line and the two spectrums are overlapped state.

An overlapping ratio A is obtained by integrating a region where the two spectrum intensities overlap in this manner, and in the case of the overlapped state of FIG. 15(*a*), the overlapping ratio A can be calculated using Mathematical Formula (11) below by simplification as shown in FIG. 15(*b*).

[Mathematical Formula 11]

$$A=(k_0-K_3)^2/(K_0-k_3)^2 \quad (11)$$

Herein, in the spectrum intensity $I_m$ of the light emitting material in FIG. 15(*a*), a wave number at the peak should be $k_p$. Further, wave numbers of the spectrum intensity $I_m$ of the light emitting material at the full width at half maximum should be $k_1$ and $k_2$.

Specifically, the full width at half maximum is a sum of a distance between $k_p$-$k_2$ and a distance between $k_p$-$k_1$, and can be expressed as a distance between $k_1$-$k_2$.

Moreover, a point extended from the point $k_2$ of a half width of the spectrum intensity $I_m$ of the light emitting material by the same distance as the half width should be $k_3$, and a point extended from the point $k_1$ of a half width of the spectrum intensity $I_m$ of the light emitting material by the same distance as the half width should be $k_0$.

Similarly, in the spectrum intensity $I_s$ of the fine uneven structure in FIG. 15(*a*) as well, a wave number at the peak should be $K_p$. Further, wave numbers of the spectrum intensity $I_s$ of the fine uneven structure at the full width at half maximum should be $K_1$ and $K_2$. Then, the full width at half maximum is a sum of a distance between $K_p$-$K_2$ and a distance between $K_p$-$K_1$, and can be expressed as a distance between $K_2$-$K_1$.

Moreover, a point extended from the point $K_2$ of a half width of the spectrum intensity $I_s$ of the fine uneven structure by the same distance as the half width should be $K_3$, and a point extended from the point $K_1$ of a half width of the spectrum intensity $I_s$ of the fine uneven structure by the same distance as the half width should be $K_0$.

FIG. 15(*b*) shows a simplified version of the spectrum intensity $I_m$ of the light emitting material and the spectrum intensity $I_s$ of the fine uneven structure which were explained above as a rectangular function.

A rectangular function corresponding to the spectrum intensity $I_m$ of the light emitting material should be $I_m'$, and a rectangular function corresponding to the spectrum intensity $I_s$ of the fine uneven structure should be $I_s'$.

According to Mathematical Formula (11) above, an area A where a rectangle in a range from the point $k_3$ to the point $k_0$ by the rectangular function $I_m'$ of the spectrum of the light emitting material and a rectangle in a range from the point $K_3$ to the point $K_0$ by the rectangular function $I_s'$ of the spectrum of the fine uneven structure are overlapped can be calculated.

The overlapped area A calculated in this manner expresses "the ratio A (%) at which the spectrum intensity $I_m$ and the spectrum intensity $I_s$ are overlapped" shown in FIG. 13(*a*).

There are cases shown in FIG. 15(*c*) to FIG. 15(*f*) of overlapped states of the spectrum intensity of the spectrum intensity $I_m$ and the spectrum intensity $I_s$ other than FIG. 15(*b*), which are five patterns in total.

Therefore, in the case of the overlapped states in FIGS. 15(*c*) to 15(*f*), Mathematical Formulas (12), (13), (14) and (15) below are used in obtaining the overlapping ratio A corresponding to each case.

[Mathematical Formula 12]

$$A=(K_0-k_3)^2/(k_0-K_3)^2 \quad (12)$$

[Mathematical Formula 13]

$$A=(K_0-K_3)^2/(k_0-k_3)^2 \quad (13)$$

[Mathematical Formula 14]

$$A=(k_0-k_3)^2/(K_0-K_3)^2 \quad (14)$$

[Mathematical Formula 15]

$$A=0 \quad (15)$$

In such an overlapping ratio A, even if the peak of the spectrum of the fine uneven structure is misaligned from the peak of the spectrum of the light emitting material, an area where the spectrum of the light emitting material and the spectrum of the fine uneven structure are overlapped becomes larger when a value of the overlapping ratio A (%) is large, so the light extraction efficiency becomes better.

Herein, in the example in Example 1, the overlapping ratio A between surface plasmon spectrum corresponding to the spectrum of the light emitting material and spectrum of the fine uneven structure was extremely small in the visible light region.

In this case, for example, the overlapping ratio A of the spectrum of the fine uneven structure of the organic light emitting diode 10 of Example 1 shown in FIG. 14(*b*) to the surface plasmon spectrum corresponding to the spectrum of the light emitting material having the wavelength of 620 nm shown in FIG. 14(*a*) is extremely small, which is a state where the spectrum of the fine uneven structure is included in the spectrum of the light emitting material.

In such an organic light emitting diode 10 of Example 1, an element structure is designed so as to extract only light having the wavelength of wavelength 620 nm.

Next, current efficiencies of the organic light emitting diode 10 in Example 1 and the organic light emitting diode in Comparative Example 1 are compared. As current efficiency (cd/A) was measured at the unit current quantity of 12.5 mA/cm² for each diode, the organic light emitting diode 10 in Example 1 had the current efficiency of 0.76 cd/A, and the organic light emitting diode in Comparative Example 1 had the current efficiency of 0.32 cd/A.

Now, the current efficiency of the organic light emitting diode 10 in Example 1 had luminance 2.38 times that of the organic light emitting diode in Comparative Example 1.

Next, electric power efficiencies of the organic light emitting diode 10 in Example 1 and the organic light emitting diode in Comparative Example 1 are compared. As electric power efficiency (lm/W) was measured at the unit current quantity of 12.5 mA/cm² for each diode, the organic light emitting diode 10 in Example 1 had the electric power efficiency of 0.371 m/W, and the organic light emitting diode in Comparative Example 1 had the electric power efficiency of 0.131 m/W.

Now, the electric power efficiency of the organic light emitting diode 10 in Example 1 had electric power efficiency 2.85 times that of the organic light emitting diode in Comparative Example 1.

Next, in the organic light emitting diode 100 being Example 2, particles constituting the particle single layer film should form the particle single layer film by particles with particle diameters 410 nm, 360 nm and 305 nm. A combination ratio of the particles should be in the percentage of 410 nm:360 nm:305 nm=25:50:25.

Then, the organic light emitting diode 100 equipped with the substrate having the uneven structure formed of such a particle single layer film is designed to emit light having a peak of emission spectrum at $\lambda_{peak}$=620 nm and a full width at half maximum of emission spectrum at 85 nm, spectrum of the light emitting material by the fine uneven structure, that is, spectrum of the fine uneven structure has a peak at $K_{peak}$=17.49 $\mu m^{-1}$. In that occasion, the full width at half maximum of the spectrum of the fine uneven structure is 3.59 $\mu m^{-1}$.

Further, as shown in FIG. 13(c), the peak of a wavelength in the case of showing spectrum while wavelength of spectrum of the fine uneven structure are taken on the axis of abscissa is $K_{peak}$.

Figure 14A:
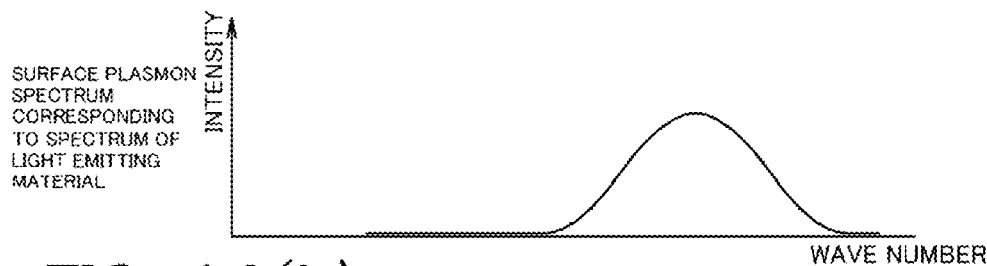
FIG. 14(a) is an explanatory view conceptually showing a spectrum of surface plasmon corresponding to a spectrum of a light emitting material having a peak at 620 nm.
Figure 14B:
FIG. 14(b) is an explanatory view conceptually showing a spectrum of the fine uneven structure by a specific example of the organic light emitting diode 10 of the first embodiment shown in FIG. 13(a)
Figure 14C:
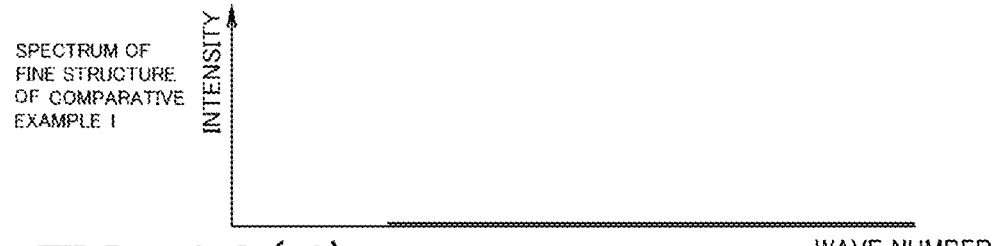
FIG. 14(c) is an explanatory view conceptually showing a spectrum of a fine uneven structure of Comparative Example 1 shown in FIG. 13(a)
Figure 14D:
FIG. 14(d) is an explanatory view conceptually showing a spectrum of fine uneven structure of by a specific example of the organic light emitting diode 100 of the second embodiment shown in FIG. 13(a)

Now, the spectrum of the fine uneven structure of such an organic light emitting diode 100 is conceptually shown in FIG. 14(d).

Similar to Example 1, the spectrum of Example 2 shown in FIG. 14(d) is the spectrum of the organic light emitting diode 100 equipped with the substrate having an uneven shape, but the peak of the spectrum of the fine uneven structure has a different peak from the spectrum of the light emitting material shown in FIG. 14(a).

Next, the organic light emitting diode in Comparative Example 2 will be explained comparing with Example 2. As shown in the table of FIG. 13(a), Comparative Example 2 should use a bottom emission-type organic light emitting diode in which an uneven structure is formed by using particles having only particle diameter 410 nm as particles for forming the particle single layer film.

Figure 14E:
FIG. 14(e) is an explanatory view conceptually showing a spectrum of a fine uneven structure of a Comparative Example 2 shown in FIG. 13(a).

The organic light emitting diode having such an uneven shape of Comparative Example 2 also should have the peak of emission spectrum at $\lambda_{peak}$=620 nm and the full width at half maximum at 85 nm, and the spectrum of the fine uneven structure is conceptually shown in FIG. 14(e).

Next, light extraction efficiency of the organic light emitting diode 100 is obtained.

Herein, overlapping of the surface plasmon spectrum corresponding to the spectrum of the light emitting material and the spectrum of the fine uneven structure obtained by the organic light emitting diode 100 in the visible light region (380 nm to 780 nm) will be examined.

In the case of calculating such a ratio of overlapping, the spectrum of the light emitting material is expressed by a wave number of corresponding surface plasmon first in the same manner as the case of Example 1.

Figure 15A:
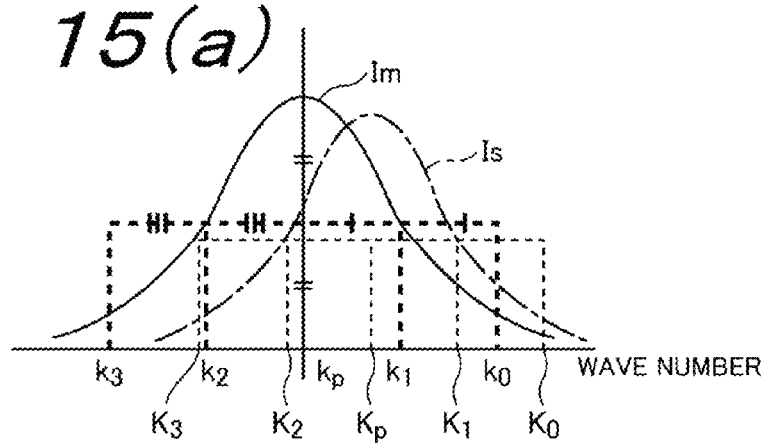
FIG. 15 is a conceptual explanatory view explaining ratios in which spectrum intensity of surface plasmon corresponding to a spectrum of the light emitting material and spectrum intensity of the fine uneven structure are overlapped.
Figure 15B:
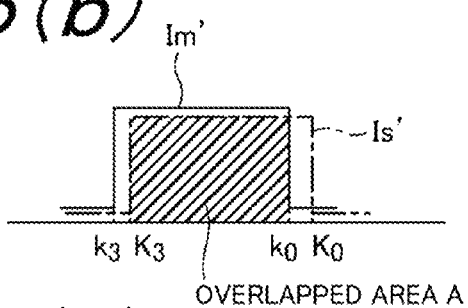
Figure 15C:
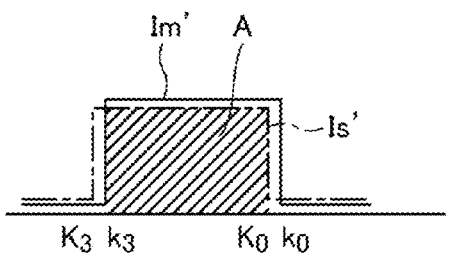
Figure 15D:
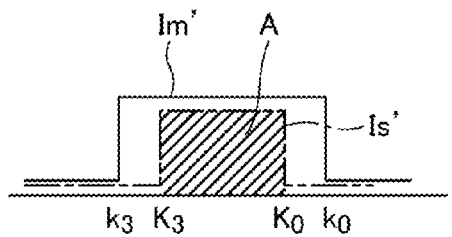
Figure 15E:
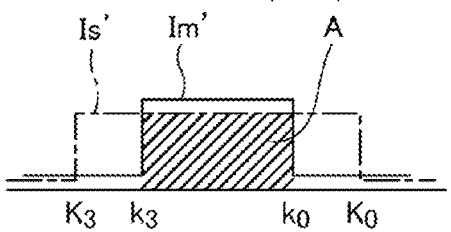
Figure 15F:
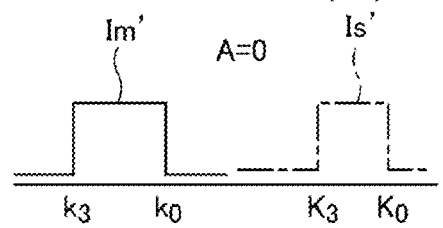

Then, the spectrum intensity $I_m$ of the light emitting material obtained above is overlapped with the spectrum intensity $I_s$ of the fine uneven structure of the organic light emitting diode 100, and a value of the overlapped area A shown in FIG. 15(b) is obtained by using Mathematical Formula (13) in the same manner as the case of Example 1.

In the example of Example 2, a ratio at which the spectrum intensity $I_m'$ of the light emitting material overlapped with the spectrum intensity $I_s'$ of the fine uneven structure in the visible light region was 82.5%.

Further, in the case of Comparative Example 2 which is an organic light emitting diode having an uneven structure formed of one type of particles, the overlapping ratio was 35.2%.

In this case, a ratio at which the surface plasmon spectrum of the spectrum of the light emitting material with the wavelength of 620 nm shown in FIG. 14(a) is overlapped with the spectrum of the fine uneven structure of the organic light emitting diode 100 in Example 2 shown in FIG. 14(d) is 82.5%, and because the diode has the uneven structure formed of the three types of particles, the spectrum peak is broadened and the peak of the spectrum of the fine uneven structure is misaligned from 620 nm, but it is possible to cover 82.5% to the light of 620 nm.

On the other hand, in Comparative Example 2, the spectrum peak makes a narrow bandwidth, and furthermore its spectrum peak is misaligned from 620 nm, so only 35.2% is covered to the light of 620 nm.

Next, current efficiencies of the organic light emitting diode 100 in Example 2 and the organic light emitting diode in Comparative Example 2 are compared. As current efficiency (cd/A) was measured at the unit current quantity of 12.5 mA/cm² for each diode, the organic light emitting diode 100 in Example 2 had the current efficiency of 0.65 cd/A, and the organic light emitting diode in Comparative Example 2 had the current efficiency of 0.4 cd/A.

Now, the current efficiency of the organic light emitting diode 100 in Example 2 had luminance 1.63 times that of the organic light emitting diode in Comparative Example 2.

Next, the electric power efficiencies of the organic light emitting diode 100 of Example 2 and the organic light emitting diode of Comparative Example 2 are compared. As electric power efficiency (lm/W) was measured at the unit current quantity of 12.5 mA/cm² for each diode, the organic light emitting diode 100 in Example 2 had the electric power efficiency of 0.321 m/W, and the organic light emitting diode in Comparative Example 2 had the electric power efficiency of 0.191 m/W.

Now, the electric power efficiency of the organic light emitting diode 100 in Example 2 was 1.68 times that of the organic light emitting diode in Comparative Example 2.

As explained above, according to the first embodiment and the second embodiment of the present invention, it is possible to realize the light extraction efficiency and the light emission efficiency shown above.

Further, as other effects, other effects that the organic light emitting diode manufactured by the manufacturing method of the second embodiment of the present invention has will be explained below. Generally, in the case where light is emitted by using the organic light emitting diode having a flat substrate as in Comparative Example 1, it has a characteristic that light intensity spreads isotropically according to Lambert's law.

Further, in the organic light emitting diode 10 having a substrate of an uneven structure by one type of particle diameter as in Example 1, a wavelength for light emission and wavelength for surface plasmon are matched, and has a characteristic that directivity becomes higher, light is emitted strongly in one direction, light emission in other directions becomes weaker. For example, in the case of using a lattice which strongly emits light in a front direction, light emitted in lateral directions becomes weaker.

However, according to the organic light emitting diode 100 by the second embodiment of the present invention, it exerts an effect of having a characteristic that directivity of emitted light is decreased comparing to the case of Example 1 and light is isotropically emitted unlike the directivity of light in Example 1 despite that the substrate is structured to have an uneven structure.

Now, the above-described embodiments may be modified as shown in (1) to (14) below.

(1) In the above-described first embodiment, the metal layer 18-1 constituting the cathode conductive layer 18 was constituted of Ag, alloy with the content of Ag at 70% or higher, Al, or alloy with the content of Al at 70% or higher. However, it goes without saying that the invention is not limited to this, and publicly known metal used as a cathode conductive layer of the organic light emitting diode may be used for the metal layer 18-1.

(2) In the above-described first embodiment, the organic EL layer 16 was constituted of five layers of the hole injection layer 16-1, the hole transport layer 16-2, the light emitting layer 16-3, the electron transport layer 16-4 and the electron injection layer 16-5, it goes without saying that the invention is not limited to this.

For example, one layer may combine functions of two or more layers out of the hole injection layer 16-1, the hole transport layer 16-2, the light emitting layer 16-3, the electron transport layer 16-4 and the electron injection layer 16-5.

Further, although the light emitting layer 16-3 is essential, the other layers which are the hole injection layer 16-1, the hole transport layer 16-2, the electron transport layer 16-4 and the electron injection layer 16-5 may be omitted for example.

In this case, as the simplest constitution, the organic EL layer 16 may be constituted of the light emitting layer 16-3 only.

Now, in the case where the electron injection layer 16-5 is omitted and the cathode conductive layer 18 combines the function of the electron injection layer 16-5, the metal layer 18-1 may be constituted of magnesium alloy of Mg/Ag=10/90 or the like for example.

(3) In the above-described first embodiment, the particle diameter of particles which form the particle single layer film was determined focusing on the surface plasmon resonance on the rear surface 18-1c of the metal layer 18-1, but it goes without saying that the invention is not limited to this, and the particle diameter of particles which form the particle single layer film may be determined focusing on the surface plasmon resonance on the surface 18-1a of the metal layer 18-1 and the reflective layer 22.

(4) In the above-described first embodiment, the plurality of convex portions 12b arrayed periodically and two-dimensionally were constituted on the surface 12a of the substrate 12 in fabricating the organic light emitting diode 10, but it goes without saying that the invention is not limited to this, and a plurality of concave portions arrayed periodically and two-dimensionally may be constituted on the surface 12a of the substrate 12.

Specifically, as a technique of fabricating a concave portion-type fine uneven structure on the substrate, a method for fabricating an inverted mold on a resin layer coated on the substrate by using the nanoimprint method, or the like can be utilized.

Further, a method in which after metal such as Cr and Ni is vapor-deposited on a particle mask (particle single layer film fabricated by particles having a particle diameter calculated by the above-described mathematical formula), which is fabricated on the substrate, the particles are removed, dry etching is performed to the substrate by using a metal vapor deposition layer residual on the substrate (a mesh structure in which holes are formed in positions where particles existed) as a mask, and a concave portion structure is fabricated in positions where metal did not exist, or the like can be utilized.

Now, the substrate having a structure in which a plurality of concave portions are arrayed periodically and two-dimensionally on the surface, which is formed in this manner, is used as a template, the structure of the template surface transferred onto the substrate original plate, by which the two-dimensional lattice structure may be fabricated on the surface 12a of the substrate 12.

(5) In the above-described first embodiment, a structure equivalent to the two-dimensional lattice structure by the plurality of convex portions 12b formed on the surface 12a of the substrate 12 was formed on the reflective layer 22, the anode conductive layer 14, the organic EL layer 16 and the cathode conductive layer 18, but it goes without saying that the invention is not limited to this. The two-dimensional lattice structure may be formed only on layers formed of a metal material, that is, the reflective layer 22 and the metal layer 18-1 of the cathode conductive layer 18, or the two-dimensional lattice structure may be formed on only either one of the reflective layer 22 and the metal layer 18-1. Moreover, in the metal layer 18-1, the two-dimensional lattice structure may be formed only on either one of the surface 18-1a (namely, the surface of a side where the transparent conductive layer 18-2 is positioned) and the rear surface (namely, the surface of a side where the substrate 12 or the organic EL layer is positioned).

(6) In the above-described second embodiment, a columnar shape, a cone shape, a truncated cone shape, and a sinewave shape may be employed for example, and a derived shape based on these shapes and the like may be employed as the shape of the uneven structure of the convex portions 12a, the convex portions 12b and the convex portions 12c.

(7) In the above-described second embodiment, a mixture of the three types of particles having different particle diameters was used as particles for fabricating an uneven structure on the surface of the transparent substrate 102 in the embodiment described above, but the invention is not limited to this, and the structure may be constituted of a mixture of two to five types of particle diameters.

Then, in the case of using a mixture of such various types of particle diameters, it is preferable to bring the coefficient of variation in the particle diameter to 20% or less.

Further, with particles having wide particle size distribution, it is possible to obtain the effect of the gist of the present invention even by one type of particle diameter.

Herein, in the case of constituting a particle mask by one type of particle diameter, it is possible to take the coefficient of variation in the particle diameter within the range of 10 to 500%.

It is possible to obtain the effect of the gist of the present invention even when a particle mask is constituted by combining particles having the coefficient of variation in the particle diameter from 0 to 10% and from 10 to 500%.

(8) In the above-described second embodiment, the EL layer 106 was constituted of five layers of the hole injection layer 106-1, the hole transport layer 106-2, the light emitting layer 106-3, the electron transport layer 106-4 and the electron injection layer 106-5, but the present invention is not limited to this, and one layer may combine functions of two types or more layers out of the hole injection layer 106-1, the hole transport layer 106-2, the light emitting layer 106-3, the electron transport layer 106-4 and the electron injection layer 106-5 for example.

Furthermore, regarding layers other than the light emitting layer 106-3, it is also possible to omit the hole injection layer 106-1, the hole transport layer 106-2, the electron transport layer 106-4 and the electron injection layer 106-5, and the EL layer 106 may be constituted of the light emitting layer 106-3 only which is an organic EL layer of the simplest constitution.

(9) Although the above-described second embodiment showed an example in which the electron injection layer 106-5 was provided, the cathode conductive layer 108 may combine the function of the electron injection layer.

In the cathode conductive layer 108, an electron injection effect is obtained by constituting the cathode conductive layer 18 by magnesium alloy such as Mg/Ag=10/90 for example, so that it is possible for the layer to combine the function of the electron injection layer.

In such a case, the cathode conductive layer 18 provided with the function of the electron injection layer may be used instead of providing the electron injection layer 106-5.

(10) In the above-described second embodiment, layers were stacked on the transparent substrate 102 in the order of the anode conductive layer 104, the EL layer 106, and the cathode conductive layer 108, but the invention is not limited to such an order, and a stacking order may be inverted.

Specifically, layers may be stacked on the transparent substrate 102 in the order of the cathode conductive layer 108, the EL layer 106, and the anode conductive layer 104.

In such a case, the stacking order of the hole injection layer 106-1, the hole transport layer 106-2, the light emitting layer 106-3, the electron transport layer 106-4 and the electron injection layer 106-5, which constitute the EL layer 106, is also inverted.

(11) In the above-described second embodiment, an example was shown that the cathode conductive layer 108 was constituted of the cathode conductive layer 108 only being a metal layer, but the cathode conductive layer 108 may be constituted of a multi-layer structure in which a plurality of layers are stacked.

In the case of the cathode conductive layer with such a multi-layer structure, at least one layer should only be formed of a metal layer, other layers other than the metal layer may be fabricated by a metal material or may also be fabricated by a conductive material other than metal.

Herein, as an example of a conductive material other than metal, ITO, IZO, ZnO, ZTO and the like exemplified as a material constituting the anode conductive layer 104 are included for example.

(12) In the above-described second embodiment, a bottom emission method, in which a light extraction surface is the surface on the transparent substrate 102 side, was taken as a light extraction method of an organic light emitting diode, but the present invention is not limited to this, and it may be a top emission method in which a light extraction surface is a surface on the opposite side of the transparent substrate 102 side (the top surface of stacking).

In the case of the top emission method, the top surface of stacking may be either the cathode conductive layer or the anode conductive layer.

However, in any case, in order to transmit light radiated from the organic EL layer side, it is necessary to fabricate the top surface by a transparent or a translucent material.

Further, in the case of the top emission method, the substrate is not limited to a transparent substrate.

Hereinafter, a stacking constitution generally used in the above-described light extraction method is shown.

(i) Bottom Emission Method

In the bottom emission method, the light extraction surface should be a transparent substrate as explained in this embodiment.

As a stacking order, layers should be stacked in the order of the transparent substrate, the anode conductive layer, the organic EL layer and the cathode conductive layer, and as the organic EL layer, layers should be stacked in the order of the hole injection layer, the hole transport layer, the light emitting layer, the electron transport layer and the electron injection layer in order from the anode conductive layer side.

Further, the transparent substrate should have an uneven structure on the surface, the anode conductive layer should be a transparent conductor layer, and the cathode conductive layer should be a metal layer.

(ii) First Top Emission Method

Figure 16:
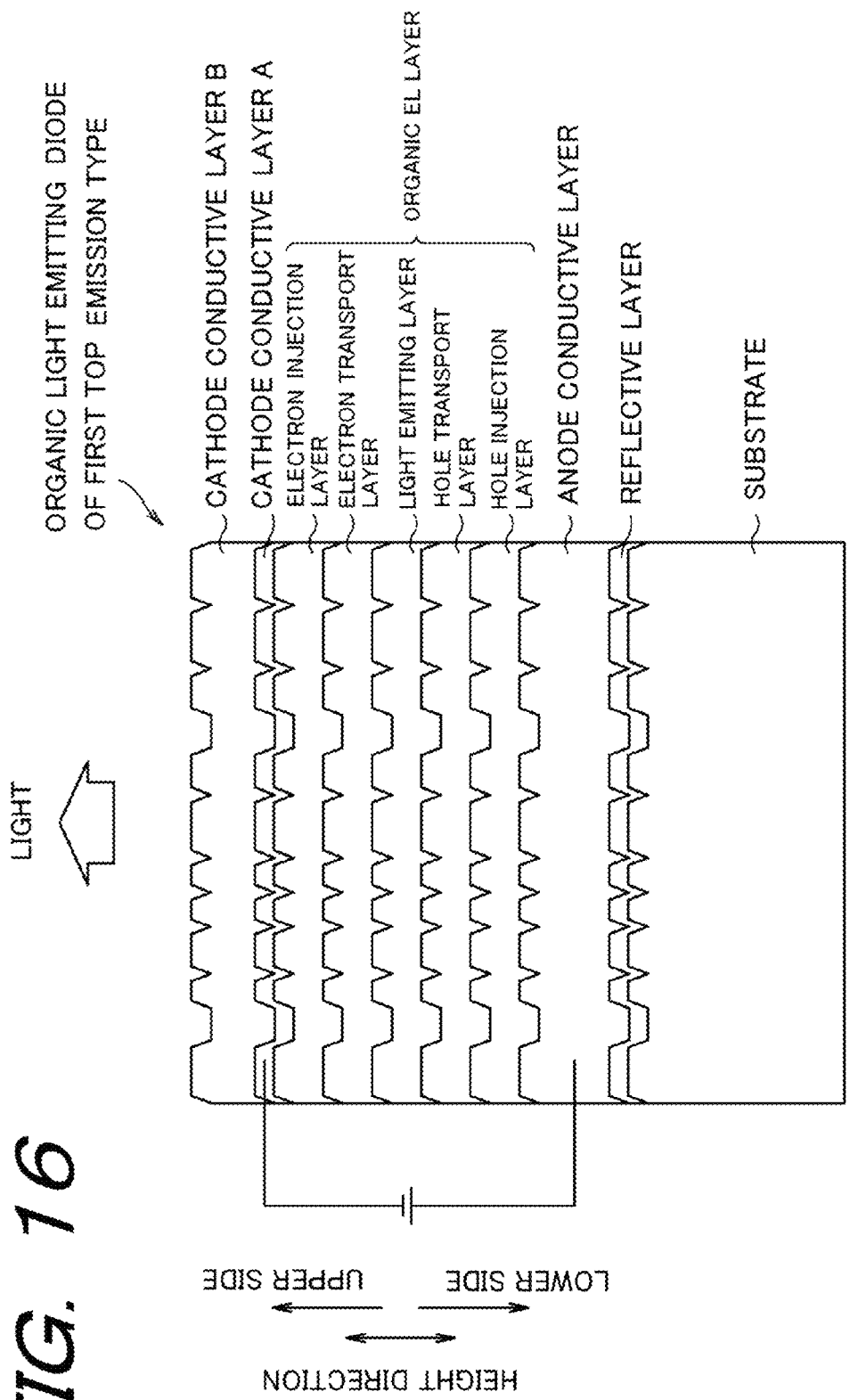
FIG. 16 is a schematic constitution cross-sectional explanatory view showing an example of a structure of the top emission-type organic light emitting diode according to the present invention.

In the first top emission method using the technique by the second embodiment, the light extraction surface should be a cathode conductive layer as shown in FIG. 16.

As a stacking order, layers should be stacked in the order of the substrate, the reflective layer, the anode conductive layer, the organic EL layer, a cathode conductive layer A and a cathode conductive layer B, and as the organic EL layer, layers should be stacked in the order of the hole injection layer, the hole transport layer, the light emitting layer, the electron transport layer and the electron injection layer in order from the anode conductive layer side.

Further, the substrate should have an uneven structure on the surface, the anode conductive layer should be a transparent conductor layer, the cathode conductive layer A should be a translucent metal layer, and the cathode conductive layer B should be a transparent conductor layer.

(iii) Second Top Emission Method

Figure 17:
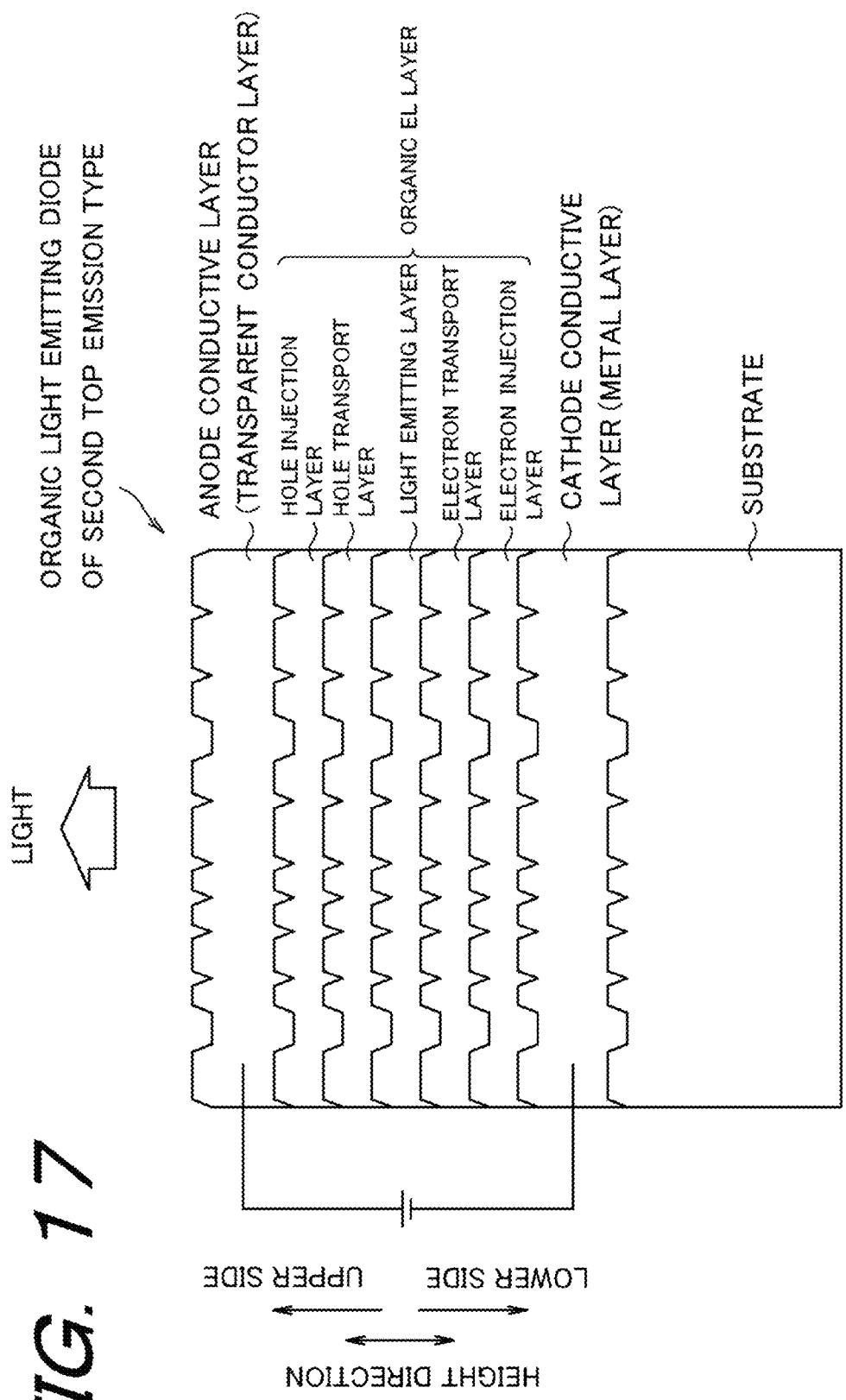
FIG. 17 is a schematic constitution cross-sectional explanatory view showing an example of a structure of the top emission-type organic light emitting diode according to the present invention.

In the second top emission method using the technique by the second embodiment, the light extraction surface should be an anode conductive layer as shown in FIG. 17.

As a stacking order, layers should be stacked in the order of the substrate, the cathode conductive layer, the organic EL layer and the anode conductive layer, and as the organic EL layer, layers should be stacked in the order of the electron injection layer, the electron transport layer, the light emitting layer, the hole transport layer and the hole injection layer in order from the cathode conductive layer side.

Further, the substrate should have an uneven structure on the surface, the cathode conductive layer should be a metal layer, and the anode conductive layer should be a transparent conductor layer.

In the first top emission method shown in (ii) out of the above-described methods, the reflective layer is provided to prevent light from coming out from the substrate side and to extract light, which traveled to the substrate side, by reflecting to a stacking side. The reflective layer is generally constituted of metal. As the metal, aluminum, silver, or other various types of metal can be used for example.

Further, the cathode conductive layer A is translucent in order to extract light from the top surface of stacking. Transparency of the cathode conductive layer A is adjusted by film thickness. The thickness of the cathode conductive layer A is generally set to about 10 to 50 nm to make it translucent. As metal constituting the cathode conductive layer A, metal similar to the metal exemplified as metal constituting the cathode conductive layer 108 is included, and metal selected from gold, silver and aluminum is preferably used. On this occasion, magnesium may be mixed at the concentration of 10 to 90% in order to combine the function of the electron injection layer.

Further, the cathode conductive layer B is provided because a thickness of the cathode conductive layer A is too thin to obtain sufficient current. As a transparent conductor constituting the cathode conductive layer B, ITO, IZO, ZnO, ZTO and the like exemplified as a material constituting the anode conductive layer 104 are included for example.

(13) In the above-described second embodiment, the bottom emission method in which the light extraction surface was the surface on the transparent substrate 102 side was used as a light extraction method of the organic light emitting diode, but the present invention is not limited to this, and a diffusion film may be disposed on the transparent substrate 102 being the light extraction surface.

Figure 18:
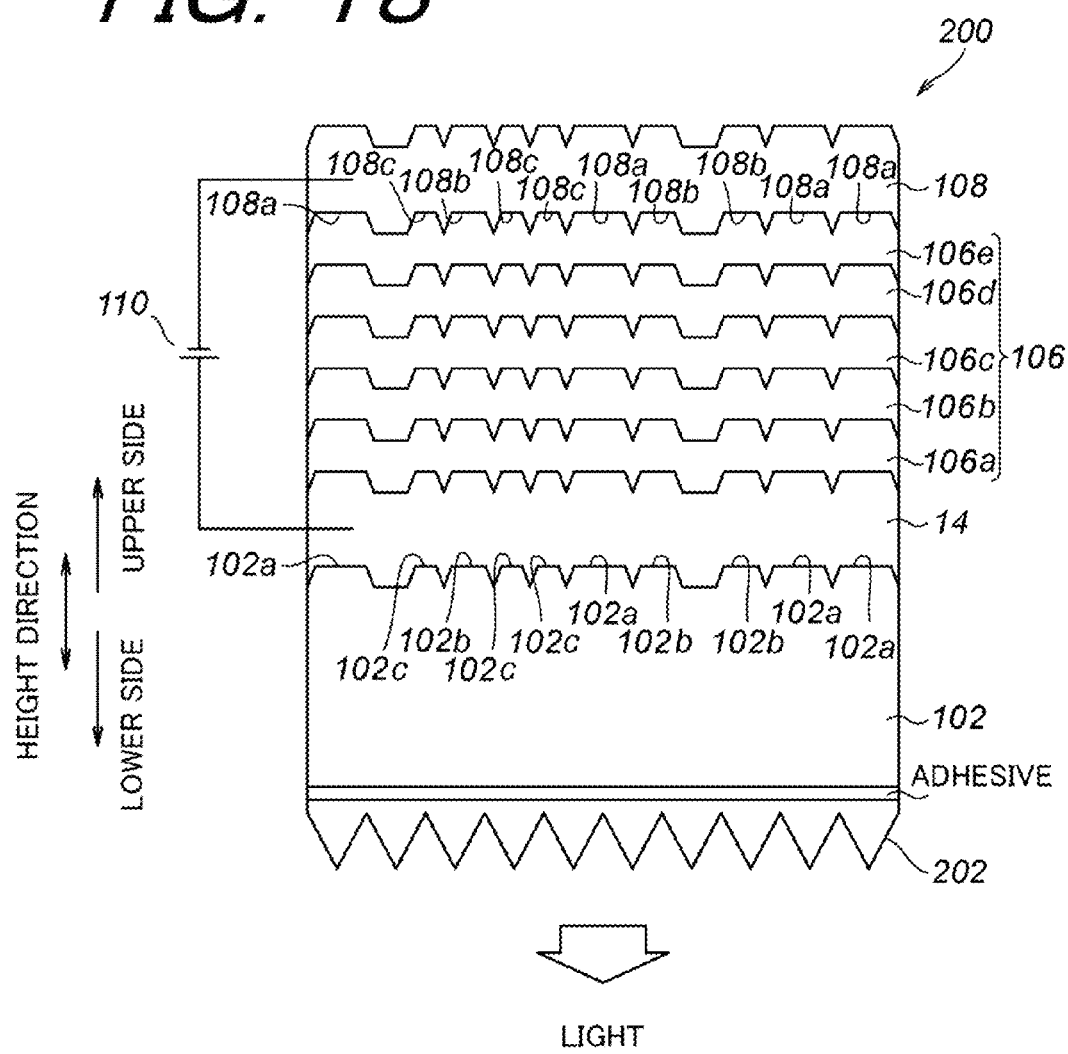
FIG. 18 is a schematic constitution cross-sectional explanatory view showing a modified example of a structure of the bottom emission-type organic light emitting diode according to the present invention.

FIG. 18 illustrates an organic light emitting diode 200 in which a pyramid film 202 is disposed as a diffusion film. Herein, the pyramid film 202 is a film on which pyramidal uneven shapes are arrayed at a constant pitch. Now, its array may be either a one-dimensional array or a two-dimensional array.

Such an organic light emitting diode 200 is different on constitution from the organic light emitting diode 100 shown in FIG. 8 only on the point that the pyramid film. 202 is disposed on a lower side of the substrate 102.

In detail, a surface on the lower side of the substrate 102 of the organic light emitting diode 200 and the pyramid film 202 are fixed by adhesive.

Then, it is preferable that such a substrate 102, adhesive and pyramid film 202 have the same refraction index with each other.

By providing a diffusion film such as the pyramid film 202, extraction efficiency of light of a substrate mode, that is, light propagating in the substrate improves.

Now, as the diffusion film, a film of microlens is included other than the pyramid film.

It is preferable that a pitch of unevenness of the diffusion film used in the organic light emitting diode 200 be 1 μm or more, and more preferably, a film having a pitch of 5 to 20 μm may be used.

Further, as described above, an array of unevenness of the diffusion film may be either a one-dimensional array or a two-dimensional array, but the two-dimensional array is more preferable.

(14) The above-described embodiments and modified examples shown in (1) to (13) above may be appropriately combined.

INDUSTRIAL APPLICABILITY

The present invention is preferably used as an organic light emitting diode used in an image display device or an illumination device.

DESCRIPTION OF REFERENCE NUMERALS 10, 100, 200 Organic light emitting diode
12, 102 Substrate
14, 104 Anode conductive layer
16, 106 Organic EL layer
16-1, 106-1 Hole injection layer
16-2, 106-2 Hole transport layer
16-3, 106-3 Light emitting layer
16-4, 106-4 Electron transport layer
16-5, 106-5 Electron injection layer
18, 108 Cathode conductive layer
18-1 Metal layer
18-2 Transparent conductive layer
20, 110 Power source
22 Reflective layer

The invention claimed is:

1. A top emission-type organic light emitting diode, in which
at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and
a two-dimensional lattice structure, in which a plurality of convex portions are arrayed periodically and two-dimensionally, is formed on a surface of said semi-transmissive metal layer which is in contact with said transparent conductive layer side, wherein
assuming that a real part of a propagation constant of surface plasmon on said surface, which is expressed by a complex number, is k, a center-to-center distance P between adjacent convex portions in the convex portions formed on said surface has a value in the range of Mathematical Formula (1), $P_0$ in said Mathematical Formula (1) satisfies Mathematical Formula (2) below when a triangular lattice structure is formed as said two-dimensional lattice structure, and satisfies Mathematical Formula (3) below when a rectangular lattice structure is formed as said two-dimensional lattice structure:

[Mathematical Formula 1]

$$0.8 P_0 \le P \le 1.2 P_0 \qquad (1)$$

[Mathematical Formula 2]

$$P_0 = \frac{4\pi}{\sqrt{3}\,k} \qquad (2)$$

[Mathematical Formula 3]

$$P_0 = \frac{2\pi}{k}. \qquad (3)$$

2. A top emission-type organic light emitting diode, in which
at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and
a two-dimensional lattice structure, in which a plurality of concave portions are arrayed periodically and two-dimensionally, is formed on a surface of said semi-transmissive metal layer which is in contact with said transparent conductive layer side, wherein
assuming that a real part of a propagation constant of surface plasmon on said surface, which is expressed by a complex number, is k, a center-to-center distance P between adjacent concave portions in the concave portions formed on said surface has a value in the range of Mathematical Formula (1), $P_0$ in said Mathematical Formula (1) satisfies Mathematical Formula (2) below when a triangular lattice structure is formed as said two-dimensional lattice structure, and satisfies Mathematical Formula (3) below when a rectangular lattice structure is formed as said two-dimensional lattice structure:

[Mathematical Formula 1]

$$0.8P_0 \leq P \leq 1.2P_0 \quad (1)$$

[Mathematical Formula 2]

$$P_0 = \frac{4\pi}{\sqrt{3}k} \quad (2)$$

[Mathematical Formula 3]

$$P_0 = \frac{2\pi}{k}. \quad (3)$$

3. A top emission-type organic light emitting diode, in which
at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and
a two-dimensional lattice structure, in which a plurality of convex portions are arrayed periodically and two-dimensionally, is formed on a surface of said semi-transmissive metal layer which is in contact with said organic electro-luminescence layer side, wherein
assuming that a real part of a propagation constant of surface plasmon on said surface, which is expressed by a complex number, is k, a center-to-center distance P between adjacent convex portions in the convex portions formed on said surface has a value in the range of Mathematical Formula (1), $P_0$ in said Mathematical Formula (1) satisfies Mathematical Formula (2) below when a triangular lattice structure is formed as said two-dimensional lattice structure, and satisfies Mathematical Formula (3) below when a rectangular lattice structure is formed as said two-dimensional lattice structure:

[Mathematical Formula 1]

$$0.8P_0 \leq P \leq 1.2P_0 \quad (1)$$

[Mathematical Formula 2]

$$P_0 = \frac{4\pi}{\sqrt{3}k} \quad (2)$$

[Mathematical Formula 3]

$$P_0 = \frac{2\pi}{k}. \quad (3)$$

4. A top emission-type organic light emitting diode, in which
at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and
a two-dimensional lattice structure, in which a plurality of concave portions are arrayed periodically and two-dimensionally, is formed on a surface of said semi-transmissive metal layer which is in contact with said organic electro-luminescence layer side, wherein
assuming that a real part of a propagation constant of surface plasmon on said surface, which is expressed by a complex number, is k, a center-to-center distance P between adjacent concave portions in the concave portions formed on said surface has a value in the range of Mathematical Formula (1), $P_0$ in said Mathematical Formula (1) satisfies Mathematical Formula (2) below when a triangular lattice structure is formed as said two-dimensional lattice structure, and satisfies Mathematical Formula (3) below when a rectangular lattice structure is formed as said two-dimensional lattice structure:

[Mathematical Formula 1]

$$0.8P_0 \leq P \leq 1.2P_0 \quad (1)$$

[Mathematical Formula 2]

$$P_0 = \frac{4\pi}{\sqrt{3}k} \quad (2)$$

[Mathematical Formula 3]

$$P_0 = \frac{2\pi}{k}. \quad (3)$$

5. The organic light emitting diode according to any one of claims 1, 2, 3 and 4, wherein
a metal material which forms said semi-transmissive metal layer is Ag or Al or alloy with the content of Ag at 70% by mass or higher, or alloy with the content of Al at 70% by mass or higher.

6. The organic light emitting diode according to any one of claims 1, 2, 3 and 4, wherein
a depth of said concave portion and a height of said convex portion is from 15 to 180 nm.

7. A bottom emission-type organic light emitting diode, in which
at least an anode conductive layer made of a transparent conductive material, an organic electro-luminescence layer including a light emitting layer containing an organic light emitting material, and a cathode conductive layer made of a metal material are sequentially stacked on a substrate, and
a fine uneven structure by a plurality of uneven portions is formed on a surface of said cathode conductive layer which is in contact with said organic electro-luminescence layer, wherein
when, out of wavelengths which give a half value of a peak $\lambda_{peak}$ of emission spectrum in light obtained by said organic light emitting material, a shorter wavelength is $\lambda_1$ and a longer wavelength is $\lambda_2$, and real parts of the propagation constant of surface plasmon corresponding to wavelengths $2\lambda_1 - \lambda_{peak}$ and $2\lambda_2 - \lambda_{peak}$ on an interface between a cathode conductive layer and an organic electro-luminescence layer are $k_1$ and $k_2$ respectively, power spectrum of the height distribution of said fine uneven structure on said interface has a finite value between a wave number $K_1$ and a wave number $K_2$, and an integrated value of the spectrum intensity within a range of the wave numbers has a value of intensity at 50% or higher of spectrum intensity over all wave numbers.

8. A top emission-type organic light emitting diode, in which at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and a fine uneven structure by a plurality of uneven portions is formed on a surface of said semi-transmissive metal layer which is in contact with said organic electro-luminescence layer, wherein when, out of wavelengths which give a half value of a peak $\lambda_{peak}$ of emission spectrum in light obtained by said organic light emitting material, a shorter wavelength is $\lambda_1$ and a longer wavelength is $\lambda_2$, and real parts of the propagation constant of surface plasmon corresponding to wavelengths $2\lambda_1 - \lambda_{peak}$ and $2\lambda_2 - \lambda_{peak}$ on an interface between a cathode conductive layer and an organic electro-luminescence layer are $k_1$ and $k_2$ respectively, power spectrum of the height distribution of said fine uneven structure on said interface has a finite value between a wave number $K_1$ and a wave number $K_2$, and an integrated value of the spectrum intensity within a range of the wave numbers has a value of intensity at 50% or higher of spectrum intensity over all wave numbers.

9. A top emission-type organic light emitting diode, in which at least a reflective layer made of a metal material, an anode conductive layer made of a transparent conductive material, an organic electro-luminescence layer including a light emitting layer containing an organic light emitting material, and a cathode conductive layer in which a semi-transmissive metal layer made of a metal material and a transparent conductive layer made of a transparent conductive material are sequentially stacked on a substrate, and a fine uneven structure by a plurality of uneven portions is formed on a surface of said semi-transmissive metal layer which is in contact with said transparent conductive layer, wherein when, out of wavelengths which give a half value of a peak $\lambda_{peak}$ of emission spectrum in light obtained by said organic light emitting material, a shorter wavelength is $\lambda_1$ and a longer wavelength is $\lambda_2$, and real parts of the propagation constant of surface plasmon corresponding to wavelengths $2\lambda_1 - \lambda_{peak}$ and $2\lambda_2 - \lambda_{peak}$ on an interface between a cathode conductive layer and an organic electro-luminescence layer are $k_1$ and $k_2$ respectively, power spectrum of the height distribution of said fine uneven structure on said interface has a finite value between a wave number $K_1$ and a wave number $K_2$, and an integrated value of the spectrum intensity within a range of the wave numbers has a value of intensity at 50% or higher of spectrum intensity over all wave numbers.

10. A top emission-type organic light emitting diode, in which at least a cathode conductive layer made of a metal material, an organic electro-luminescence layer including a light emitting layer containing an organic light emitting material, and an anode conductive layer made of a transparent conductive material are sequentially stacked on a substrate, and a fine uneven structure by a plurality of uneven portions is formed on a surface of said cathode conductive layer which is in contact with said organic electro-luminescence layer, wherein when, out of wavelengths which give a half value of a peak $\lambda_{peak}$ of emission spectrum in light obtained by said organic light emitting material, a shorter wavelength is $\lambda_1$ and a longer wavelength is $\lambda_2$, and real parts of the propagation constant of surface plasmon corresponding to wavelengths $2\lambda_1 - \lambda_{peak}$ and $2\lambda_2 - \lambda_{peak}$ on an interface between a cathode conductive layer and an organic electro-luminescence layer are $k_1$ and $k_2$ respectively, power spectrum of the height distribution of said fine uneven structure on said interface has a finite value between a wave number $K_1$ and a wave number $K_2$, and the integrated value of the spectrum intensity within a range of the wave numbers has a value of intensity at 50% or higher of spectrum intensity over all wave numbers.

11. The organic light emitting diode according to any one of claims 7, 8, 9 and 10, wherein a metal material which forms said metal layer is Ag, Al or alloy with the content of Ag at 10% by mass or higher, or alloy with the content of Al at 10% by mass or higher.

12. The organic light emitting diode according to any one of claims 7, 8, 9 and 10, wherein a depth of said concave portion and a height of said convex portion is from 15 to 180 nm.

13. An image display device comprising the organic light emitting diode according to any one of claims 1, 2, 3, 4, 7, 8, 9 and 10.

14. An illumination device comprising the organic light emitting diode according to any one of claims 1, 2, 3, 4, 7, 8, 9 and 10.

* * * * *